US006757649B1

(12) United States Patent
Gao et al.

(10) Patent No.: US 6,757,649 B1
(45) Date of Patent: Jun. 29, 2004

(54) CODEBOOK TABLES FOR MULTI-RATE ENCODING AND DECODING WITH PRE-GAIN AND DELAYED-GAIN QUANTIZATION TABLES

(75) Inventors: Yang Gao, Mission Viejo, CA (US); Adil Benyassine, Irvine, CA (US); Jes Thyssen, Laguna Niguel, CA (US); Eyal Shlomot, Long Beach, CA (US); Huan-yu Su, San Clemente, CA (US)

(73) Assignee: Mindspeed Technologies Inc., Newport Beach, CA (US)

( * ) Notice: Subject to any disclaimer, the term of this patent is extended or adjusted under 35 U.S.C. 154(b) by 0 days.

(21) Appl. No.: 10/409,404

(22) Filed: Apr. 8, 2003

Related U.S. Application Data

(60) Division of application No. 09/663,837, filed on Sep. 15, 2000, now Pat. No. 6,574,593, and a continuation-in-part of application No. 09/574,396, filed on May 19, 2000
(60) Provisional application No. 60/155,321, filed on Sep. 22, 1999.

(51) Int. Cl.[7] .......................... G10L 19/12; G10L 19/14
(52) U.S. Cl. ...................................... 704/222; 704/230
(58) Field of Search ............................... 704/219, 220, 704/262, 222

(56) References Cited

U.S. PATENT DOCUMENTS

| | | | | |
|---|---|---|---|---|
| 5,495,555 A | * | 2/1996 | Swaminathan | 704/219 |
| 5,664,055 A | * | 9/1997 | Kroon | 704/219 |
| 5,729,655 A | | 3/1998 | Kolesnik et al. | |
| 5,761,634 A | * | 6/1998 | Stewart et al. | 704/220 |
| 5,778,334 A | | 7/1998 | Ozawa et al. | |
| 5,778,338 A | | 7/1998 | Jacobs et al. | |
| 5,848,387 A | | 12/1998 | Nishiguchi et al. | |
| 5,911,128 A | | 6/1999 | DeJaco | |
| 5,933,803 A | | 8/1999 | Ojala | |
| 5,966,688 A | * | 10/1999 | Nandkumar et al. | 704/219 |
| 5,970,444 A | * | 10/1999 | Hayashi et al. | 704/219 |
| 6,188,979 B1 | * | 2/2001 | Ashley | 704/262 |
| 6,330,533 B2 | | 12/2001 | Su et al. | |
| 6,449,313 B1 | * | 9/2002 | Erzin et al. | 704/219 |

FOREIGN PATENT DOCUMENTS

CA     2239294     11/1999

OTHER PUBLICATIONS

Kataoka et al–1 ("ITU–T 8–kb/s Standard Speech Codec for Personal Communication Services", 4th IEEE Conference on Universal Personal Communications, Nov. 1995).*
Kataoka et al–2 ("LSP and Gain Quantization for the Proposed ITU–T 8–kb/s Speech Coding", 1995 IEEE Workshop on Speech Coding for Telecommunications, Sep. 1995).*

(List continued on next page.)

Primary Examiner—Richemond Dorvil
Assistant Examiner—Daniel Nolan
(74) Attorney, Agent, or Firm—Farjami & Farjami LLP

(57) ABSTRACT

A speech compression system capable of encoding a speech signal into a bitstream for subsequent decoding to generate synthesized speech is disclosed. The speech compression system optimizes the bandwidth consumed by the bitstream by balancing the desired average bit rate with the perceptual quality of the reconstructed speech. The speech compression system comprises a full-rate codec, a half-rate codec, a quarter-rate codec and an eighth-rate codec. The codecs are selectively activated based on a rate selection. In addition, the full and half-rate codecs are selectively activated based on a type classification. Each codec is selectively activated to encode and decode the speech signals at different bit rates emphasizing different aspects of the speech signal to enhance overall quality of the synthesized speech.

29 Claims, 11 Drawing Sheets

Microfiche Appendix Included
(7 Microfiche, 679 Pages)

OTHER PUBLICATIONS

Shapira et al ("A Variable Bit Rate Operation of LD–CELP Mainly for VBD Applications in DCME", IEEE Workshop on Speech Coding for Telecommunications, Sep. 1997, pp. 73–74).

Kim et al, ("A 4 Kbps Adaptive Fixed Code–Excited Linear Prediction Speech Coder", IEEE International Conference on Acoustics, Speech, and Signal Processing, Mar. 1999. Proceedings, Mar. 1999, pp. 2303–2306).

Qualcomm Inc., Lucent Technologies, and Motorola Inc., "Selectable Mode Vocoder Algorithm," presentation and paper given at the 3GPPP TSG C1.1 Conference in Seattle, Washington, Apr. 25–28, 2000, 3GPP2–C11–20000425–010 (paper) and 3GPP2–C11–20000425–011 (presentation), 3GPP2 & Organizational Partners, publishers Note: Two Documents.

M.R. Schroeder, B.S. Atal, "Code–Excited Linear Prediction (CELP): High–Quality Speech at Very Low Bit Rates," Proc. ICASSP–85, pp. 937–940, 1985.

TIA/EIA IS–127 Standard entitled "Enhanced Variable Rate Codec, Speech Service Option 3 for Wideband Spread Spectrum Digital Systems." Sections 1–3 and Section 4, pp. 4–1, then 4–14. © Telecommunications Industry Association, 1997.

Speech Coding and Synthesis, W.B. Kleijin, K.K. Paliwal, 1995 Elsevier Science B.V., ISBN 0 444 82169 4 Chapter 3, pp. 79–119 and Chapter 7, pp. 257–288.

Cellario, L. and Sereno D., "CELP Coding at Variable Rate," 100 European Transactions on Telecommunications and Related Technologies, vol. 5, pp. 69/603–79/613, Sep./Oct. 1994, Milano, Italy.

Ozawa, K., Serizawa, M., Miyano, T., Nomura, T., Ikekawa, M. and Taumi, S.I., "M–LCELP Speech Coding at 4 kb/s with Multi–Mode and Multi–Codebook," 2334b IEICE Transactions on Communications, vol. E77–B, No. 9, Sep., 1994, Tokyo, Japan.

* cited by examiner

| | BITS PER 20 ms | |
|---|---|---|
| 202 — LSFs | INTERPOLATION — 206 | 2 BITS |
| | 1ST STAGE | 7 BITS |
| | 2ND STAGE | 6 BITS |
| | 208 — 3RD STAGE | 6 BITS |
| | 4TH STAGE | 6 BITS |
| | | 27 BITS |
| 204 — ENERGY | 6 BITS/SUBFRAME | 12 BITS |
| TOTAL | | 39 BITS |

FIG. 6

| | BITS PER 20 ms | |
|---|---|---|
| 240 — LSFs | 1ST STAGE | 4 BITS |
| | 244 — 2ND STAGE | 4 BITS |
| | 3RD STAGE | 3 BITS |
| | | 11 BITS |
| 242 — ENERGY | 5 BITS/FRAME | 5 BITS |
| TOTAL | | 16 BITS |

FIG. 7

CODEBOOK TABLES FOR MULTI-RATE ENCODING AND DECODING WITH PRE-GAIN AND DELAYED-GAIN QUANTIZATION TABLES

1. RIGHT OF PRIORITY

This application claims the benefit under 35 U.S.C. §119(e) of Provisional U.S. patent application Serial No. 60/155,321 filed on Sep. 22, 1999.

This application is a Divisional of U.S. patent application Ser. No. 09/663,837 now U.S. Pat. No. 6,574,593 filed on Sep. 15, 2000, which is a Continuation-In-Part of U.S. patent application Ser. No. 09/574,396 filed on May 19, 2000.

2. COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights.

3. MICROFICHE REFERENCE

A microfiche appendix is included of a computer program listing. The total number of microfiche is 7. The total number of frames is 679.

4. CROSS REFERENCE TO RELATED APPLICATIONS

The following co-pending and commonly assigned U.S. patent applications have been filed on the same day as this application. All of these applications relate to and further describe other aspects of the embodiments disclosed in this application and are incorporated by reference in their entirety.

U.S. patent application Ser. No. 09/663,242, "SELECTABLE MODE VOCODER SYSTEM," Sep. 15, 2000.

U.S. patent application Ser. No. 09/755,441, "INJECTING HIGH FREQUENCY NOISE INTO PULSE EXCITATION FOR LOW BIT RATE CELP," filed on Sep. 15, 2000.

U.S. patent application Ser. No. 09/771,293, "SHORT TERM ENHANCEMENT IN CELP SPEECH CODING," filed on Sep. 15, 2000.

U.S. patent application Ser. No. 09/761,029, "SYSTEM OF DYNAMIC PULSE POSITION TRACKS FOR PULSE-LIKE EXCITATION IN SPEECH CODING," filed on Sep. 15, 2000.

U.S. patent application Ser. No. 09/782,791, "SPEECH CODING SYSTEM WITH TIME-DOMAIN NOISE ATTENUATION," filed on Sep. 15, 2000.

U.S. patent application Ser. No. 09/761,033, "SYSTEM FOR AN ADAPTIVE EXCITATION PATTERN FOR SPEECH CODING," filed on Sep. 15, 2000.

U.S. patent application Ser. No. 09/782,383, "SYSTEM FOR ENCODING SPEECH INFORMATION USING AN ADAPTIVE CODEBOOK WITH DIFFERENT RESOLUTION LEVELS," filed on Sep. 15, 2000.

U.S. patent application Ser. No. 09/662,828, "BITSTREAM PROTOCOL FOR TRANSMISSION OF ENCODED VOICE SIGNALS," filed on Sep. 15, 2000.

U.S. patent application Ser. No. 09/781,735, "SYSTEM FOR FILTERING SPECTRAL CONTENT OF A SIGNAL FOR SPEECH ENCODING," filed on Sep. 15, 2000.

U.S. patent application Ser. No. 09/663,734, "SYSTEM OF ENCODING AND DECODING SPEECH SIGNALS," filed on Sep. 15, 2000.

U.S. patent application Ser. No. 09/663,002, "SYSTEM FOR SPEECH ENCODING HAVING AN ADAPTIVE FRAME ARRANGEMENT," filed on Sep. 15, 2000.

U.S. patent application Ser. No. 09/940,904, "SYSTEM FOR IMPROVED USE OF PITCH ENHANCEMENT WITH SUB CODEBOOKS," filed on Sep. 15, 2000.

BACKGROUND OF THE INVENTION

1. Technical Field

This invention relates to speech communication systems and, more particularly, to systems for digital speech coding.

2. Related Art

One prevalent mode of human communication is by the use of communication systems. Communication systems include both wireline and wireless radio based systems. Wireless communication systems are electrically connected with the wireline based systems and communicate with the mobile communication devices using radio frequency (RF) communication. Currently, the radio frequencies available for communication in cellular systems, for example, are in the cellular frequency range centered around 900 MHz and in the personal communication services (PCS) frequency range centered around 1900 MHz. Data and voice transmissions within the wireless system have a bandwidth that consumes a portion of the radio frequency. Due to increased traffic caused by the expanding popularity of wireless communication devices, such as cellular telephones, it is desirable to reduced bandwidth of transmissions within the wireless systems.

Digital transmission in wireless radio communications is increasingly applied to both voice and data due to noise immunity, reliability, compactness of equipment and the ability to implement sophisticated signal processing functions using digital techniques. Digital transmission of speech signals involves the steps of: sampling an analog speech waveform with an analog-to-digital converter, speech compression (encoding), transmission, speech decompression (decoding), digital-to-analog conversion, and playback into an earpiece or a loudspeaker. The sampling of the analog speech waveform with the analog-to-digital converter creates a digital signal. However, the number of bits used in the digital signal to represent the analog speech waveform creates a relatively large bandwidth. For example, a speech signal that is sampled at a rate of 8000 Hz (once every 0.125 ms), where each sample is represented is by 16 bits, will result in a bit rate of 128,000 (16×8000) bits per second, or 128 Kbps (Kilobits per second).

Speech compression may be used to reduce the number of bits that represent the speech signal thereby reducing the bandwidth needed for transmission. However, speech compression may result in degradation of the quality of decompressed speech. In general, a higher bit rate will result in higher quality, while a lower bit rate will result in lower quality. However, modern speech compression techniques, such as coding techniques, can produce decompressed speech of relatively high quality at relatively low bit rates. In general, modern coding techniques attempt to represent the perceptually important features of the speech signal, without preserving the actual speech waveform.

One coding technique used to lower the bit rate involves varying the degree of speech compression (i.e. varying the bit rate) depending on the part of the speech signal being compressed. Typically, parts of the speech signal for which adequate perceptual representation is more difficult (such as voiced speech, plosives, or voiced onsets) are coded and transmitted using a higher number of bits. Conversely, parts of the speech for which adequate perceptual representation is less difficult (such as unvoiced, or the silence between words) are coded with a lower number of bits. The resulting average bit rate for the speech signal will be relatively lower than would be the case for a fixed bit rate that provides decompressed speech of similar quality.

Speech compression systems, commonly called codecs, include an encoder and a decoder and may be used to reduce the bit rate of digital speech signals. Numerous algorithms have been developed for speech codecs that reduce the number of bits required to digitally encode the original speech while attempting to maintain high quality reconstructed speech. Code-Excited Linear Predictive (CELP) coding techniques, as discussed in the article entitled "Code-Excited Linear Prediction: High-Quality Speech at Very Low Rates," by M. R. Schroeder and B. S. Atal, Proc. ICASSP-85, pages 937–940, 1985, provide one effective speech coding algorithm. An example of a variable rate CELP based speech coder is TIA (Telecommunications Industry Association) IS-127 standard that is designed for CDMA (Code Division Multiple Access) applications. The CELP coding technique utilizes several prediction techniques to remove the redundancy from the speech signal. The CELP coding approach is frame-based in the sense that it stores sampled input speech signals into a block of samples called frames. The frames of data may then be processed to create a compressed speech signal in digital form.

The CELP coding approach uses two types of predictors, a short-term predictor and a long-term predictor. The short-term predictor typically is applied before the long-term predictor. A prediction error derived from the short-term predictor is commonly called short-term residual, and a prediction error derived from the long-term predictor is commonly called long-term residual. The long-term residual may be coded using a fixed codebook that includes a plurality of fixed codebook entries or vectors. One of the entries may be selected and multiplied by a fixed codebook gain to represent the long-term residual. The short-term predictor also can be referred to as an LPC (Linear Prediction Coding) or a spectral representation, and typically comprises 10 prediction parameters. The long-term predictor also can be referred to as a pitch predictor or an adaptive codebook and typically comprises a lag parameter and a long-term predictor gain parameter. Each lag parameter also can be called a pitch lag, and each long-term predictor gain parameter can also be called an adaptive codebook gain. The lag parameter defines an entry or a vector in the adaptive codebook.

The CELP encoder performs an LPC analysis to determine the short-term predictor parameters. Following the LPC analysis, the long-term predictor parameters may be determined. In addition, determination of the fixed codebook entry and the fixed codebook gain that best represent the long-term residual occurs. The powerful concept of analysis-by-synthesis (ABS) is employed in CELP coding. In the ABS approach, the best contribution from the fixed codebook, the best fixed codebook gain, and the best long-term predictor parameters may be found by synthesizing them using an inverse prediction filter and applying a perceptual weighting measure. The short-term (LPC) prediction coefficients, the fixed-codebook gain, as well as the lag parameter and the long-term gain parameter may then be quantized. The quantization indices, as well as the fixed codebook indices, may be sent from the encoder to the decoder.

The CELP decoder uses the fixed codebook indices to extract a vector from the fixed codebook. The vector may be multiplied by the fixed-codebook gain, to create a long-term excitation also known as a fixed codebook contribution. A long-term predictor contribution may be added to the long-term excitation to create a short-term excitation that commonly is referred to simply as an excitation. The long-term predictor contribution comprises the short-term excitation from the past multiplied by the long-term predictor gain. The addition of the long-term predictor contribution alternatively can be viewed as an adaptive codebook contribution or as a long-term (pitch) filtering. The short-term excitation may be passed through a short-term inverse prediction filter (LPC) that uses the short-term (LPC) prediction coefficients quantized by the encoder to generate synthesized speech. The synthesized speech may then be passed through a post-filter that reduces perceptual coding noise.

These speech compression techniques have resulted in lowering the amount of bandwidth used to transmit a speech signal. However, further reduction in bandwidth is particular important in a communication system that has to allocate its resources to a large number of users. Accordingly, there is a need for systems and methods of speech coding that are capable of minimizing the average bit rate needed for speech representation, while providing high quality decompressed speech.

SUMMARY

This invention provides systems for encoding and decoding speech signals. The embodiments may use the CELP coding technique and prediction based coding as a framework to employ signal-processing functions using waveform matching and perceptual related techniques. These techniques allow the generation of synthesized speech that closely resembles the original speech by including perceptual features while maintaining a relatively low bit rate. One application of the embodiments is in wireless communication systems. In this application, the encoding of original speech, or the decoding to generate synthesized speech, may occur at mobile communication devices. In addition, encoding and decoding may occur within wireline-based systems or within other wireless communication systems to provide interfaces to wireline-based systems.

One embodiment of a speech compression system includes a full-rate codec, a half-rate codec, a quarter-rate codec and an eighth-rate codec each capable of encoding and decoding speech signals. The full-rate, half-rate, quarter-rate and eighth-rate codecs encode the speech signals at bit rates of 8.5 Kbps, 4 Kbps, 2 Kbps and 0.8 Kbps, respectively. The speech compression system performs a rate selection on a frame of a speech signal to select one of the codecs. The rate selection is performed on a frame-by-frame basis. Frames are created by dividing the speech signal into segments of a finite length of time. Since each frame may be coded with a different bit rate, the speech compression system is a variable-rate speech compression system that codes the speech at an average bit rate.

The rate selection is determined by characterization of each frame of the speech signal based on the portion of the speech signal contained in the particular frame. For example, frames may be characterized as stationary voiced, non-stationary voiced, unvoiced, background noise, silence etc. In addition, the rate selection is based on a Mode that the speech compression system is operating within. The different Modes indicate the desired average bit rate. The codecs are designed for optimized coding within the different characterizations of the speech signals. Optimal coding balances the desire to provide synthesized speech of the highest perceptual quality while maintaining the desired average bit rate, thereby maximizing use of the available bandwidth. During operation, the speech compression system selectively activates the codecs based on the Mode as well as characterization of the frame in an attempt to optimize the perceptual quality of the synthesized speech.

Once the full or the half-rate codec is selected by the rate selection, a type classification of the speech signal occurs to further optimize coding. The type classification may be a first type (i.e. a Type One) for frames containing a harmonic structure and a formant structure that do not change rapidly or a second type (i.e. a Type Zero) for all other frames. The bit allocation of the full-rate and half-rate codecs may be adjusted in response to the type classification to further optimize the coding of the frame. The adjustment of the bit allocation provides improved perceptual quality of the reconstructed speech signal by emphasizing different aspects of the speech signal within each frame.

Accordingly, the speech coder is capable of selectively activating the codecs to maximize the overall quality of a reconstructed speech signal while maintaining the desired average bit rate. Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principals of the invention. Moreover, in the figures, like reference numerals designate corresponding parts throughout the different views.

FIG. 6 is a table illustrating the bit allocation of one embodiment of the quarter-rate codec.

FIG. 7 is a table illustrating the bit allocation of one embodiment of the eighth-rate codec.

DETAILED DESCRIPTION OF THE PREFERRED EMBODIMENTS

The embodiments are discussed with reference to speech signals, however, processing of any other signal is possible. It will also be understood that the numerical values disclosed may be numerically represented by floating point, fixed point, decimal, or other similar numerical representation that may cause slight variation in the values but will not compromise functionality. Further, functional blocks identified as modules are not intended to represent discrete structures and may be combined or further sub-divided in various embodiments.

Figure 1:
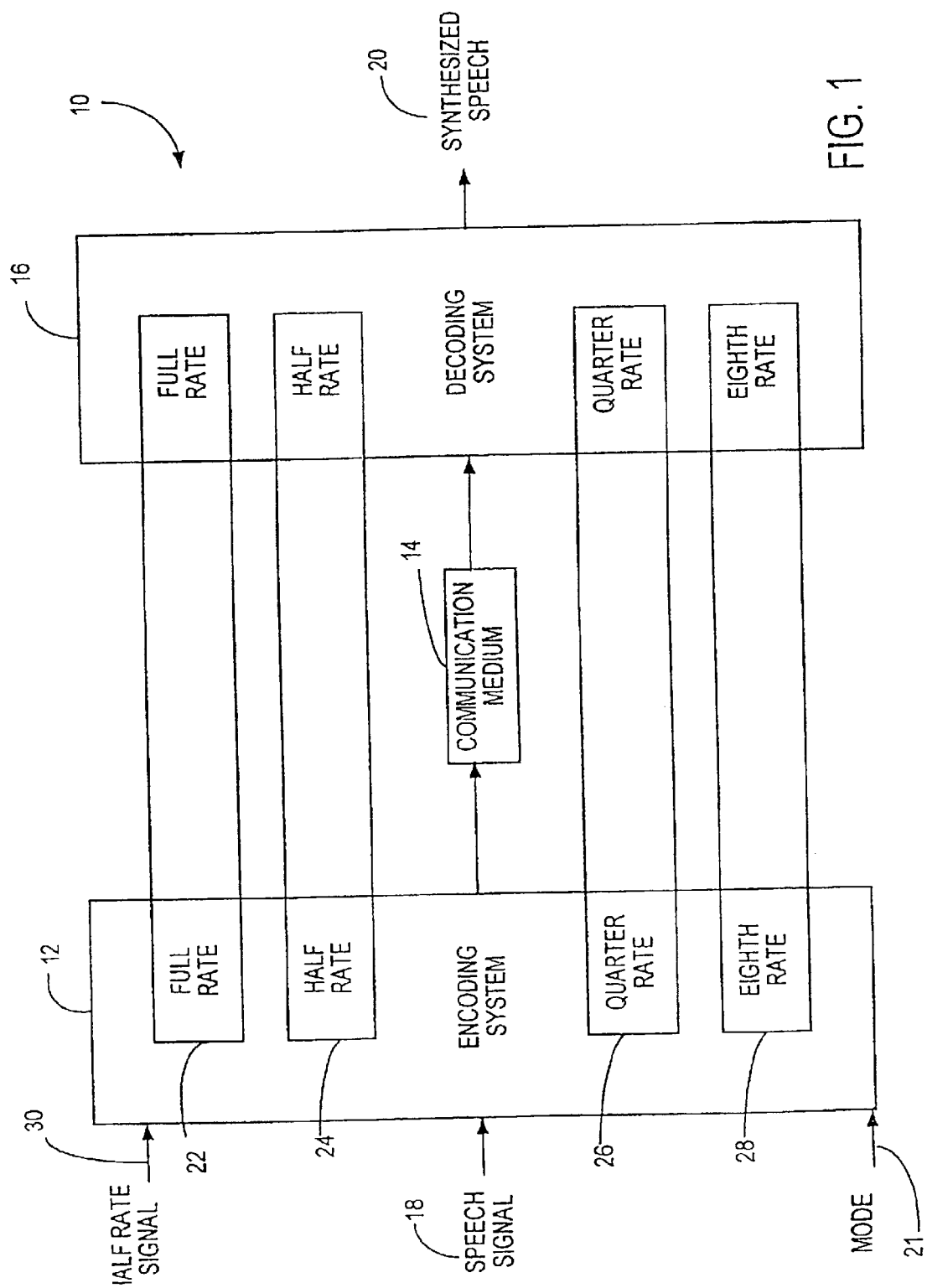
FIG. 1 is a block diagram of one embodiment of a speech compression system.

FIG. 1 is a block diagram of one embodiment of the speech compression system 10. The speech compression system 10 includes an encoding system 12, a communication medium 14 and a decoding system 16 that may be connected as illustrated. The speech compression system 10 may be any system capable of receiving and encoding a speech signal 18, and then decoding it to create post-processed synthesized speech 20. In a typical communication system, the wireless communication system is electrically connected with a public switched telephone network (PSTN) within the wireline-based communication system. Within the wireless communication system, a plurality of base stations are typically used to provide radio communication with mobile communication devices such as a cellular telephone or a portable radio transceiver.

The speech compression system 10 operates to receive the speech signal 18. The speech signal 18 emitted by a sender (not shown) can be, for example, captured by a microphone (not shown) and digitized by an analog-to-digital converter (not shown). The sender may be a human voice, a musical instrument or any other device capable of emitting analog signals. The speech signal 18 can represent any type of sound, such as, voice speech, unvoiced speech, background noise, silence, music etc.

The encoding system 12 operates to encode the speech signal 18. The encoding system 12 may be part of a mobile communication device, a base station or any other wireless or wireline communication device that is capable of receiving and encoding speech signals 18 digitized by an analog-to-digital converter. The wireline communication devices may include Voice over Internet Protocol (VoIP) devices and systems. The encoding system 12 segments the speech signal 18 into frames to generate a bitstream. One embodiment of the speech compression system 10 uses frames that comprise 160 samples that, at a sampling rate of 8000 Hz, correspond to 20 milliseconds per frame. The frames represented by the bitstream may be provided to the communication medium 14.

The communication medium 14 may be any transmission mechanism, such as a communication channel, radio waves, microwave, wire transmissions, fiber optic transmissions, or any medium capable of carrying the bitstream generated by the encoding system 12. The communication medium 14 may also include transmitting devices and receiving devices used in the transmission of the bitstream. An example embodiment of the communication medium 14 can include communication channels, antennas and associated transceivers for radio communication in a wireless communication system. The communication medium 14 also can be a storage mechanism, such as, a memory device, a storage media or other device capable of storing and retrieving the bitstream generated by the encoding system 12. The communication medium 14 operates to transmit the bitstream generated by the encoding system 12 to the decoding system 16.

The decoding system 16 receives the bitstream from the communication medium 14. The decoding system 14 may be part of a mobile communication device, a base station or other wireless or wireline communication device that is capable of receiving the bitstream. The decoding system 16 operates to decode the bitstream and generate the post-processed synthesized speech 20 in the form of a digital signal. The post-processed synthesized speech 20 may then be converted to an analog signal by a digital-to-analog converter (not shown). The analog output of the digital-to-analog converter may be received by a receiver (not shown) that may be a human ear, a magnetic tape recorder, or any other device capable of receiving an analog signal. Alternatively, a digital recording device, a speech recognition device, or any other device capable of receiving a digital signal may receive the post-processed synthesized speech 20.

One embodiment of the speech compression system 10 also includes a Mode line 21. The Mode line 21 carries a Mode signal that controls the speech compression system 10 by indicating the desired average bit rate for the bitstream. The Mode signal may be generated externally by, for example, a wireless communication system using a Mode signal generation module. The Mode signal generation module determines the Mode Signal based on a plurality of factors, such as, the desired quality of the post-processed synthesized speech 20, the available bandwidth, the services contracted by a user or any other relevant factor. The Mode signal is controlled and selected by the communication system that the speech compression system 10 is operating within. The Mode signal may be provided to the encoding system 12 to aid in the determination of which of a plurality of codecs may be activated within the encoding system 12.

The codecs comprise an encoder portion and a decoder portion that are located within the encoding system 12 and the decoding system 16, respectively. In one embodiment of the speech compression system 10 there are four codecs namely; a full-rate codec 22, a half-rate codec 24, a quarter-rate codec 26, and an eighth-rate codec 28. Each of the codecs 22, 24, 26, and 28 is operable to generate the bitstream. The size of the bitstream generated by each codec 22, 24, 26, and 28, and hence the bandwidth or capacity needed for transmission of the bitstream via the communication medium 14 is different.

In one embodiment, the full-rate codec 22, the half-rate codec 24, the quarter-rate codec 26 and the eighth-rate codec 28 generate 170 bits, 80 bits, 40 bits and 16 bits, respectively, per frame. The size of the bitstream of each frame corresponds to a bit rate, namely, 8.5 Kbps for the full-rate codec 22, 4.0 Kbps for the half-rate codec 24, 2.0 Kbps for the quarter-rate codec 26, and 0.8 Kbps for the eighth-rate codec 28. However, fewer or more codecs as well as other bit rates are possible in alternative embodiments. By processing the frames of the speech signal 18 with the various codecs, an average bit rate is achieved. The encoding system 12 determines which of the codecs 22, 24, 26, and 28 may be used to encode a particular frame based on characterization of the frame, and on the desired average bit rate provided by the Mode signal. Characterization of a frame is based on the portion of the speech signal 18 contained in the particular frame. For example, frames may be characterized as stationary voiced, non-stationary voiced, unvoiced, onset, background noise, silence etc.

The Mode signal on the Mode signal line 21 in one embodiment identifies a Mode 0, a Mode 1, and a Mode 2. Each of the three Modes provides a different desired average bit rate that can vary the percentage of usage of each of the codecs 22, 24, 26, and 28. Mode 0 may be referred to as a premium mode in which most of the frames may be coded with the full-rate codec 22; fewer of the frames may be coded with the half-rate codec 24; and frames comprising silence and background noise may be coded with the quarter-rate codec 26 and the eighth-rate codec 28. Mode 1 may be referred to as a standard mode in which frames with high information content, such as onset and some voiced frames, may be coded with the full-rate codec 22. In addition, other voiced and unvoiced frames may be coded with the half-rate codec 24, some unvoiced frames may be coded with the quarter-rate codec 26, and silence and stationary background noise frames may be coded with the eighth-rate codec 28.

Mode 2 may be referred to as an economy mode in which only a few frames of high information content may be coded with the full-rate codec 22. Most of the frames in Mode 2 may be coded with the half-rate codec 24 with the exception of some unvoiced frames that may be coded with the quarter-rate codec 26. Silence and stationary background noise frames may be coded with the eighth-rate codec 28 in Mode 2. Accordingly, by varying the selection of the codecs 22, 24, 26, and 28 the speech compression system 10 can deliver reconstructed speech at the desired average bit rate while attempting to maintain the highest possible quality. Additional Modes, such as, a Mode three operating in a super economy Mode or a half-rate max Mode in which the maximum codec activated is the half-rate codec 24 are possible in alternative embodiments.

Further control of the speech compression system 10 also may be provided by a half rate signal line 30. The half rate signal line 30 provides a half rate signaling flag. The half rate signaling flag may be provided by an external source such as a wireless communication system. When activated, the half rate signaling flag directs the speech compression system 10 to use the half-rate codec 24 as the maximum rate. Determination of when to activate the half rate signaling flag is performed by the communication system that the speech compression system 10 is operating within. Similar to the Mode signal determination, a half rate-signaling module controls activation of the half rate signaling flag based on a plurality of factors that are determined by the communication system. In alternative embodiments, the half rate signaling flag could direct the speech compression system 10 to use one codec 22, 24, 26, and 28 in place of another or identify one or more of the codecs 22, 24, 26, and 28 as the maximum or minimum rate.

In one embodiment of the speech compression system 10, the full and half-rate codecs 22 and 24 may be based on an eX-CELP (extended CELP) approach and the quarter and eighth-rate codecs 26 and 28 may be based on a perceptual matching approach. The eX-CELP approach extends the traditional balance between perceptual matching and waveform matching of traditional CELP. In particular, the eX-CELP approach categorizes the frames using a rate selection and a type classification that will be described later. Within the different categories of frames, different encoding approaches may be utilized that have different perceptual matching, different waveform matching, and different bit assignments. The perceptual matching approach of the quarter-rate codec 26 and the eighth-rate codec 28 do not use waveform matching and instead concentrate on the perceptual aspects when encoding frames.

The coding of each frame with either the eX-CELP approach or the perceptual matching approach may be based on further dividing the frame into a plurality of subframes. The subframes may be different in size and in number for each codec 22, 24, 26, and 28. In addition, with respect to the eX-CELP approach, the subframes may be different for each category. Within the subframes, speech parameters and waveforms may be coded with several predictive and non-predictive scalar and vector quantization techniques. In scalar quantization a speech parameter or element may be represented by an index location of the closest entry in a representative table of scalars. In vector quantization several speech parameters may be grouped to form a vector. The vector may be represented by an index location of the closest entry in a representative table of vectors.

In predictive coding, an element may be predicted from the past. The element may be a scalar or a vector. The prediction error may then be quantized, using a table of scalars (scalar quantization) or a table of vectors (vector quantization). The eX-CELP coding approach, similarly to traditional CELP, uses the powerful Analysis-by-Synthesis (ABS) scheme for choosing the best representation for several parameters. In particular, the parameters may be the adaptive codebook, the fixed codebook, and their corresponding gains. The ABS scheme uses inverse prediction filters and perceptual weighting measures for selecting the best codebook entries.

One implementation of an embodiment of the speech compression system 10 may be in a signal-processing device such as a Digital Signal Processing (DSP) chip, a mobile communication device or a radio transmission base station. The signal-processing device may be programmed with source code. The source code may be first translated into fixed point, and then translated into the programming language that is specific to the signal-processing device. The translated source code may then be downloaded and run in the signal-processing device. One example of source code is the C language computer program utilized by one embodiment of the speech compression system 10 that is included in the attached microfiche appendix as Appendix A and B.

Figure 2:
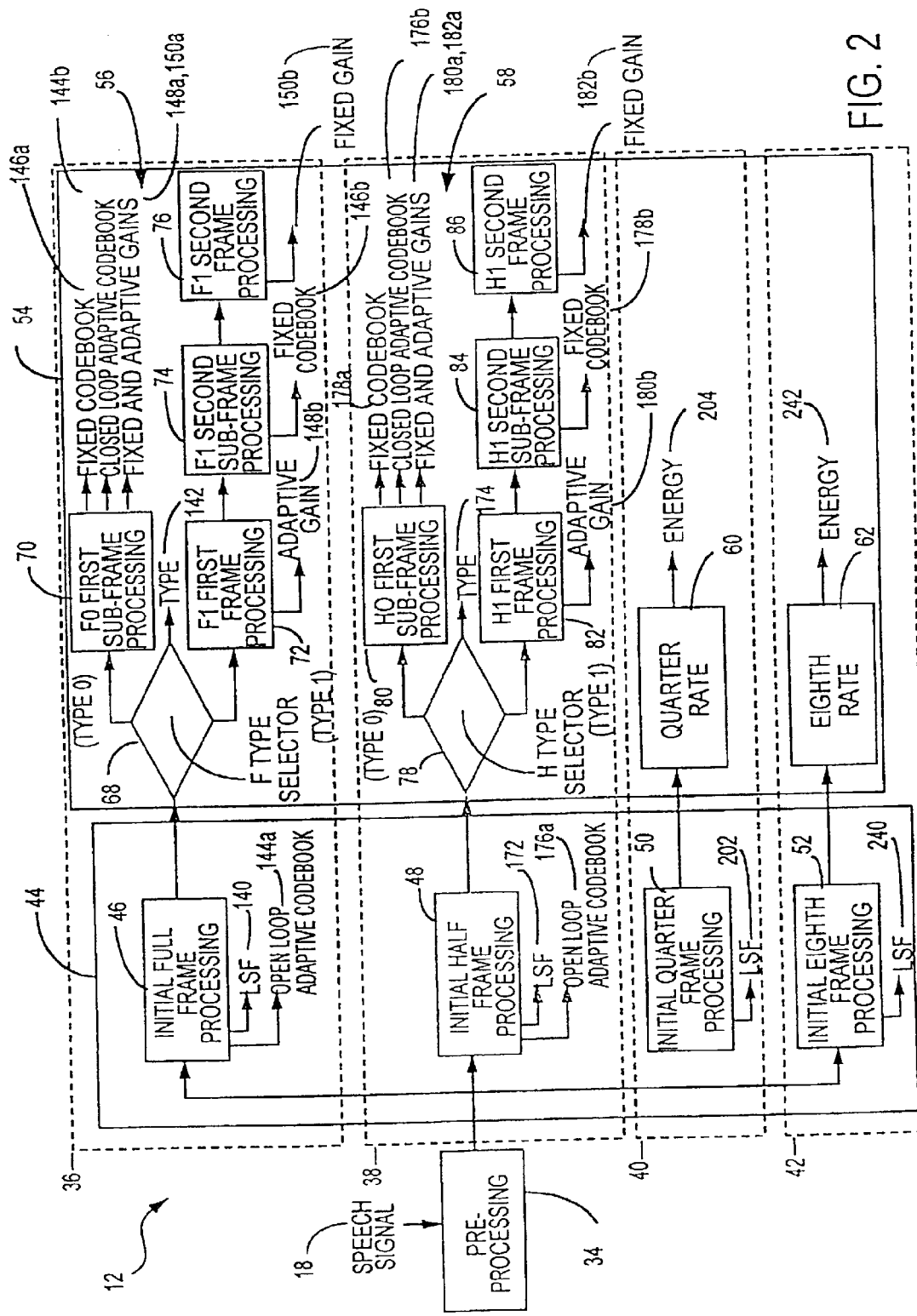
FIG. 2 is an expanded block diagram of one embodiment of the encoding system illustrated in FIG. 1.

FIG. 2 is a more detailed block diagram of the encoding system 12 illustrated in FIG. 1. One embodiment of the encoding system 12 includes a pre-processing module 34, a full-rate encoder 36, a half-rate encoder 38, a quarter-rate encoder 40 and an eighth-rate encoder 42 that may be connected as illustrated. The rate encoders 36, 38, 40, and 42 include an initial frame-processing module 44 and an excitation-processing module 54.

The speech signal 18 received by the encoding system 12 is processed on a frame level by the pre-processing module 34. The pre-processing module 34 is operable to provide initial processing of the speech signal 18. The initial processing can include filtering, signal enhancement, noise removal, amplification and other similar techniques capable of optimizing the speech signal 18 for subsequent encoding.

The full, half, quarter and eighth-rate encoders 36, 38, 40, and 42 are the encoding portion of the full, half, quarter and eighth-rate codecs 22, 24, 26, and 28, respectively. The initial frame-processing module 44 performs initial frame processing, speech parameter extraction and determines which of the rate encoders 36, 38, 40, and 42 will encode a particular frame. The initial frame-processing module 44 may be illustratively sub-divided into a plurality of initial frame processing modules, namely, an initial full frame processing module 46, an initial half frame-processing module 48, an initial quarter frame-processing module 50 and an initial eighth frame-processing module 52. However, it should be noted that the initial frame-processing module 44 performs processing that is common to all the rate encoders 36, 38, 40, and 42 and particular processing that is particular to each rate encoder 36, 38, 40, and 42. The sub-division of the initial frame-processing module 44 into the respective initial frame processing modules 46, 48, 50, and 52 corresponds to a respective rate encoder 36, 38, 40, and 42.

The initial frame-processing module 44 performs common processing to determine a rate selection that activates one of the rate encoders 36, 38, 40, and 42. In one embodiment, the rate selection is based on the characterization of the frame of the speech signal 18 and the Mode the speech compression system 10 is operating within. Activation of one of the rate encoders 36, 38, 40, and 42 correspondingly activates one of the initial frame-processing modules 46, 48, 50, and 52.

The particular initial frame-processing module 46, 48, 50, and 52 is activated to encode aspects of the speech signal 18 that are common to the entire frame. The encoding by the initial frame-processing module 44 quantizes parameters of the speech signal 18 contained in a frame. The quantized parameters result in generation of a portion of the bitstream. In general, the bitstream is the compressed representation of a frame of the speech signal 18 that has been processed by the encoding system 12 through one of the rate encoders 36, 38, 40, and 42.

In addition to the rate selection, the initial frame-processing module 44 also performs processing to determine a type classification for each frame that is processed by the full and half-rate encoders 36 and 38. The type classification of one embodiment classifies the speech signal 18 represented by a frame as a first type (i.e., a Type One) or as a second type (i.e., a Type Zero). The type classification of one embodiment is dependent on the nature and characteristics of the speech signal 18. In an alternate embodiment, additional type classifications and supporting processing may-be provided.

Type One classification includes frames of the speech signal 18 that exhibit stationary behavior. Frames exhibiting stationary behavior include a harmonic structure and a formant structure that do not change rapidly. All other frames may be classified with the Type Zero classification. In alternative embodiments, additional type classifications may classify frames into additional classification based on time-domain, frequency domain, etc. The type classification optimizes encoding by the initial full-rate frame-processing module 46 and the initial half-rate frame-processing module 48, as will be later described. In addition, both the type classification and the rate selection may be used to optimize encoding by portions of the excitation-processing module 54 that correspond to the full and half-rate encoders 36 and 38.

One embodiment of the excitation-processing module 54 may be sub-divided into a full-rate module 56, a half-rate module 58, a quarter-rate module 60, and an eighth-rate module 62. The rate modules 56, 58, 60, and 62 correspond to the rate encoders 36, 38, 40, and 42 as illustrated in FIG. 2. The full and half-rate modules 56 and 58 of one embodiment both include a plurality of frame processing modules and a plurality of subframe processing modules that provide substantially different encoding as will be discussed.

The portion of the excitation processing module 54 for both the full and half-rate encoders 36 and 38 include type selector modules, first subframe processing modules, second subframe processing modules, first frame processing modules and second subframe processing modules. More specifically, the full-rate module 56 includes an F type selector module 68, an F0 first subframe processing module 70, an F1 first frame-processing module 72, an F1 second subframe processing module 74 and an F1 second frame-processing module 76. The term "F" indicates full-rate, and "0" and "1" signify Type Zero and Type One, respectively. Similarly, the half-rate module 58 includes an H type selector module 78, an H1 first subframe processing module 80, an H1 first frame-processing module 82, an H1 second subframe processing module 84, and an H1 second frame-processing module 86.

The F and H type selector modules 68,78 direct the processing of the speech signals 18 to further optimize the encoding process based on the type classification. Classification as Type One indicates the frame contains a harmonic structure and a formant structure that do not change rapidly, such as stationary voiced speech. Accordingly, the bits used to represent a frame classified as Type One may be allocated to facilitate encoding that takes advantage of these aspects in representing the frame. Classification as Type Zero indicates the frame may exhibit non-stationary behavior, for example, a harmonic structure and a formant structure that changes rapidly or the frame may exhibit stationary unvoiced or noise-like characteristics. The bit allocation for frames classified as Type Zero may be consequently adjusted to better represent and account for this behavior.

For the full rate module 56, the F0 first subframe-processing module 70 generates a portion of the bitstream when the frame being processed is classified as Type Zero. Type Zero classification of a frame activates the F0 first subframe-processing module 70 to process the frame on a subframe basis. The F1 first frame-processing module 72, the F1 second subframe processing module 74, and the F1 second frame-processing modules 76 combine to generate a portion of the bitstream when the frame being processed is classified as Type One. Type One classification involves both subframe and frame processing within the full rate module 56.

Similarly, for the half rate module 58, the H0 first subframe-processing module 80 generates a portion of the bitstream on a sub-frame basis when the frame being processed is classified as Type Zero. Further, the H1 first frame-processing module 82, the H1 second subframe processing module 84, and the H1 second frame-processing module 86 combine to generate a portion of the bitstream when the frame being processed is classified as Type One. As in the full rate module 56, the Type One classification involves both subframe and frame processing.

The quarter and eighth-rate modules 60 and 62 are part of the quarter and eighth-rate encoders 40 and 42, respectively, and do not include the type classification. The type classification is not included due to the nature of the frames that are processed. The quarter and eighth-rate modules 60 and 62 generate a portion of the bitstream on a subframe basis and a frame basis, respectively, when activated.

The rate modules 56, 58, 60, and 62 generate a portion of the bitstream that is assembled with a respective portion of the bitstream that is generated by the initial frame processing modules 46, 48, 50, and 52 to create a digital representation of a frame. For example, the portion of the bitstream generated by the initial full-rate frame-processing module 46 and the full-rate module 56 may be assembled to form the bitstream generated when the full-rate encoder 36 is activated to encode a frame. The bitstreams from each of the encoders 36, 38, 40, and 42 may be further assembled to form a bitstream representing a plurality of frames of the speech signal 18. The bitstream generated by the encoders 36, 38, 40, and 42 is decoded by the decoding system 16.

Figure 3:
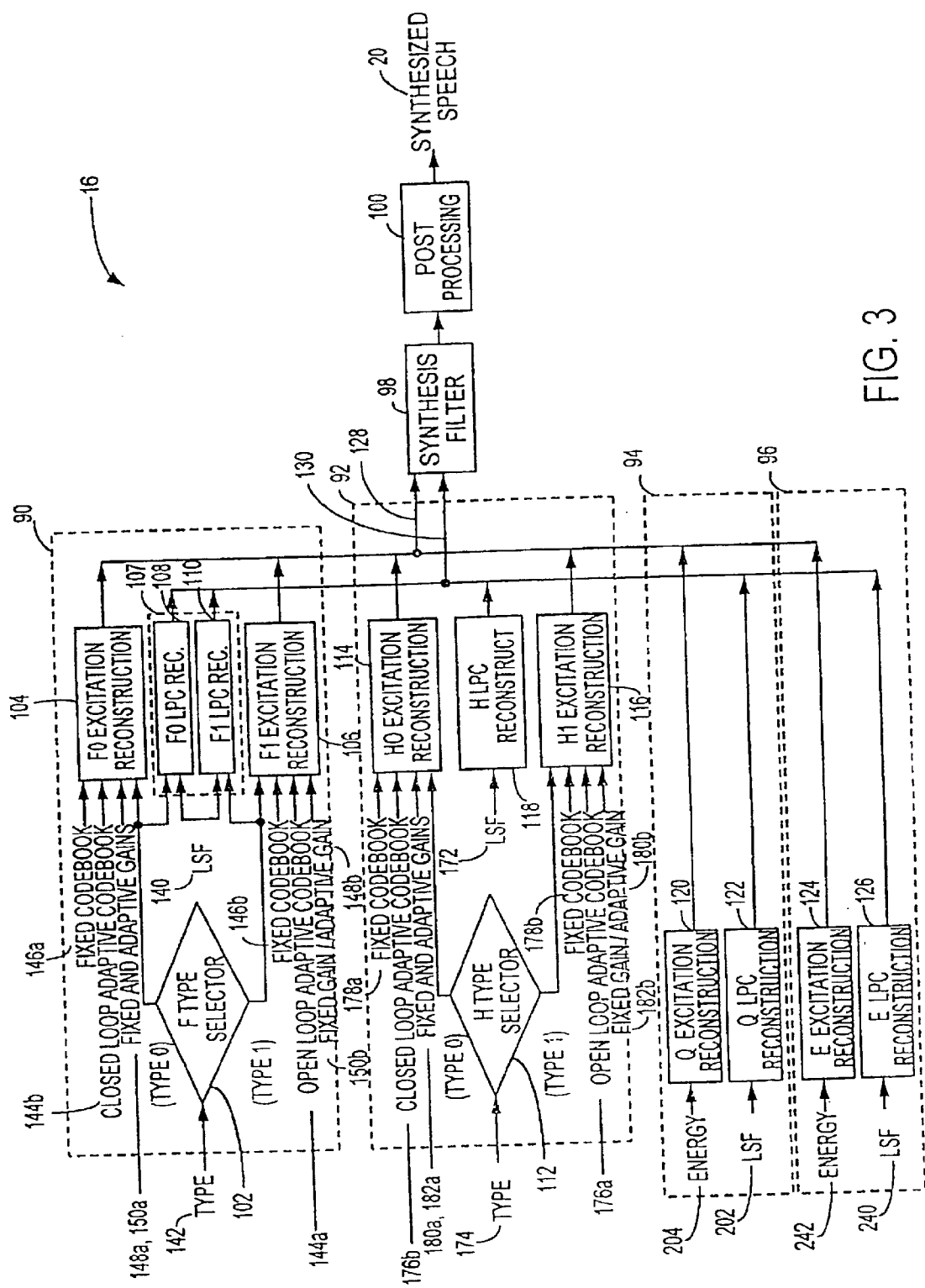
FIG. 3 is an expanded block diagram of one embodiment of the decoding system illustrated in FIG. 1.

FIG. 3 is an expanded block diagram of the decoding system 16 illustrated in FIG. 1. One embodiment of the decoding system 16 includes a full-rate decoder 90, a half-rate decoder 92, a quarter-rate decoder 94, an eighth-rate decoder 96, a synthesis filter module 98 and a post-processing module 100. The full, half, quarter and eighth-rate decoders 90, 92, 94, and 96, the synthesis filter module 98 and the post-processing module 100 are the decoding portion of the full, half, quarter and eighth-rate codecs 22, 24, 26, and 28.

The decoders 90, 92, 94, and 96 receive the bitstream and decode the digital signal to reconstruct different parameters of the speech signal 18. The decoders 90, 92, 94, and 96 may be activated to decode each frame based on the rate selection. The rate selection may be provided from the encoding system 12 to the decoding system 16 by a separate information transmittal mechanism, such as a control channel in a wireless communication system. In this example embodiment, the rate selection may be provided to the mobile communication devices as part of broadcast beacon signals generated by the base stations within the wireless communications system. In general, the broadcast beacon signals are generated to provide identifying information used to establish communications between the base stations and the mobile communication devices.

The synthesis filter 98 and the post-processing module 100 are part of the decoding process for each of the decoders 90, 92, 94, and 96. Assembling the parameters of the speech signal 18 that are decoded by the decoders 90, 92, 94, and 96 using the synthesis filter 98, generates synthesized speech. The synthesized speech is passed through the post-processing module 100 to create the post-processed synthesized speech 20.

One embodiment of the full-rate decoder 90 includes an F type selector 102 and a plurality of excitation reconstruction modules. The excitation reconstruction modules comprise an F0 excitation reconstruction module 104 and an F1 excitation reconstruction module 106. In addition, the full-rate decoder 90 includes a linear prediction coefficient (LPC) reconstruction module 107. The LPC reconstruction module 107 comprises an F0 LPC reconstruction module 108 and an F1 LPC reconstruction module 110.

Similarly, one embodiment of the half-rate decoder 92 includes an H type-selector 112 and a plurality of excitation reconstruction modules. The excitation reconstruction modules comprise an H0 excitation reconstruction module 114 and an H1 excitation reconstruction module 116. In addition, the half-rate decoder 92 comprises a linear prediction coefficient (LPC) reconstruction module that is an H LPC reconstruction module 118. Although similar in concept, the full and half-rate decoders 90 and 92 are designated to decode bitstreams from the corresponding full and half-rate encoders 36 and 38, respectively.

The F and H type selectors 102 and 112 selectively activate respective portions of the full and half-rate decoders 90 and 92 depending on the type classification. When the type classification is Type Zero, the F0 or H0 excitation reconstruction modules 104 or 114 are activated. Conversely, when the type classification is Type One, the F1 or H1 excitation reconstruction modules 106 or 116 are activated. The F0 or F1 LPC reconstruction modules 108 or 110 are activated by the Type Zero and Type One type classifications, respectively. The H LPC reconstruction module 118 is activated based solely on the rate selection.

The quarter-rate decoder 94 includes a Q excitation reconstruction module 120 and a Q LPC reconstruction module 122. Similarly, the eighth-rate decoder 96 includes an E excitation reconstruction module 124 and an E LPC reconstruction module 126. Both the respective Q or E excitation reconstruction modules 120 or 124 and the respective Q or E LPC reconstruction modules 122 or 126 are activated based solely on the rate selection.

Each of the excitation reconstruction modules is operable to provide the short-term excitation on a short-term excitation line 128 when activated. Similarly, each of the LPC reconstruction modules operate to generate the short-term prediction coefficients on a short-term prediction coefficients line 130. The short-term excitation and the short-term prediction coefficients are provided to the synthesis filter 98. In addition, in one embodiment, the short-term prediction coefficients are provided to the post-processing module 100 as illustrated in FIG. 3.

The post-processing module 100 can include filtering, signal enhancement, noise modification, amplification, tilt correction and other similar techniques capable of improving the perceptual quality of the synthesized speech. The post-processing module 100 is operable to decrease the audible noise without degrading the synthesized speech. Decreasing the audible noise may be accomplished by emphasizing the formant structure of the synthesized speech or by suppressing only the noise in the frequency regions that are perceptually not relevant for the synthesized speech. Since audible noise becomes more noticeable at lower bit rates, one embodiment of the post-processing module 100 may be activated to provide post-processing of the synthesized speech differently depending on the rate selection. Another embodiment of the post-processing module 100 may be operable to provide different post-processing to different groups of the decoders 90, 92, 94, and 96 based on the rate selection.

During operation, the initial frame-processing module 44 illustrated in FIG. 2 analyzes the speech signal 18 to determine the rate selection and activate one of the codecs 22, 24, 26, and 28. If for example, the full-rate codec 22 is activated to process a frame based on the rate selection, the initial full-rate frame-processing module 46 determines the type classification for the frame and generates a portion of the bitstream. The full-rate module 56, based on the type classification, generates the remainder of the bitstream for the frame.

The bitstream may be received and decoded by the full-rate decoder 90 based on the rate selection. The full-rate decoder 90 decodes the bitstream utilizing the type classification that was determined during encoding. The synthesis filter 98 and the post-processing module 100 use the parameters decoded from the bitstream to generate the post-processed synthesized speech 20. The bitstream that is generated by each of the codecs 22, 24, 26, and 28 contains significantly different bit allocations to emphasize different parameters and/or characteristics of the speech signal 18 within a frame.

1.0 Bit Allocation

FIGS. 4, 5, 6 and 7 are tables illustrating one embodiment of the bit-allocation for the full-rate codec 22, the half-rate codec 24, the quarter-rate codec 26, and the eighth-rate codec 28, respectively. The bit-allocation designates the portion of the bitstream generated by the initial frame-processing module 44, and the portion of the bitstream generated by the excitation-processing module 54 within a respective encoder 36, 38, 40, and 42. In addition the bit-allocation designates the number of bits in the bitstream that represent a frame. Accordingly, the bit rate varies depending on the codec 22, 24, 26, and 28 that is activated. The bitstream may be classified into a first portion and a second portion depending on whether the representative bits are generated on a frame basis or on a subframe basis, respectively, by the encoding system 12. As will be described later, the first portion and the second portion of the bitstream vary depending on the codec 22, 24, 26, and 28 selected to encode and decode a frame of the speech signal 18.

1.1 Bit Allocation for the Full-rate Codec

Figure 4:
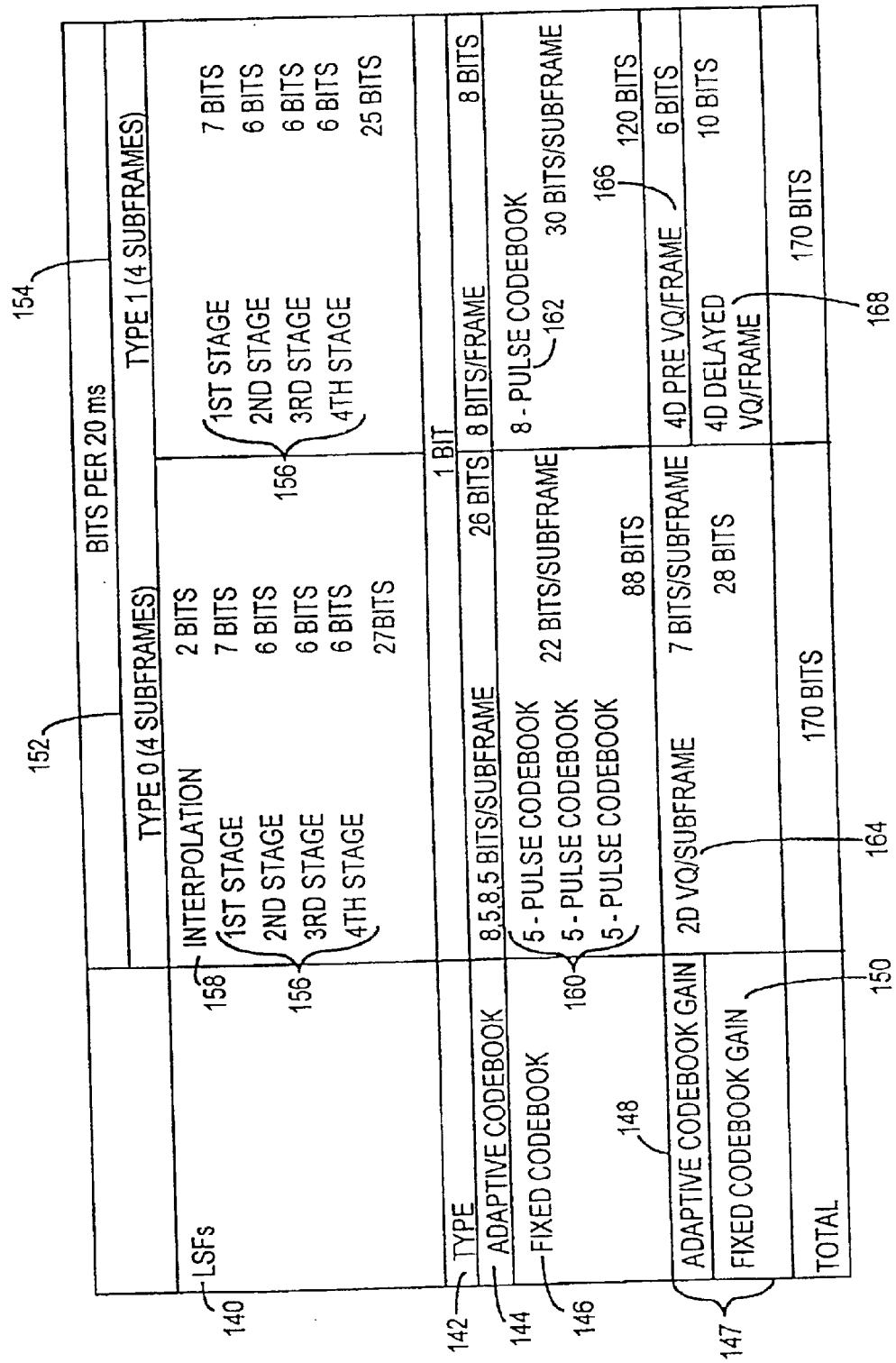
FIG. 4 is a table illustrating the bit allocation of one embodiment of the full-rate codec.

Referring now to FIGS. 2, 3, and 4, the full-rate bitstream of the full-rate codec 22 will be described. Referring now to FIG. 4, the bit allocation for the full-rate codec 22 includes a line spectrum frequency (LSF) component 140, a type component 142, an adaptive codebook component 144, a fixed codebook component 146 and a gain component 147. The gain component 147 comprises an adaptive codebook gain component 148 and a fixed codebook gain component 150. The bitstream allocation is further defined by a Type Zero column 152 and a Type One column 154. The Type Zero and Type One columns 152 and 154 designate the allocation of the bits in the bitstream based on the type classification of the speech signal 18 as previously discussed. In one embodiment, the Type Zero column 152 and the Type One column 154 both use 4 subframes of 5 milliseconds each to process the speech signals 18.

The initial full frame-processing module 46, illustrated in FIG. 2, generates the LSF component 140. The LSF component 140 is generated based on the short-term predictor parameters. The short-term predictor parameters are converted to a plurality of line spectrum frequencies (LSFs). The LSFs represent the spectral envelope of a frame. In addition, a plurality of predicted LSFs from the LSFs of previous frames are determined. The predicted LSFs are subtracted from the LSFs to create an LSFs prediction error. In one embodiment, the LSFs prediction error comprises a vector of 10 parameters. The LSF prediction error is combined with the predicted LSFs to generate a plurality of quantized LSFs. The quantized LSFs are interpolated and converted to form a plurality of quantized LPC coefficients Aq(z) for each subframe as will be discussed in detail later. In addition, the LSFs prediction error is quantized to generate the LSF component 140 that is transmitted to the decoding system 16.

When the bitstream is received at the decoding system 16, the LSF component 140 is used to locate a quantized vector representing a quantized LSFs prediction error. The quantized LSFs prediction error is added to the predicted LSFs to generate quantized LSFs. The predicted LSFs are determined from the LSFs of previous frames within the decoding system 16 similarly to the encoding system 12. The resulting quantized LSFs may be interpolated for each subframe using a predetermined weighting. The predetermined weighting defines an interpolation path that may be fixed or variable. The interpolation path is between the quantized LSFs of the previous frame and the quantized LSFs of the current frame. The interpolation path may be used to provide a spectral envelope representation for each subframe in the current frame.

For frames classified as Type Zero, one embodiment of the LSF component 140 is encoded utilizing a plurality of stages 156 and an interpolation element 158 as illustrated in FIG. 4. The stages 156 represent the LSFs prediction error used to code the LSF component 140 for a frame. The interpolation element 158 may be used to provide a plurality of interpolation paths between the quantized LSFs of the previous frame and the quantized LSFs of the frame currently being processed. In general, the interpolation element 158 represents selectable adjustment in the contour of the line spectrum frequencies (LSFs) during decoding. Selectable adjustment may be used due to the non-stationary spectral nature of frames that are classified as Type Zero. For frames classified as Type One, the LSF component 140 may be encoded using only the stages 156 and a predetermined linear interpolation path due to the stationary spectral nature of such frames.

One embodiment of the LSF component 140 includes 2 bits to encode the interpolation element 158 for frames classified as Type Zero. The bits identify the particular interpolation path. Each of the interpolation paths adjust the weighting of the previous quantized LSFs for each subframe and the weighting of the current quantized LSFs for each subframe. Selection of an interpolation path may be determined based on the degree of variations in the spectral envelope between subsequent subframes. For example, if there is substantial variation in the spectral envelope in the middle of the frame, the interpolation element 158 selects an interpolation path that decreases the influence of the quantized LSFs from the previous frame. One embodiment of the interpolation element 158 can represent any one of four different interpolation paths for each subframe.

The predicted LSFs may be generated using a plurality of moving average predictor coefficients. The predictor coefficients determine how much of the LSFs of past frames are used to predict the LSFs of the current frame. The predictor coefficients within the full-rate codec 22 use an LSF predictor coefficients table. The table may be generally illustrated by the following matrix:

TABLE 1

$$\begin{bmatrix} El_1, & El_2, & \ldots & El_n \\ \vdots & \vdots & \ldots & \vdots \\ Em_1, & Em_2 & \cdots & Em_n \end{bmatrix}$$

In one embodiment, m equals 2 and n equals 10. Accordingly, the prediction order is two and there are two vectors of predictor coefficients, each comprising 10 elements. One embodiment of the LSF predictor coefficients table is titled "Float64 B__85k" and is included in Appendix B of the attached microfiche appendix.

Once the predicted LSFs have been determined, the LSFs prediction error may be calculated using the actual LSFs. The LSFs prediction error may be quantized using a full dimensional multi-stage quantizer. An LSF prediction error quantization table containing a plurality of quantization vectors represents each stage 156 that may be used with the multi-stage quantizer. The multistage quantizer determines a portion of the LSF component 140 for each stage 156. The determination of the portion of the LSF component 140 is based on a pruned search approach. The pruned search approach determines promising quantization vector candidates from each stage. At the conclusion of the determination of candidates for all the stages, a decision occurs simultaneously that selects the best quantization vectors for each stage.

In the first stage, the multistage quantizer determines a plurality of candidate first stage quantization errors. The candidate first stage quantization errors are the difference between the LSFs prediction error and the closest matching quantization vectors located in the first stage. The multistage quantizer then determines a plurality of candidate second stage quantization errors by identifying the quantization vectors located in the second stage that best match the candidate first stage quantization errors. This iterative process is completed for each of the stages and promising candidates are kept from each stage. The final selection of the best representative quantization vectors for each stage simultaneously occurs when the candidates have been determined for all the stages. The LSF component 140 includes index locations of the closest matching quantization vectors from each stage. One embodiment of the LSF component 140 includes 25 bits to encode the index locations within the stages 156. The LSF prediction error quantization table for the quantization approach may be illustrated generally by the following matrix:

TABLE 2

$$\begin{bmatrix} \begin{bmatrix} Vl_1, & Vl_2, & \ldots & Vl_n \\ \vdots & \vdots & \ldots & \vdots \\ Vr_1, & Vr_2 & \cdots & Vr_n \end{bmatrix}_1 \\ \begin{bmatrix} Vl_1, & Vl_2, & \ldots & Vl_n \\ \vdots & \vdots & \ldots & \vdots \\ Vs_1, & Vs_2 & \cdots & Vs_n \end{bmatrix}_j \end{bmatrix}$$

One embodiment of the quantization table for both the Type Zero and the Type One classification uses four stages (j=4) in which each quantization vector is represented by 10 elements (n=10). The stages 156 of this embodiment include 128 quantization vectors (r=128) for one of the stages 156, and 64 quantization vectors (s=64) in the remaining stages 156. Accordingly, the index location of the quantization vectors within the stages 156 may be encoded using 7 bits for the one of the stages 156 that includes 128 quantization vectors. In addition, index locations for each of the stages 156 that include 64 quantization vectors may be encoded using 6 bits. One embodiment of the LSF prediction error quantization table used for both the Type Zero and Type One classification is titled "Float64 CBes__85k" and is included in Appendix B of the attached microfiche appendix.

Within the decoding system 16, the F0 or F1 LPC reconstruction modules 108, 110 in the full-rate decoder 90 obtain the LSF component 140 from the bitstream as illustrated in FIG. 3. The LSF component 140 may be used to reconstruct the quantized LSFs as previously discussed. The quantized LSFs may be interpolated and converted to form the linear prediction coding coefficients for each subframe of the current frame.

For Type Zero classification, reconstruction may be performed by the F0 LPC reconstruction module 108. Reconstruction involves determining the predicted LSFs, decoding the quantized LSFs prediction error and reconstructing the quantized LSFs. In addition, the quantized LSFs may be interpolated using the identified interpolation path. As previously discussed, one of the four interpolation paths is identified to the F0 LPC reconstruction module 108 by the interpolation element 158 that forms a part of the LSF component 140. Reconstruction of the Type One classification involves the use of the predetermined linear interpolation path and the LSF prediction error quantization table by the F1 LPC reconstruction module 110. The LSF component 140 forms part of the first portion of the bitstream since it is encoded on a frame basis in both the Type Zero and the Type One classifications.

The type component 142 also forms part of the first portion of the bitstream. As illustrated in FIG. 2, the F type selector module 68 generates the type component 142 to represent the type classification of a particular frame. Referring now to FIG. 3, the F type selector module 102 in the full-rate decoder 90 receives the type component 142 from the bitstream.

One embodiment of the adaptive codebook component 144 may be an open loop adaptive codebook component 144a or a closed loop adaptive codebook component 144b. The open or closed loop adaptive codebook component 144a, 144b is generated by the initial full frame-processing module 46 or the F0 first subframe-processing module 70, respectively, as illustrated in FIG. 2. The open loop adaptive codebook component 144a may be replaced by the closed loop adaptive codebook component 144b in the bitstream when the frame is classified as Type Zero. In general, the open loop designation refers to processing on a frame basis that does not involve analysis-by-synthesis (ABS). The closed loop processing is performed on a subframe basis and includes analysis-by-synthesis (ABS).

Encoding the pitch lag, which is based on the periodicity of the speech signal 18, generates the adaptive codebook component 144. The open loop adaptive codebook component 144a is generated for a frame; whereas the closed loop adaptive codebook component 144b is generated on a subframe basis. Accordingly, the open loop adaptive codebook component 144a is part of the first portion of the bitstream and the closed loop adaptive codebook component 144b is part of the second portion of the bitstream. In one embodiment, as illustrated in FIG. 4, the open loop adaptive codebook component 144a comprises 8 bits and the closed loop adaptive codebook component 144b comprises 26 bits. The open loop adaptive codebook component 144a and the closed loop adaptive codebook component 144b may be generated using an adaptive codebook vector that will be described later. Referring now to FIG. 3, the decoding system 16 receives the open or closed loop adaptive codebook component 144a or 144b. The open or closed loop adaptive codebook component 144a or 144b is decoded by the F0 or F1 excitation reconstruction module 104 or 106, respectively.

One embodiment of the fixed codebook component 146 may be a Type Zero fixed codebook component 146a or a Type One fixed codebook component 146b. The Type Zero fixed codebook component 146a is generated by the F0 first subframe-processing module 70 as illustrated in FIG. 2. The F1 subframe-processing module 72 generates the Type One fixed codebook component 146b. The Type Zero or Type One fixed codebook component 146a or 146b is generated using a fixed codebook vector and synthesis-by-analysis on a subframe basis that will be described later. The fixed codebook component 146 represents the long-term residual of a subframe using an n-pulse codebook, where n is the number of pulses in the codebook.

Referring now to FIG. 4, the Type Zero fixed codebook component 146a of one embodiment comprises 22 bits per subframe. The Type Zero fixed codebook component 146a includes identification of one of a plurality of n-pulse codebooks, pulse locations in the codebook, and the signs of representative pulses (quantity "n") that correspond to the pulse locations. In an example embodiment, up to two bits designate which one of three n-pulse codebooks has been encoded. Specifically, the first of the two bits is set to "1" to designate the first of the three n-pulse codebooks is used. If the first bit is set to "0," the second of the two bits designates whether the second or the third of the three n-pulse codebooks are used. Accordingly, in the example embodiment, the first of the three n-pulse codebooks has 21 bits to represent the pulse locations and signs, and the second and third of the three n-pulse codebooks have 20 bits available.

Each of the representative pulses within one of the n-pulse codebooks includes a corresponding track. The track is a list of sample locations in a subframe where each sample location in the list is one of the pulse locations. A subframe being encoded may be divided into a plurality of sample locations where each of the sample locations contains a sample value. The tracks of the corresponding representative pulses list only a portion of the sample locations from a subframe. Each of the representative pulses within one of the n-pulse codebooks may be represented by one of the pulse locations in the corresponding track.

During operation, each of the representative pulses is sequentially placed in each of the pulse locations in the corresponding track. The representative pulses are converted to a signal that may be compared to the sample values in the sample locations of the subframe using ABS. The representative pulses are compared to the sample values in those sample locations that are later in time than the sample location of the pulse location. The pulse location that minimizes the difference between the representative pulse and the sample values that are later in time forms a portion of the Type Zero fixed codebook component 146a. Each of the representative pulses in a selected n-pulse codebook may be represented by a corresponding pulse location that forms a portion of the Type Zero fixed codebook component 146a. The tracks are contained in track tables that can generally be represented by the following matrix:

TABLE 3

$$\begin{bmatrix} P1_1, & P1_2, & \dots & P1_f \\ P2_1, & P2_2, & \dots & P2_g \\ P3_1, & P3_2, & \dots & P3_h \\ P4_1, & P4_2, & \dots & P4_i \\ \vdots & \vdots & \dots & \vdots \\ Pn_1, & Pn_2, & \dots & Pn_j \end{bmatrix}$$

In one embodiment, the track tables are the tables entitled "static short track_5_4_0," "static short track_5_3_2," and "static short track_5_3_1" within the library titled "tracks.tab" that is included in Appendix B of the attached microfiche appendix.

In the example embodiment illustrated in FIG. 4, the n-pulse codebooks are three 5-pulse codebooks 160 where the first of the three 5-pulse codebooks 160 includes 5 representative pulses therefore n=5. A first representative pulse has a track that includes 16 (f=16) of the 40 sample locations in the subframe. The first representative pulse from the first of the three 5-pulse codebooks 160 are compared with the sample values in the sample locations. One of the sample locations present in the track associated with the first representative pulse is identified as the pulse location using 4 bits. The sample location that is identified in the track is the sample location in the subframe that minimizes the difference between the first representative pulse and the sample values that are later in time as previously discussed. Identification of the pulse location in the track forms a portion of the Type Zero fixed codebook component 146a.

In this example embodiment, the second and fourth representative pulses have corresponding tracks with 16 sample locations (g and i=16) and the third and fifth representative pulses have corresponding tracks with 8 sample locations (h and j=8). Accordingly, the pulse locations for the second and fourth representative pulses are identified using 4 bits and the pulse locations of the third and fifth representative pulses are identified using 3 bits. As a result, the Type Zero fixed codebook component 146a for the first of the three 5-pulse codebooks 160 includes 18 bits for identifying the pulse locations.

The signs of the representative pulses in the identified pulse locations may also be identified in the Type Zero fixed codebook component 146a. In the example embodiment, one bit represents the sign for the first representative pulse, one bit represents a combined sign for both the second and fourth representative pulses and one bit represents the combined sign for the third and the fifth representative pulses. The combined sign uses the redundancy of the information in the pulse locations to transmit two distinct signs with a single bit. Accordingly, the Type Zero fixed codebook component 146a for the first of the three 5-pulse codebooks 160 includes three bits for the sign designation for a total of 21 bits.

In an example embodiment, the second and third of the three 5-pulse codebooks 160 also include 5 representative pulses (n=5) and the tracks in the track table each comprise 8 sample locations (f,g,h,i,j=8). Accordingly, the pulse locations for each of the representative pulses in the second and third of the three 5-pulse codebook 160 are identified using 3 bits. In addition, in this example embodiment, the signs for each of the pulse locations are identified using 1 bit.

For frames classified as Type One, in an example embodiment, the n-pulse codebook is an 8-pulse codebook 162 (n=8). The 8-pulse codebook 162 is encoded using 30 bits per subframe to create one embodiment of the Type One fixed codebook component 146b. The 30 bits includes 26 bits identifying pulse locations using tracks as in the Type Zero classification, and 4 bits identifying the signs. One embodiment of the track table is the table entitled "static INT16 track_8_4_0" within the library titled "tracks.tab" that is included in Appendix B of the attached microfiche appendix.

In the example embodiment, the tracks associated with the first and fifth representative pulses comprise 16 sample locations that are encoded using 4 bits. The tracks associated with the remaining representative pulses comprise 8 sample locations that are encoded using 3 bits. The first and fifth representative pulses, the second and sixth representative pulses, the third and seventh representative pulses, and the fourth and eighth representative pulses use the combined signs for both respective representative pulses. As illustrated in FIG. 3, when the bitstream is received by the decoding system 16, the F0 or the F1 excitation reconstruction modules 104 or 106 decode the pulse locations of the tracks. The pulse locations of the tracks are decoded by the F0 or the F1 excitation reconstruction modules 104 or 106 for one of the three 5-pulse codebooks 160 or the 8-pulse codebook 162, respectively. The fixed codebook component 146 is part of the second portion of the bitstream since it is generated on a subframe basis.

Referring again to FIG. 4, the gain component 147, in general, represents the adaptive and fixed codebook gains. For Type Zero classification, the gain component 147 is a Type Zero adaptive and fixed codebook gain component 148a, 150a representing both the adaptive and the fixed codebook gains. The Type Zero adaptive and fixed codebook gain component 148a, 150a is part of the second portion of the bitstream since it is encoded on a subframe basis. As illustrated in FIG. 2, the Type Zero adaptive and fixed codebook gain component 148a, 150a is generated by the F0 first subframe-processing module 70.

For each subframe of a frame classified as Type Zero, the adaptive and fixed codebook gains are jointly coded by a two-dimensional vector quantizer (2D VQ) 164 to generate the Type Zero adaptive and fixed codebook gain component 148a, 150a. In one embodiment, quantization involves translating the fixed codebook gain into a fixed codebook energy in units of decibels (dB). In addition, a predicted fixed codebook energy may be generated from the quantized fixed codebook energy values of previous frames. The predicted fixed codebook energy may be derived using a plurality of fixed codebook predictor coefficients.

Similar to the LSFs predictor coefficients, the fixed codebook predictor coefficients determine how much of the fixed codebook energy of past frames may be used to predict the fixed codebook energy of the current frame. The predicted fixed codebook energy is subtracted from the fixed codebook energy to generate a prediction fixed codebook energy error. By adjusting the weighting of the previous frames and the current frames for each subframe, the predicted fixed codebook energy may be calculated to minimize the prediction fixed codebook error.

The prediction fixed codebook energy error is grouped with the adaptive codebook gain to form a two-dimensional vector. Following quantization of the prediction fixed codebook energy error and the adaptive codebook gain, as later described, the two-dimensional vector may be referred to as a quantized gain vector ($\hat{g}_{ac}$). The two-dimensional vector is compared to a plurality of predetermined vectors in a 2D gain quantization table. An index location is identified that is the location in the 2D gain quantization table of the predetermined vector that best represents the two-dimensional vector. The index location is the adaptive and fixed codebook gain component 148a, 150a for the subframe. The adaptive and fixed codebook gain component 148a, 150a for the frame represents the indices identified for each of the subframes.

The predetermined vectors comprise 2 elements, one representing the adaptive codebook gain, and one representing the prediction fixed codebook energy error. The 2D gain quantization table may be generally represented by:

TABLE 4

$$\begin{bmatrix} V1_1, & V1_2 \\ \vdots & \vdots \\ Vn_1, & Vn_2 \end{bmatrix}$$

The two-dimensional vector quantizer (2D VQ) 164, of one embodiment, utilizes 7 bits per subframe to identify the index location of one of 128 quantization vectors (n=128). One embodiment of the 2D gain quantization table is entitled "Float64 gainVQ_2_128_8_5" and is included in Appendix B of the attached microfiche appendix.

For frames classified as Type One, a Type One adaptive codebook gain component 148b is generated by the F1 first frame-processing module 72 as illustrated in FIG. 2. Similarly, the F1 second frame-processing module 76 generates a Type One fixed codebook gain component 150b. The Type One adaptive codebook gain component 148b and the Type One fixed codebook gain component 150b are generated on a frame basis to form part of the first portion of the bitstream.

Referring again to FIG. 4, the Type One adaptive codebook gain component 148b is generated using a multi-dimensional vector quantizer that is a four-dimensional pre vector quantizer (4D pre VQ) 166 in one embodiment. The term "pre" is used to highlight that, in one embodiment, the adaptive codebook gains for all the subframes in a frame are quantized prior to the search in the fixed codebook for any of the subframes. In an alternative embodiment, the multi-dimensional quantizer is an n dimensional vector quantizer that quantizes vectors for n subframes where n may be any number of subframes.

The vector quantized by the four-dimensional pre vector quantizer (4D pre VQ) 166 is an adaptive codebook gain vector with elements that represent each of the adaptive codebook gains from each of the subframes. Following quantization, as will be later discussed, the adaptive codebook gain vector can also be referred to as a quantized pitch gain ($\hat{g}^k_a$). Quantization of the adaptive codebook gain vector to generate the adaptive codebook gain component 148b is performed by searching in a pre-gain quantization table. The pre-gain quantization table includes a plurality of predetermined vectors that may be searched to identify the predetermined vector that best represents the adaptive codebook gain vector. The index location of the identified predetermined vector within the pre-gain quantization table is the Type One adaptive codebook component 148b. The adaptive codebook gain component 148b of one embodiment comprises 6 bits.

In one embodiment, the predetermined vectors comprise 4 elements, 1 element for each subframe. Accordingly, the pre-gain quantization table may be generally represented as:

TABLE 5

$$\begin{bmatrix} V1_1, & V1_2, & \ldots & V1_4 \\ V2_1, & V2_2, & \ldots & V2_4 \\ \vdots & \vdots & \ldots & \vdots \\ Vn_1, & Vn_2, & \cdots & Vn_4 \end{bmatrix}$$

One embodiment of the pre-gain quantization table includes 64 predetermined vectors (n=64). An embodiment of the pre-gain quantization table is entitled "Float64 gp4_tab" and is included in Appendix B of the attached microfiche appendix.

The Type One fixed codebook gain component 150b may be similarly encoded using a multi-dimensional vector quantizer for n subframes. In one embodiment, the multi-dimensional vector quantizer is a four-dimensional delayed vector quantizer (4D delayed VQ) 168. The term "delayed" highlights that the quantization of the fixed codebook gains for the subframes occurs only after the search in the fixed codebook for all the subframes. Referring again to FIG. 2, the F1 second frame-processing module 76 determines the fixed codebook gain for each of the subframes. The fixed codebook gain may be determined by first buffering parameters generated on a sub-frame basis until the entire frame has been processed. When the frame has been processed, the fixed codebook gains for all of the subframes are quantized using the buffered parameters to generate the Type One fixed codebook gain component 150b. In one embodiment, the Type One fixed codebook gain component 150b comprises 10 bits as illustrated in FIG. 4.

The Type One fixed codebook gain component 150b is generated by representing the fixed-codebook gains with a plurality of fixed codebook energies in units of decibels (dB). The fixed codebook energies are quantized to generate a plurality of quantized fixed codebook energies, which are then translated to create a plurality of quantized fixed-codebook gains. In addition, the fixed codebook energies are predicted from the quantized fixed codebook energy errors of the previous frames to generate a plurality of predicted fixed codebook energies. The difference between the predicted fixed codebook energies and the fixed codebook energies is a plurality of prediction fixed codebook energy errors. In one embodiment, different prediction coefficients may be used for each of 4 subframes to generate the predicted fixed codebook energies. In this example embodiment, the predicted fixed codebook energies of the first, the second, the third, and the fourth subframe are predicted from the 4 quantized fixed codebook energy errors of the previous frame. The prediction coefficients for the first, second, third, and fourth subframes of this example embodiment may be {0.7, 0.6, 0.4, 0.2}, {0.4, 0.2, 0.1, 0.05}, {0.3, 0.2, 0.075, 0.025}, and {0.2, 0.075, 0.025, 0.0}, respectively.

The prediction fixed codebook energy errors may be grouped to form a fixed codebook gain vector that, when quantized, may be referred to as a quantized fixed codebook gain ($\hat{g}^k_c$). In one embodiment, the prediction fixed codebook energy error for each subframe represent the elements in the vector. The prediction fixed codebook energy errors are quantized using a plurality of predetermined vectors in a delayed gain quantization table. During quantization, a perceptual weighing measure may be incorporated to minimize the quantization error. An index location that identifies the predetermined vector in the delayed gain quantization table is the fixed codebook gain component 150b for the frame.

The predetermined vectors in the delayed gain quantization table of one embodiment includes 4 elements. Accordingly, the delayed gain quantization table may be represented by the previously discussed Table 5. One embodiment of the delayed gain quantization table includes 1024 predetermined vectors (n=1024). An embodiment of the delayed gain quantization table is entitled "Float64 gainVQ_4_1024" and is included in Appendix B of the attached microfiche appendix.

Referring again to FIG. 3, the fixed and adaptive codebook gain components 148 and 150 may be decoded by the full-rate decoder 90 within the decoding system 16 based on the type classification. The F0 excitation reconstruction module 104 decodes the Type Zero adaptive and fixed codebook gain component 148a, 150a. Similarly, the Type One adaptive codebook gain component 148b and the Type One fixed gain component 150b are decoded by the F1 excitation reconstruction module 106.

Decoding of the fixed and adaptive codebook gain components 148 and 150 involves generation of the respective predicted gains, as previously discussed, by the full-rate decoder 90. The respective quantized vectors from the respective quantization tables are then located using the respective index locations. The respective quantized vectors are then assembled with the respective predicted gains to generate respective quantized codebook gains. The quantized codebook gains generated from the Type Zero fixed and adaptive gain component 148a and 150a represent the values for both the fixed and adaptive codebook gains for a subframe. The quantized codebook gain generated from the Type One adaptive codebook gain component 148b and the Type One fixed codebook gain component 150b represents the values for the fixed and adaptive codebook gains, respectively, for each subframe in a frame.

1.2 Bit Allocation for the Half-rate Codec

Figure 5:
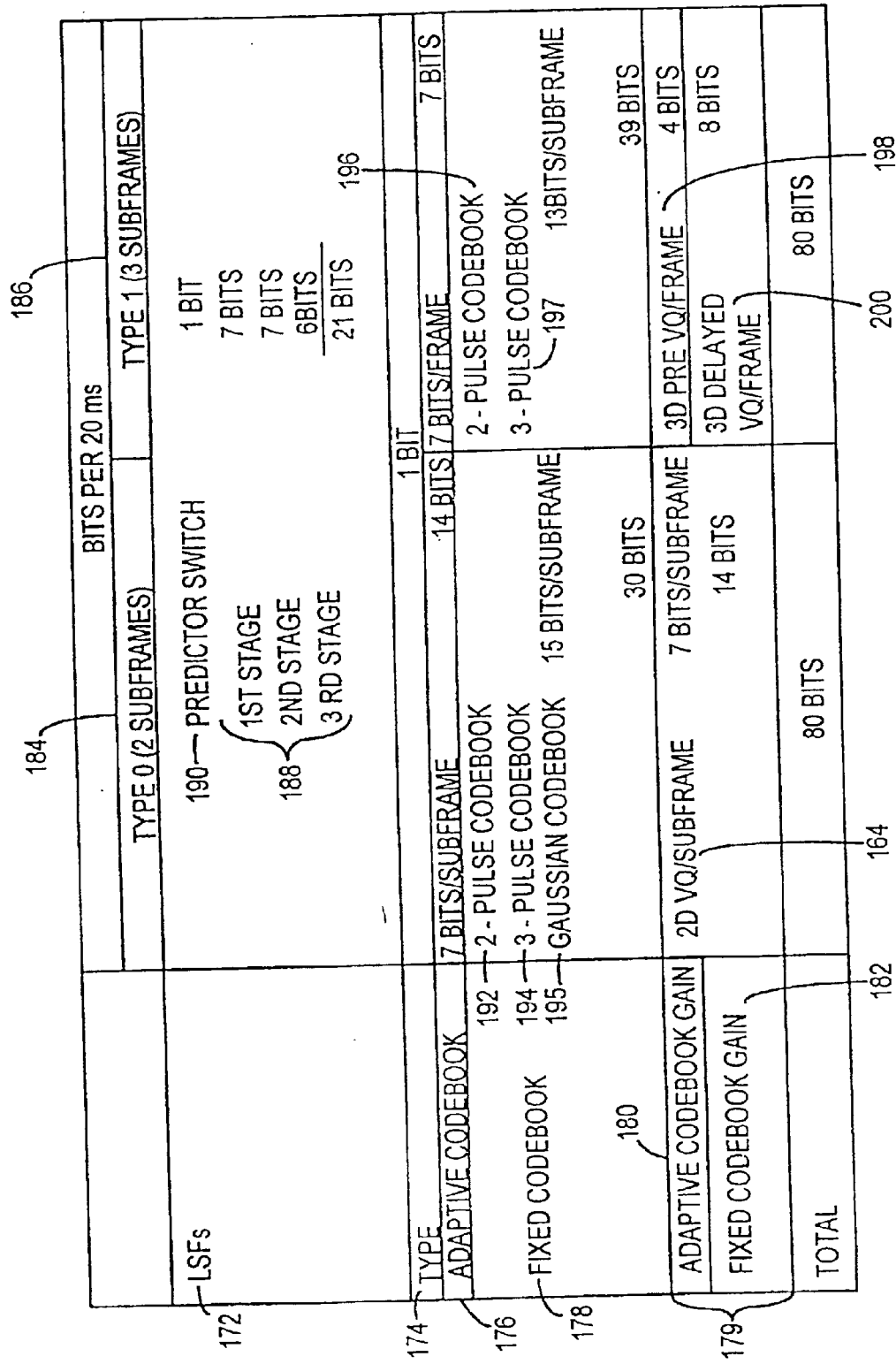
FIG. 5 is a table illustrating the bit allocation of one embodiment of the half-rate codec.

Referring now to FIGS. 2, 3 and 5, the half-rate bitstream of the half-rate codec 24 will be described. The half-rate codec 24 is in many respects similar to the full-rate codec 22 but has a different bit allocation. As such, for purposes of brevity, the discussion will focus on the differences. Referring now to FIG. 5, the bitstream allocation of one embodiment of the half-rate codec 24 includes a line spectrum frequency (LSF) component 172, a type component 174, an adaptive codebook component 176, a fixed codebook component 178, and a gain component 179. The gain component 179 further comprises an adaptive codebook gain component 180 and a fixed codebook gain component 182. The bitstream of the half-rate codec 24 also is further defined by a Type Zero column 184 and a Type One column 186. In one embodiment, the Type Zero column 184 uses two subframes of 10 milliseconds each containing 80 samples. The Type One column 186, of one embodiment, uses three subframes where the first and second subframes contain 53 samples and the third subframe contains 54 samples.

Although generated similarly to the full-rate codec 22, the LSF component 172 includes a plurality of stages 188 and a predictor switch 190 for both the Type Zero and the Type One classifications. In addition, one embodiment of the LSF component 172 comprises 21 bits that form part of the first portion of the bitstream. The initial half frame-processing module 48 illustrated in FIG. 2, generates the LSF component 172 similarly to the full-rate codec 22. Referring again to FIG. 5, the half-rate codec 24 of one embodiment includes three stages 188, two with 128 vectors and one with 64 vectors. The three stages 188 of the half rate codec 24 operate similarly to the full-rate codec 22 for frames classified as Type One with the exception of the selection of a set of predictor coefficients as discussed later. The index location of each of the 128 vectors is identified with 7 bits and the index location of each of the 64 vectors is identified with 6 bits. One embodiment of the LSF prediction error quantization table for the half-rate codec 24 is titled "Float64 CBes_40k" and is included in Appendix B of the attached microfiche appendix.

The half-rate codec 24 also differs from the full-rate codec 22 in selecting between sets of predictor coefficients. The predictor switch 190 of one embodiment identifies one of two possible sets of predictor coefficients using one bit. The selected set of predictor coefficients may be used to determine the predicted line spectrum frequencies (LSFs), similar to the full-rate codec 22. The predictor switch 190 determines and identifies which of the sets of predictor coefficients will best minimize the quantization error. The sets of predictor coefficients may be contained in an LSF predictor coefficient table that may be generally illustrated by the following matrix:

TABLE 6

$$\left[\begin{bmatrix} El_1^1, & El_2^1, & \ldots & El_n^1 \\ \vdots & \vdots & \ldots & \vdots \\ Em_1^1, & Em_2^1, & \ldots & Em_n^1 \end{bmatrix}_1 \begin{bmatrix} El_1^j, & El_2^j, & \ldots & El_n^j \\ \vdots & \vdots & \ldots & \vdots \\ Em_1^j, & Em_2^j, & \ldots & Em_n^j \end{bmatrix}_j\right]$$

In one embodiment there are four predictor coefficients (m=4) in each of two sets (j=2) that comprise 10 elements each (n=10). The LSF predictor coefficient table for the half-rate codec 24 in one embodiment is titled "Float64 B_40k" and is included in Appendix B of the attached microfiche appendix. Referring again to FIG. 3, the LSF prediction error quantization table and the LSF predictor coefficient table are used by the H LPC reconstruction module 118 within the decoding system 16. The H LPC reconstruction module 118 receives and decodes the LSF component 172 from the bitstream to reconstruct the quantized frame LSFs. Similar to the full-rate codec 22, for frames classified as Type One, the half-rate codec 24 uses a predetermined linear interpolation path. However, the half-rate codec 24 uses the predetermined linear interpolation path for frames classified as both Type Zero and Type One.

The adaptive codebook component 176 in the half-rate codec 24 similarly models the pitch lag based on the periodicity of the speech signal 18. The adaptive codebook component 176 is encoded on a subframe basis for the Type Zero classification and a frame basis for the Type One classification. As illustrated in FIG. 2, the initial half frame-processing module 48 encodes an open loop adaptive codebook component 176a for frames with the Type One classification. For frames with the Type Zero classification, the H0 first subframe-processing module 80 encodes a closed loop adaptive codebook component 176b.

Referring again to FIG. 5, one embodiment of the open loop adaptive codebook component 176a is encoded by 7 bits per frame and the closed loop adaptive codebook component 176b is encoded by 7 bits per subframe. Accordingly, the Type Zero adaptive codebook component 176a is part of the first portion of the bitstream, and the Type One adaptive codebook component 176b is part of the second portion of the bitstream. As illustrated in FIG. 3, the decoding system 16 receives the closed loop adaptive codebook component 176b. The closed loop adaptive codebook component 176b is decoded by the half-rate decoder 92 using the H0 excitation reconstruction module 114. Similarly, the H1 excitation reconstruction module 116 decodes the open loop adaptive codebook component 176a.

One embodiment of the fixed codebook component 178 for the half-rate codec 24 is dependent on the type classification to encode the long-term residual as in the full-rate codec 22. Referring again to FIG. 2, a Type Zero fixed codebook component 178a or a Type One fixed codebook component 178b is generated by the H0 first subframe-processing module 80 or the H1 second subframe-processing module 84, respectively. Accordingly, the Type Zero and Type One fixed codebook components 178a and 178b form a part of the second portion of the bitstream.

Referring again to FIG. 5, the Type Zero fixed codebook component 178a of an example embodiment is encoded using 15 bits per subframe with up to two bits identify the codebook to be used as in the full-rate codec 22. Encoding the Type Zero fixed codebook component 178a involves use of a plurality of n-pulse codebooks that are a 2-pulse codebook 192 and a 3-pulse codebook 194 in the example embodiment. In addition, in this example embodiment, a Gaussian codebook 195 is used that includes entries that are random excitation. For the n-pulse codebooks, the half-rate codec 24 uses the track tables similarly to the full-rate codec 22. In one embodiment, the track table entitled "static INT16 track_2_7_1," "static INT16 track_1_3_0," and "static INT16. track_3_2_0" included in the library entitled "tracks.tab" in Appendix B of the microfiche appendix are used.

In an example embodiment of the 2-pulse codebook 192, each track in the track table includes 80 sample locations for each representative pulse. The pulse locations for both the first and second representative pulses are encoded using 13 bits. Encoding 1 of the 80 possible pulse locations is accomplished in 13 bits by identifying the pulse location for the first representative pulse, multiplying the pulse location by 80 and adding the pulse location of the second representative pulse to the result. The end result is a value that can be encoded in 13 bits with an additional bit used to represent the signs of both representative pulses as in the full-rate codec 22.

In an example embodiment of the 3-pulse codebook 194, the pulse locations are generated by the combination of a general location, that may be one of 16 sample locations defined by 4 bits, and a relative displacement there from. The relative displacement may be 3 values representing each of the 3 representative pulses in the 3-pulse codebook 194. The values represent the location difference away from the general location and may be defined by 2 bits for each representative pulse. The signs for the three representative pulses may be each defined by one bit such that the total bits for the pulse location and the signs is 13 bits.

The Gaussian codebook 195 generally represents noise type speech signals that may be encoded using two orthogonal basis random vectors. The Type Zero fixed codebook component 178*a* represents the two orthogonal based random vectors generated from the Gaussian codebook 195. The Type Zero fixed codebook component 178*a* represents how to perturbate a plurality of orthogonal basis random vectors in a Gaussian table to increase the number of orthogonal basis random vectors without increasing the storage requirements. In an example embodiment, the number of orthogonal basis random vectors is increased from 32 vectors to 45 vectors. A Gaussian table that includes 32 vectors with each vector comprising 40 elements represents the Gaussian codebook of the example embodiment. In this example embodiment, the two orthogonal basis random vectors used for encoding are interleaved with each other to represent 80 samples in each subframe. The Gaussian codebook may be generally represented by the following matrix:

TABLE 7

$$\begin{bmatrix} G1_1, & G1_2, & \ldots & G1_n \\ G2_1, & G2_2, & \ldots & G2_n \\ \vdots & \vdots & \ldots & \vdots \\ G32_1, & G32_2 & \cdots & G32_n \end{bmatrix}$$

One embodiment of the Gaussian codebook 195 is titled "double bv" and is included in Appendix B of the attached microfiche appendix. For the example embodiment of the Gaussian codebook 195, 11 bits identify the combined indices (location and perturbation) of both of the two orthogonal basis random vectors used for encoding, and 2 bits define the signs of the orthogonal basis random vectors.

Encoding the Type One fixed codebook component 178*b* involves use of a plurality of n-pulse codebooks that are a 2-pulse codebook 196 and a 3-pulse codebook 197 in the example embodiment. The 2-pulse codebook 196 and the 3-pulse codebook 197 function similarly to the 2-pulse codebook 192 and the 3-pulse codebook 194 of the Type Zero classification, however the structure is different. The Type One fixed codebook component 178*b* of an example embodiment is encoded using 13 bits per subframe. Of the 13 bits, 1 bit identifies the 2-pulse codebook 196 or the 3-pulse codebook 197 and 12 bits represent the respective pulse locations and the signs of the representative pulses. In the 2-pulse codebook 196 of the example embodiment, the tracks include 32 sample locations for each representative pulse that are encoded using 5 bits with the remaining 2 bits used for the sign of each representative pulse. In the 3-pulse codebook 197, the general location includes 8 sample locations that are encoded using 4 bits. The relative displacement is encoded by 2 bits and the signs for the representative pulses are encoded in 3 bits similar to the frames classified as Type Zero.

Referring again to FIG. 3, the decoding system 16 receives the Type Zero or Type One fixed codebook components 178*a* and 178*b*. The Type Zero or Type One fixed codebook components 178*a* and 178*b* are decoded by the H1 excitation reconstruction module 114 or the H1 reconstruction module 116, respectively. Decoding of the Type Zero fixed codebook component 178*a* occurs using an embodiment of the 2-pulse codebook 192, the 3-pulse codebook 194, or the Gaussian codebook 195. The Type One fixed codebook component 178*b* is decoded using the 2-pulse codebook 196 or the 3-pulse codebook 197.

Referring again to FIG. 5, one embodiment of the gain component 179 comprises a Type Zero adaptive and fixed codebook gain component 180*a* and 182*a*. The Type Zero adaptive and fixed codebook gain component 180*a* and 182*a* may be quantized using the two-dimensional vector quantizer (2D VQ) 164 and the 2D gain quantization table (Table 4), used for the full-rate codec 22. In one embodiment, the 2D gain quantization table is entitled "Float64 gainVQ_3_128", and is included in Appendix B of the attached microfiche appendix.

Type One adaptive and fixed codebook gain components 180*b* and 182*b* may also be generated similarly to the full-rate codec 22 using multi-dimensional vector quantizers. In one embodiment, a three-dimensional pre vector quantizer (3D preVQ) 198 and a three-dimensional delayed vector quantizer (3D delayed VQ) 200 are used for the adaptive and fixed gain components 180*b* and 182*b*, respectively. The vector quantizers 198 and 200 perform quantization using respective gain quantization tables. In one embodiment, the gain quantization tables are a pre-gain quantization table and a delayed gain quantization table for the adaptive and fixed codebook gains, respectively. The multi-dimensional gain tables may be similarly structured and include a plurality of predetermined vectors. Each multi-dimensional gain table in one embodiment comprises 3 elements for each subframe of a frame classified as Type One.

Similar to the fulll-rate codec 22, the three-dimensional pre vector quantizer (3D preVQ) 198 for the adaptive gain component 180*b* may quantize directly the adaptive gains. In addition, the three-dimensional delayed vector quantizer (3D delayed VQ) 200 for the fixed gain component 182*b* may quantize the fixed codebook energy prediction error. Different prediction coefficients may be used to predict the fixed codebook energy for each subframe. In one preferred embodiment, the predicted fixed codebook energies of the first, the second, and the third subframes are predicted from the 3 quantized fixed codebook energy errors of the previous frame. In this example embodiment, the predicted fixed codebook energies of the first, the second, and the third subframes are predicted using the set of coefficients {0.6, 0.3, 0.1}, {0.4, 0.25, 0.1}, and {0.3, 0.15, 0.075}, respectively.

The gain quantization tables for the half-rate codec 24 may be generally represented as:

TABLE 8

$$\begin{bmatrix} Gl_1, & Gl_2, & Gl_3, \\ \vdots & \vdots & \vdots \\ Gn_1, & Gn_2, & Gn_3 \end{bmatrix}$$

One embodiment of the pre-gain quantization table used by the three-dimensional pre vector quantizer (3D preVQ) 198 includes 16 vectors (n=16). The three-dimensional delayed vector quantizer (3D delayed VQ) 200 uses one embodiment of the delayed gain quantization table that includes 256 vectors (n=256). The gain quantization tables for the pre vector quantizer (3D preVQ) 198 and the delayed vector quantizer (3D delayed VQ) 200 of one embodiment are entitled "Float64 gp3_tab" and "Float64 gainVQ_3_256", respectively, and are included in Appendix B of the attached microfiche appendix.

Referring again to FIG. 2, the Type Zero adaptive and fixed codebook gain component 180a and 182a is generated by the H0 first subframe-processing module 80. The H1 first frame-processing module 82 generates the Type One adaptive codebook gain component 180b. Similarly, the Type One fixed codebook gain component 182b is generated by the H1 second frame-processing module 86. Referring again to FIG. 3, the decoding system 16 receives the Type Zero adaptive and fixed codebook gain component 180a and 182a. The Type Zero adaptive and fixed codebook gain component 180a and 182a is decoded by the H0 excitation reconstruction module 114 based on the type classification. Similarly, the H1 excitation reconstruction module 116 decodes the Type One adaptive gain component 180b and the Type One fixed codebook gain component 182b.

1.3 Bit Allocation for the Quarter-rate Codec

Referring now to FIGS. 2, 3 and 6, the quarter-rate bitstream of the quarter-rate codec 26 will now be explained. The illustrated embodiment of the quarter-rate codec 26 operates on both a frame basis and a subframe basis but does not include the type classification as part of the encoding process as in the full and half-rate codecs 22 and 24. Referring now to FIG. 6, the bitstream generated by quarter-rate codec 26 includes an LSF component 202 and an energy component 204. One embodiment of the quarter-rate codec 26 operates using two subframes of 10 milliseconds each to process frames using 39 bits per frame.

The LSF component 202 is encoded on a frame basis using a similar LSF quantization scheme as the full-rate codec 22 when the frame is classified as Type Zero. The quarter-rate codec 26 utilizes an interpolation element 206 and a plurality of stages 208 to encode the LSFs to represent the spectral envelope of a frame. One embodiment of the LSF component 202 is encoded using 27 bits. The 27 bits represent the interpolation element 206 that is encoded in 2 bits and four of the stages 208 that are encoded in 25 bits. The stages 208 include one stage encoded using 7 bits and three stages encoded using 6 bits. In one embodiment, the quarter rate codec 26 uses the exact quantization table and predictor coefficients table used by the full rated codec 22. The quantization table and the predictor coefficients table of one embodiment are titled "Float64 CBes_85k" and "Float64 B_85k", respectively, and are included in Appendix B of the attached microfiche appendix.

The energy component 204 represents an energy gain that may be multiplied by a vector of similar yet random numbers that may be generated by both the encoding system 12 and the decoding system 16. In one embodiment, the energy component 204 is encoded using 6 bits per subframe. The energy component 204 is generated by first determining the energy gain for the subframe based on the random numbers. In addition, a predicted energy gain is determined for the subframe based on the energy gain of past frames.

The predicted energy gain is subtracted from the energy gain to determine an energy gain prediction error. The energy gain prediction error is quantized using an energy gain quantizer and a plurality of predetermined scalars in an energy gain quantization table. Index locations of the predetermined scalars for each subframe may be represented by the energy component 204 for the frame.

The energy gain quantization table may be generally represented by the following matrix:

TABLE 9

$$\begin{bmatrix} G_1 \\ \vdots \\ G_n \end{bmatrix}$$

In one embodiment, the energy gain quantization table contains 64 (n=64) of the predetermined scalars. An embodiment of the energy gain quantization table is entitled "Float64 gainSQ_1_64" and is included in Appendix B of the attached microfiche appendix.

In FIG. 2, the LSF component 202 is encoded on a frame basis by the initial quarter frame-processing module 50. Similarly, the energy component 204 is encoded by the quarter rate module 60 on a subframe basis. Referring now to FIG. 3, the decoding system 16 receives the LSF component 202. The LSF component 202 is decoded by the Q LPC reconstruction module 122 and the energy component 204 is decoded by the Q excitation reconstruction module 120. Decoding the LSF component 202 is similar to the decoding methods for the full-rate codec 22 for frames classified as Type One. The energy component 204 is decoded to determine the energy gain. A vector of similar yet random numbers generated within the decoding system 16 may be multiplied by the energy gain to generate the short-term excitation.

1.4 Bit Allocation for the Eighth-rate Codec

In FIGS. 2, 3, and 7, the eighth-rate bitstream of the eighth-rate codec 28 may not include the type classification as part of the encoding process and may operate on a frame basis only. Referring now to FIG. 7, similar to the quarter rate codec 26, the bitstream of the eighth-rate codec 28 includes an LSF component 240 and an energy component 242. The LSF component 240 may be encoded using a similar LSF quantization scheme as the full-rate codec 22, when the frame is classified as Type One. The eighth-rate codec 28 utilizes a plurality of stages 244 to encode the short-term predictor or spectral representation of a frame. One embodiment of the LSF component 240 is encoded using 11 bits per frame in three stages 244. Two of the three stages 244 are encoded in 4 bits and the last of the three stages 244 is encoded in 3 bits.

The quantization approach to generate the LSF component 240 for the eighth-rate codec 28 involves an LSF prediction error quantization table and a predictor coefficients table similar to the full-rate codec 22. The LSF prediction error quantization table and the LSF predictor coefficients table can be generally represented by the previously discussed Tables 1 and 2. In an example embodiment, the LSF quantization table for the eighth-rate codec 28 includes 3 stages (j=3) with 16 quantization vectors in two stages (r=16) and 8 quantization vectors in one stage (s=8) each having 10 elements (n=10). The predictor coefficient table of one embodiment includes 4 vectors (m=4) of 10 elements each (n=10). The quantization table and the predictor coefficients table of one embodiment are titled "Float64 CBes_08k" and "Float64 B_08k," respectively, and are included in Appendix B of the attached microfiche appendix.

In FIG. 2, the LSF component 240 is encoded on a frame basis by the initial eighth frame-processing module 52. The energy component 242 also is encoded on a frame basis by the eighth-rate module 62. The energy component 242 represents an energy gain that can be determined and coded similarly to the quarter rate codec 26. One embodiment of the energy component 242 is represent by 5 bits per frame as illustrated in FIG. 7.

Similar to the quarter rate codec 26, the energy gain and the predicted energy gain may be used to determine an energy prediction error. The energy prediction error is quantized using an energy gain quantizer and a plurality of predetermined scalars in an energy gain quantization table. The energy gain quantization table may be generally represented by Table 9 as previously discussed. The energy gain quantizer of one embodiment uses an energy gain quantization table containing 32 vectors (n=32) that is entitled "Float64 gainSQ_1_32" and is included in Appendix B of the attached microfiche appendix.

In FIG. 3, the LSF component 240 and the energy component 242 may be decoded following receipt by the decoding system 16. The LSF component 240 and the energy component 242 are decoded by the E LPC reconstruction module 126 and the E excitation reconstruction module 124, respectively. Decoding of the LSF component 240 is similar to the full-rate codec 22 for frames classified as Type One. The energy component 242 may be decoded by applying the decoded energy gain to a vector of similar yet random numbers as in the quarter rate codec 26.

An embodiment of the speech compression system 10 is capable of creating and then decoding a bitstream using one of the four codecs 22, 24, 26 and 28. The bitstream generated by a particular codec 22, 24, 26 and 28 may be encoded emphasizing different parameters of the speech signal 18 within a frame depending on the rate selection and the type classification. Accordingly, perceptual quality of the post-processed synthesized speech 20 decoded from the bitstream may be optimized while maintaining the desired average bit rate.

A detailed discussion of the configuration and operation of the speech compression system modules illustrated in the embodiments of FIGS. 2 and 3 is now provided. The reader is encouraged to review the source code included in Appendix A of the attached microfiche appendix in conjunction with the discussion to further enhance understanding.

2.0 Pre-processing Module

Figure 8:
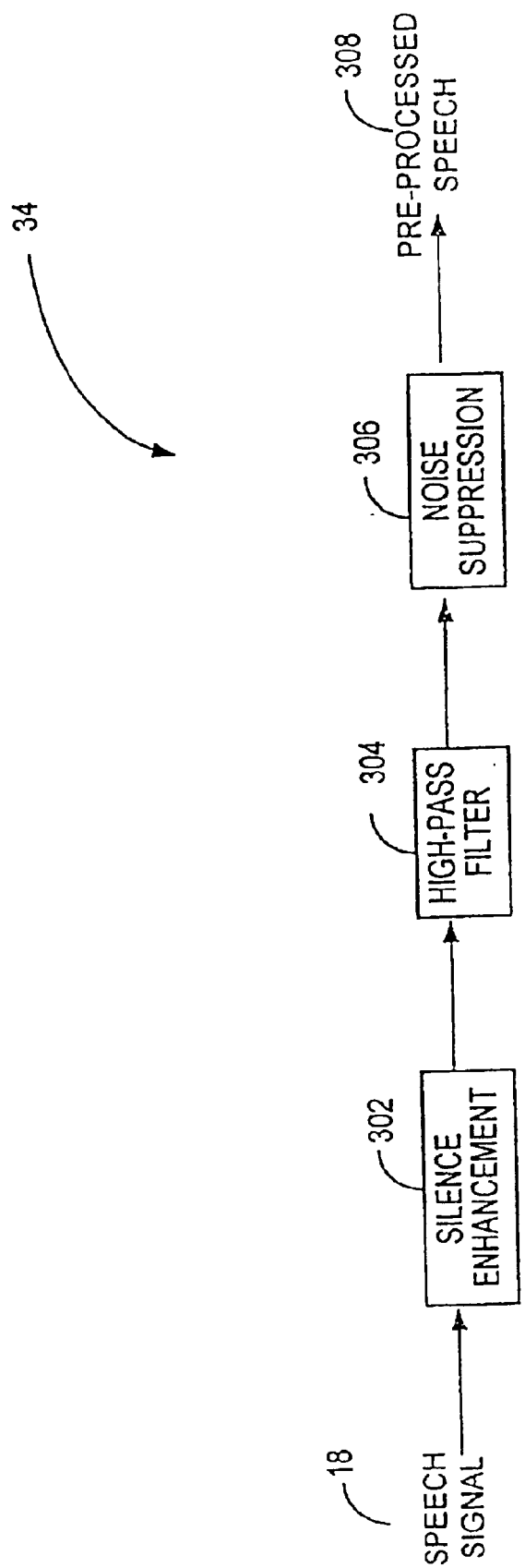
FIG. 8 is an expanded block diagram of one embodiment of the pre-processing module illustrated in FIG. 2.

Referring now to FIG. 8, an expanded block diagram of the pre-processing module 34 illustrated in FIG. 2 is provided. One embodiment of the pre-processing module 34 includes a silence enhancement module 302, a high-pass filter module 304, and a noise suppression module 306. The pre-processing module 34 receives the speech signal 18 and provides a pre-processed speech signal 308.

The silence enhancement module 302 receives the speech signal 18 and functions to track the minimum noise resolution. The silence enhancement function adaptively tracks the minimum resolution and levels of the speech signal 18 around zero, and detects whether the current frame may be "silence noise." If a frame of "silence noise" is detected, the speech signal 18 may be ramped to the zero-level. Otherwise, the speech signal 18 may not be modified. For example, the A-law coding scheme can transform such an inaudible "silence noise" into a clearly audible noise. A-law encoding and decoding of the speech signal 18 prior to the pre-processing module 34 can amplify sample values that are nearly 0 to values of about +8 or −8 thereby transforming a nearly inaudible noise into an audible noise. After processing by the silence enhancement module 302, the speech signal 18 may be provided to the high-pass filter module 304.

The high-pass filter module 304 may be a $2^{nd}$ order pole-zero filter, and may be given by the following transfer function H(z):

$$H(z) = \frac{0.92727435 - 1.8544941z^{-1} + 0.92727435z^{-2}}{1 - 1.9059465z^{-1} + 0.9114024z^{-2}} \quad \text{(Equation 1)}$$

The input may be scaled down by a factor of 2 during the high-pass filtering by dividing the coefficients of the numerator by 2.

Following processing by the high-pass filter, the speech signal 18 may be passed to the noise suppression module 306. The noise suppression module 306 employs noise subtraction in the frequency domain and may be one of the many well-known techniques for suppressing noise. The noise suppression module 306 may include a Fourier transform program used by a noise suppression algorithm as described in section 4.1.2 of the TIA/EIA IS-127 standard entitled "Enhanced Variable Rate Codec, Speech Service Option 3 for Wideband Spread Spectrum Digital Systems."

The noise suppression module 306 of one embodiment transforms each frame of the speech signal 18 to the frequency domain where the spectral amplitudes may be separated from the spectral phases. The spectral amplitudes may be grouped into bands, which follow the human auditory channel bands. An attenuation gain may be calculated for each band. The attenuation gains may be calculated with less emphasis on the spectral regions that are likely to have harmonic structure. In such regions, the background noise may be masked by the strong voiced speech. Accordingly, any attenuation of the speech can distort the quality of the original speech, without any perceptual improvement in the reduction of the noise.

Following calculation of the attenuation gain, the spectral amplitudes in each band may be multiplied by the attenuation gain. The spectral amplitudes may then be combined with the original spectral phases, and the speech signal 18 may be transformed back to the time domain. The time-domain signal may be overlapped-and-added to generate the pre-processed speech signal 308. The pre-processed speech signal 308 may be provided to the initial frame-processing module 44.

3.0 Initial Frame Processing Module

Figure 9:
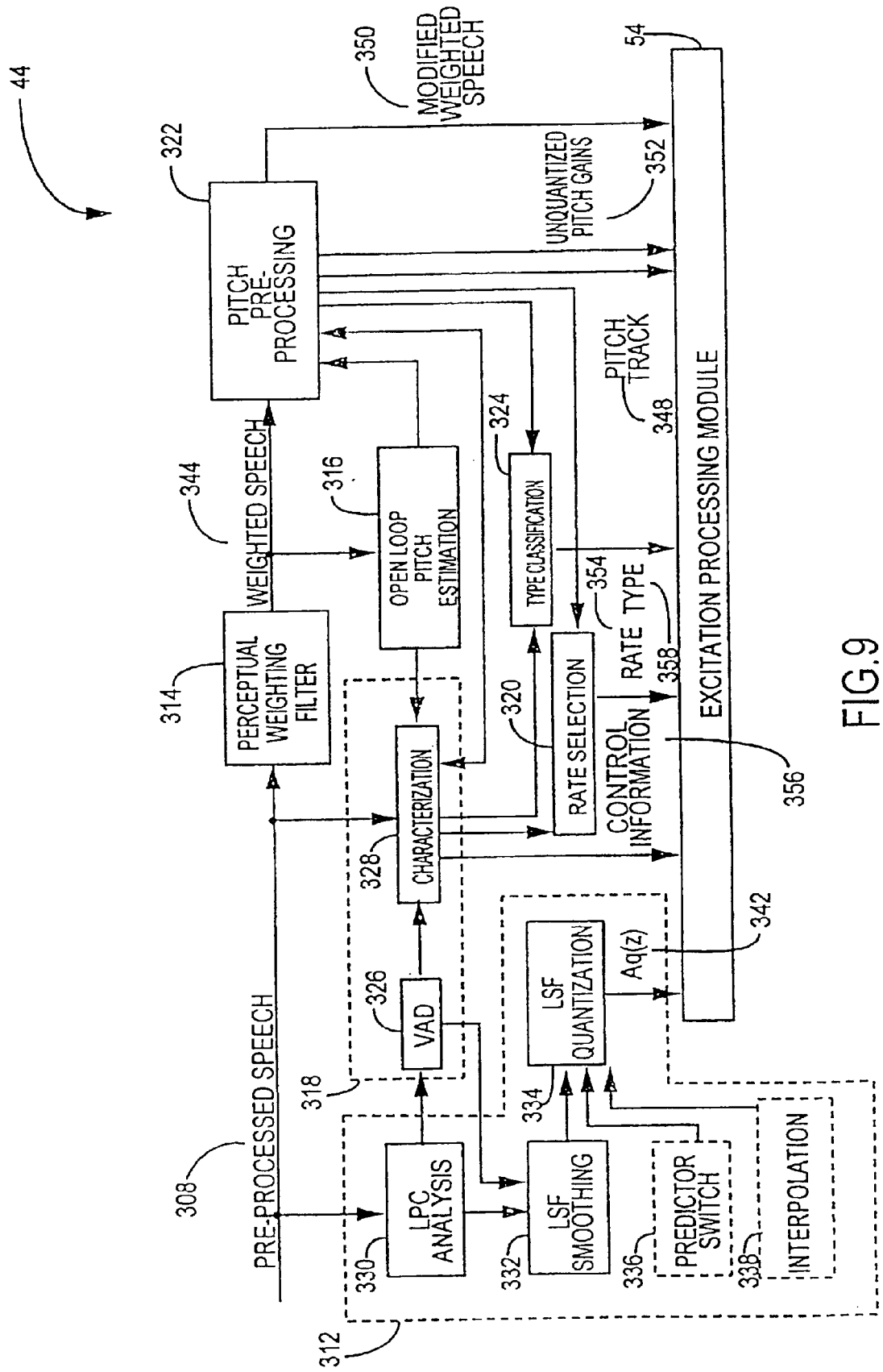
FIG. 9 is an expanded block diagram of one embodiment of the initial frame-processing module illustrated in FIG. 2 for the full and half-rate codecs.

FIG. 9 is a block diagram of the initial frame-processing module 44, illustrated in FIG. 2. One embodiment of the initial frame-processing module 44 includes an LSF generation section 312, a perceptual weighting filter module 314, an open loop pitch estimation module 316, a characterization section 318, a rate selection module 320, a pitch pre-processing module 322, and a type classification module 324. The characterization section 318 further comprises a voice activity detection (VAD) module 326 and a characterization module 328. The LSF generation section 312 comprises an LPC analysis module 330, an LSF smoothing module 332, and an LSF quantization module 334. In addition, within the full-rate encoder 36, the LSF generation section 312 includes an interpolation module 338 and within the half-rate encoder 38, the LSF generation section includes a predictor switch module 336.

Referring to FIG. 2, the initial frame-processing module 44 operates to generate the LSF components 140, 172, 202 and 240, as well as determine the rate selection and the type classification. The rate selection and type classification control the processing by the excitation-processing module 54. The initial frame-processing module 44 illustrated in FIG. 9 is illustrative of one embodiment of the initial full frame-processing module 46 and the initial half frame-processing module 48. Embodiments of the initial quarter frame-processing module 50 and the initial eighth frame-processing module 52 differ to some degree.

As previously discussed, in one embodiment, type classification does not occur for the initial quarter-rate frame-processing module 50 and the initial eighth-rate frame-processing module 52. In addition, the long-term predictor and the long-term predictor residual are not processed separately to represent the energy component 204 and 242 illustrated in FIGS. 6 and 7. Accordingly, only the LSF section 312, the characterization section 318 and the rate selection module 320 illustrated in FIG. 9 are operable within the initial quarter-rate frame-processing module 50 and the initial eighth-rate frame-processing module 52.

To facilitate understanding of the initial frame-processing module 44, a general overview of the operation will first be discussed followed by a detailed discussion. Referring now to FIG. 9, the pre-processed speech signal 308 initially is provided to the LSF generation section 312, the perceptual weighting filter module 314 and the characterization section 318. However, some of the processing within the characterization section 318 is dependent on the processing that occurs within the open loop pitch estimation module 316. The LSF generation section 312 estimates and encodes the spectral representation of the pre-processed speech signal 308. The perceptual weighting filter module 314 operates to provide perceptual weighting during coding of the pre-processed speech signal 308 according to the natural masking that occurs during processing by the human auditory system. The open loop pitch estimation module 316 determines the open loop pitch lag for each frame. The characterization section 318 analyzes the frame of the pre-processed speech signal 308 and characterizes the frame to optimize subsequent processing.

During, and following, the processing by the characterization section 318, the resulting characterizations of the frame may be used by the pitch pre-processing module 322 to generate parameters used in generation of the closed loop pitch lag. In addition, the characterization of the frame is used by the rate selection module 320 to determine the rate selection. Based on parameters of the pitch lag determined by the pitch pre-processing module 322 and the characterizations, the type classification is determined by the type classification module 324.

3.1 LPC Analysis Module

The pre-processed speech signal 308 is received by the LPC analysis module 330 within the LSF generation section 312. The LPC analysis module 330 determines the short-term prediction parameters used to generate the LSF component 312. Within one embodiment of the LPC analysis module 330, there are three $10^{th}$ order LPC analyses performed for a frame of the pre-processed speech signal 308. The analyses may be centered within the second quarter of the frame, the fourth quarter of the frame, and a lookahead. The lookahead is a speech segment that overhangs into the next frame to reduce transitional effects. The analysis within the lookahead includes samples from the current frame and from the next frame of the pre-processed speech signal 308.

Different windows may be used for each LPC analysis within a frame to calculate the linear prediction coefficients. The LPC analyses in one embodiment are performed using the autocorrelation method to calculate autocorrelation coefficients. The autocorrelation coefficients may be calculated from a plurality of data samples within each window. During the LPC analysis, bandwidth expansion of 60 Hz and a white noise correction factor of 1.0001 may be applied to the autocorrelation coefficients. The bandwidth expansion provides additional robustness against signal and round-off errors during subsequent encoding. The white noise correction factor effectively adds a noise floor of −40 dB to reduce the spectral dynamic range and further mitigate errors during subsequent encoding.

A plurality of reflection coefficients may be calculated using a Leroux-Gueguen algorithm from the autocorrelation coefficients. The reflection coefficients may then be converted to the linear prediction coefficients. The linear prediction coefficients may be further converted to the LSFs (Line Spectrum Frequencies), as previously discussed. The LSFs calculated within the fourth quarter may be quantized and sent to the decoding system 16 as the LSF component 140, 172, 202, 240. The LSFs calculated within the second quarter may be used to determine the interpolation path for the full-rate encoder 36 for frames classified as Type Zero. The interpolation path is selectable and may be identified with the interpolation element 158. In addition, the LSFs calculated within the second quarter and the lookahead may be used in the encoding system 12 to generate the short-term residual and a weighted speech that will be described later.

3.2 LSF Smoothing Module

During stationary background noise, the LSFs calculated within the fourth quarter of the frame may be smoothed by the LSF smoothing module 332 prior to quantizing the LSFs. The LSFs are smoothed to better preserve the perceptual characteristic of the background noise. The smoothing is controlled by a voice activity determination provided by the VAD module 326 that will be later described and an analysis of the evolution of the spectral representation of the frame. An LSF smoothing factor is denoted $\beta_{lsf}$. In an example embodiment:

1. At the beginning of "smooth" background noise segments, the smoothing factor may be ramped quadratically from 0 to 0.9 over 5 frames.
2. During "smooth" background noise segments the smoothing factor may be 0.9.
3. At the end of "smooth" background noise segments the smoothing factor may be reduced to 0 instantaneously.
4. During non-"smooth" background noise segments the smoothing factor may be 0.

According to the LSF smoothing factor the LSFs for the quantization may be calculated as:

$$lsf_n(k) = \beta_{lsf} \cdot lsf_{n-1}(k) + (1-\beta_{lsf}) \cdot lsf_2(k), \; k=1,2,\ldots,10 \quad \text{(Equation 2)}$$

where $lsf_n(k)$ and $lsf_{n-1}(k)$ represents the smoothed LSFs of the current and previous frame, respectively, and $lsf_2(k)$ represents the LSFs of the LPC analysis centered at the last quarter of the current frame.

3.3 LSF Quantization Module

The $10^{th}$ order LPC model given by the smoothed LSFs (Equation 2) may be quantized in the LSF domain by the LSF quantization module 334. The quantized value is a plurality of quantized LPC coefficients $A_q(z)$ 342. The quantization scheme uses an $n^{th}$ order moving average predictor. In one embodiment, the quantization scheme uses a $2^{nd}$ order moving average predictor for the full-rate codec 22 and the quarter rate codec 26. For the half-rate codec 24, a $4^{th}$ order moving average switched predictor may be used. For the eighth rate codec 28, a $4^{th}$ order moving average predictor may be used. The quantization of the LSF prediction error may be performed by multi-stage codebooks, in the respective codecs as previously discussed.

The error criterion for the LSFs quantization is a weighted mean squared error measure. The weighting for the weighted mean square error is a function of the LPC magnitude spectrum. Accordingly, the objective of the quantization may be given by:

$$\{1\hat{s}f_n(1), 1\hat{s}f_n(1), \ldots, 1\hat{s}f_n(10)\} = \arg\min\left\{\sum_{k=1}^{10} w_i \cdot (1sf_n(k) - 1\hat{s}f_n(k))^2\right\}, \quad \text{(Equation 3)}$$

where the weighting may be:

$$w_i = |P(lsf_n(i))|^{0.4}, \quad \text{(Equation 4)}$$

and $|P(f)|$ is the LPC power spectrum at frequency f (the index n denotes the frame number). In the example embodiment, there are 10 coefficients.

In one embodiment, the ordering property of the quantized LPC coefficients $A_q(z)$ 342 is checked. If one LSF pair is flipped they may be re-ordered. When two or more LSF pairs are flipped, the quantized LPC coefficients $A_q(z)$ 342 may be declared erased and may be reconstructed using the frame erasure concealment of the decoding system 16 that will be discussed later. In one embodiment, a minimum spacing of 50 Hz between adjacent coefficients of the quantized LPC coefficients $A_q(z)$ 342 may be enforced.

3.4 Predictor Switch Module

The predictor switch module 336 is operable within the half-rate codec 24. The predicted LSFs may be generated using moving average predictor coefficients as previously discussed. The predictor coefficients determine how much of the LSFs of past frames are used to predict the LSFs of the current frame. The predictor switch module 336 is coupled with the LSFs quantization module 334 to provide the predictor coefficients that minimize the quantization error as previously discussed.

3.5 LSF Interpolation Module

The quantized and unquantized LSFs may also be interpolated for each subframe within the full-rate codec 22. The quantized and unquantized LSFs are interpolated to provide quantized and unquantized linear prediction parameters for each subframe. The LSF interpolation module 338 chooses an interpolation path for frames of the full-rate codec 22 with the Type Zero classification, as previously discussed. For all other frames, a predetermined linear interpolation path may be used.

The LSF interpolation module 338 analyzes the LSFs of the current frame with respect to the LSFs of previous frames and the LSFs that were calculated at the second quarter of the frame. An interpolation path may be chosen based on the degree of variations in the spectral envelope between the subframes. The different interpolation paths adjust the weighting of the LSFs of the previous frame and the weighting of the LSFs of the current frame for the current subframe as previously discussed. Following adjustment by the LSF interpolation module 338, the interpolated LSFs may be converted to predictor coefficients for each subframe.

For Type One classification within the full-rate codec 22, as well as for the half-rate codec 24, the quarter-rate codec 26, and the eighth-rate codec 28, the predetermined linear interpolation path may be used to adjust the weighting. The interpolated LSFs may be similarly converted to predictor coefficients following interpolation. In addition, the predictor coefficients may be further weighted to create the coefficients that are used by perceptual weighting filter module 314.

3.6 Perceptual Weighting Filter Module

The perceptual weighting filter module 314 is operable to receive and filter the pre-processed speech signal 308. Filtering by the perceptual weighting filter module 314 may be performed by emphasizing the valley areas and de-emphasizing the peak areas of the pre-processed speech signal 308. One embodiment of the perceptual weighting filter module 314 has two parts. The first part may be the traditional pole-zero filter given by:

$$W_1(z) = \frac{A(z/\gamma_1)}{A(z/\gamma_2)}, \quad \text{(Equation 5)}$$

where $A(z/\gamma_1)$ and $1/A(z/\gamma_2)$ are a zeros-filter and a poles-filter, respectively. The prediction coefficients for the zeros-filter and the poles-filter may be obtained from the interpolated LSFs for each subframe and weighted by $\gamma_1$ and $\gamma_2$, respectively. In an example embodiment of the perceptual weighting filter module 314, the weighting is $\gamma_1=0.9$ and $\gamma_2=0.5$. The second part of the perceptual weighting filter module 314 may be an adaptive low-pass filter given by:

$$W_2(z) = \frac{1}{1 - \eta z^{-1}} \quad \text{(Equation 6)}$$

where $\eta$ is a function of stationary long-term spectral characteristics that will be later discussed. In one embodiment, if the stationary long-term spectral characteristics have the typical tilt associated with public switched telephone network (PSTN), then $\eta=0.2$, otherwise, $\eta=0.0$. The typical tilt is commonly referred to as a modified IRS characteristic or spectral tilt. Following processing by the perceptual weighting filter module 314, the pre-processed speech signal 308 may be described as a weighted speech 344. The weighted speech 344 is provided to the open loop pitch estimation module 316.

3.7 Open Loop Pitch Estimation Module

The open loop pitch estimation module 316 generates the open loop pitch lag for a frame. In one embodiment, the open loop pitch lag actually comprises three open loop pitch lags, namely, a first pitch lag for the first half of the frame, a second pitch lag for the second half of the frame, and a third pitch lag for the lookahead portion of the frame.

For every frame, the second and third pitch lags are estimated by the open loop pitch estimation module 316 based on the current frame. The first open loop pitch lag is the third open loop pitch lag (the lookahead) from the previous frame that may be further adjusted. The three open loop pitch lags are smoothed to provide a continuous pitch contour. The smoothing of the open loop pitch lags employs a set of heuristic and ad-hoc decision rules to preserve the optimal pitch contour of the frame. The open-loop pitch estimation is based on the weighted speech 344 denoted by $s_w(n)$. The values estimated by the open loop pitch estimation module 316 in one embodiment are lags that range from 17 to 148.

The first, second and third open loop pitch lags may be determined using a normalized correlation, R(k) that may be calculated according to $$R(k) = \frac{\sum_{n=0}^{79} s_w(n) \cdot s_w(n-k)}{\sqrt{\left(\sum_{n=0}^{79} s_w(n) \cdot s_w(n)\right)\left(\sum_{n=0}^{79} s_w(n-k) \cdot s_w(n-k)\right)}}.$$ (Equation 7)

Where n=79 in the example embodiment to represent the number of samples in the subframe. The maximum normalized correlation R(k) for each of a plurality of regions is determined. The regions may be four regions that represent four sub-ranges within the range of possible lags. For example, a first region from 17–33 lags, a second region from 34–67 lags, a third region from 68–137 lags, and a fourth region from 138–148 lags. One open loop pitch lag corresponding to the lag that maximizes the normalized correlation values R(k) from each region are the initial pitch lag candidates. A best candidate from the initial pitch lag candidates is selected based on the normalized correlation, characterization information, and the history of the open loop pitch lag. This procedure may be performed for the second pitch lag and for the third pitch lag.

Finally, the first, second, and third open loop pitch lags may be adjusted for an optimal fitting to the overall pitch contour and form the open loop pitch lag for the frame. The open loop pitch lag is provided to the pitch pre-processing module 322 for further processing that will be described later. The open loop pitch estimation module 316 also provides the pitch lag and normalized correlation values at the pitch lag. The normalized correlation values at the pitch lag are called a pitch correlation and are notated as $R_p$. The pitch correlation $R_p$ is used in characterizing the frame within the characterization section 318.

3.8 Characterization Section

The characterization section 318 is operable to analyze and characterize each frame of the pre-processed speech signal 308. The characterization information is utilized by a plurality of modules within the initial frame-processing module 44 as well by the excitation-processing module 54. Specifically, the characterization information is used in the rate selection module 320 and the type classification module 324. In addition, the characterization information may be used during quantization and coding, particularly in emphasizing the perceptually important features of the speech using a class-dependent weighting approach that will be described later.

Characterization of the pre-processed speech signal 308 by the characterization section 318 occurs for each frame. Operation of one embodiment of the characterization section 318 may be generally described as six categories of analysis of the pre-processed speech signal 308. The six categories are: voice activity determination, the identification of unvoiced noise-like speech, a 6-class signal characterization, derivation of a noise-to-signal ratio, a 4-grade characterization, and a characterization of a stationary long term spectral characteristic.

3.9 Voice Activity Detection (VAD) Module

The voice activity detection (VAD) module 326 performs voice activity determination as the first step in characterization. The VAD module 326 operates to determine if the pre-processed speech signal 308 is some form of speech or if it is merely silence or background noise. One embodiment of the VAD module 326 detects voice activity by tracking the behavior of the background noise. The VAD module 326 monitors the difference between parameters of the current frame and parameters representing the background noise. Using a set of predetermined threshold values, the frame may be classified as a speech frame or as a background noise frame.

The VAD module 326 operates to determine the voice activity based on monitoring a plurality of parameters, such as, the maximum of the absolute value of the samples in the frame, as well as the reflection coefficients, the prediction error, the LSFs and the $10^{th}$ order autocorrelation coefficients provided by the LPC analysis module 330. In addition, an example embodiment of the VAD module 326 uses the parameters of the pitch lag and the adaptive codebook gain from recent frames. The pitch lags and the adaptive codebook gains used by the VAD module 326 are from the previous frames since pitch lags and adaptive codebook gains of the current frame are not yet available. The voice activity determination performed by the VAD module 326 may be used to control several aspects of the encoding system 12, as well as forming part of a final class characterization decision by the characterization module 328.

3.10 Characterization Module

Following the voice activity determination by the VAD module 326, the characterization module 328 is activated. The characterization module 328 performs the second, third, fourth and fifth categories of analysis of the pre-processed speech signal 308 as previously discussed. The second category is the detection of unvoiced noise-like speech frames.

3.10.1 Unvoiced Noise-like Speech Detection

In general, unvoiced noise-like speech frames do not include a harmonic structure, whereas voiced frames do. The detection of an unvoiced noise-like speech frame, in one embodiment, is based on the pre-processed speech signal 308, and a weighted residual signal $R_w(z)$ given by:

$$R_w(Z) = A(z/\gamma_1) \cdot S(z)$$ (Equation 8)

Where $A(z/\gamma_1)$ represents a weighted zeros-filter with the weighting $\gamma_1$ and S(z) is the pre-processed speech signal 308. A plurality of parameters, such as the following six parameters may be used to determine if the current frame is unvoiced noise-like speech:

1. The energy of the pre-processed speech signal 308 over the first ¾ of the frame.
2. A count of the speech samples within the frame that are under a predetermined threshold.
3. A residual sharpness determined using a weighted residual signal and the frame size. The sharpness is given by the ratio of the average of the absolute values of the samples to the maximum of the absolute values of the samples. The weighted residual signal may be determined from Equation 8.

4. A first reflection coefficient representing the tilt of the magnitude spectrum of the pre-process speech signal 308.
5. The zero crossing rate of the pre-processed speech signal 308.
6. A prediction measurement between the pre-processed speech signal 308 and the weighted residual signal.

In one embodiment, a set of predetermined threshold values are compared to the above listed parameters in making the determination of whether a frame is unvoiced noise-like speech. The resulting determination may be used in controlling the pitch pre-processing module 322, and in the fixed codebook search, both of which will be described later. In addition, the unvoiced noise-like speech determination is used in determining the 6-class signal characterization of the pre-processed speech signal 308.

3.10.2 6-Class Signal Characterization

The characterization module 328 may also perform the third category of analysis that is the 6-class signal characterization. The 6-class signal characterization is performed by characterizing the frame into one of 6 classes according to the dominant features of the frame. In one embodiment, the 6 classes may be described as:

0. Silence/Background Noise
1. Stationary Noise-Like Unvoiced Speech
2. Non-Stationary Unvoiced
3. Onset
4. Non-Stationary Voiced
5. Stationary. Voiced In an alternative embodiment, other classes are also included such as frames characterized as plosive. Initially, the characterization module 328 distinguishes between silence/background noise frames (class 0), non-stationary unvoiced frames (class 2), onset frames (class 3), and voiced frames represented by class 4 and 5. Characterization of voiced frames as Non-Stationary (class 4) and Stationary (class 5) may be performed during activation of the pitch pre-processing module 322. Furthermore, the characterization module 328 may not initially distinguish between stationary noise-like unvoiced frames(class 1) and non-stationary unvoiced frames(class 2). This characterization class may also be identified during processing by the pitch pre-processing module 322 using the determination by the unvoiced noise-like speech algorithm previously discussed.

The characterization module 328 performs characterization using, for example, the pre-processed speech signal 308 and the voice activity detection by the VAD module 326. In addition, the characterization module 328 may utilize the open loop pitch lag for the frame and the normalized correlation $R_p$ corresponding to the second open loop pitch lag.

A plurality of spectral tilts and a plurality of absolute maximums may be derived from the pre-processed speech signal 308 by the characterization module 328. In an example embodiment, the spectral tilts for 4 overlapped segments comprising 80 samples each are calculated. The 4 overlapped segments may be weighted by a Hamming window of 80 samples. The absolute maximums of an example embodiment are derived from 8 overlapped segments of the pre-processed speech signal 308. In general, the length of each of the 8 overlapped segments is about 1.5 times the period of the open loop pitch lag. The absolute maximums may be used to create a smoothed contour of the amplitude envelope.

The spectral tilt, the absolute maximum, and the pitch correlation $R_p$ parameters may be updated or interpolated multiple times per frame. Average values for these parameters may also be calculated several times for frames characterized as background noise by the VAD module 326. In an example embodiment, 8 updated estimates of each parameter are obtained using 8 segments of 20 samples each. The estimates of the parameters for the background noise may be subtracted from the estimates of parameters for subsequent frames not characterized as background noise to create a set of "noise cleaned" parameters.

A set of statistically based decision parameters may be calculated from the "noise clean" parameters and the open loop pitch lag. Each of the statistically based decision parameters represents a statistical property of the original parameters, such as, averaging, deviation, evolution, maximum, or minimums. Using a set of predetermined threshold parameters, initial characterization decisions may be made for the current frame based on the statistical decision parameters. Based on the initial characterization decision, past characterization decisions, and the voice activity decision of the VAD module 326, an initial class decision may be made for the frame. The initial class decision characterizes the frame as one of the classes 0, 2, 3, or as a voiced frame represented by classes 4 and 5.

3.10.3 Noise-to-Signal Ratio Derivation

In addition to the frame characterization, the characterization module 328 of one embodiment also performs the fourth category of analysis by deriving a noise-to-signal ratio (NSR). The NSR is a traditional distortion criterion that may be calculated as the ratio between an estimate of the background noise energy and the frame energy of a frame. One embodiment of the NSR calculation ensures that only true background noise is included in the ratio by using a modified voice activity decision. The modified voice activity decision is derived using the initial voice activity decision by the VAD module 326, the energy of the frame of the pre-processed speech signal 308 and the LSFs calculated for the lookahead portion. If the modified voice activity decision indicates that the frame is background noise, the energy of the background noise is updated.

The background noise is updated from the frame energy using, for example, moving average. If the energy level of the background noise is larger than the energy level of the frame energy, it is replaced by the frame energy. Replacement by the frame energy can involve shifting the energy level of the background noise lower and truncating the result. The result represents the estimate of the background noise energy that may be used in the calculation of the NSR.

Following calculation of the NSR, the characterization module 328 performs correction of the initial class decision to a modified class decision. The correction may be performed using the initial class decision, the voice activity determination and the unvoiced noise-like speech determination. In addition, previously calculated parameters representing, for example, the spectrum expressed by the reflection coefficients, the pitch correlation $R_p$, the NSR, the energy of the frame, the energy of the previous frames, the residual sharpness and a sharpness of the weighted speech may also be used. The correction of the initial class decision is called characterization tuning. Characterization tuning can change the initial class decision, as well as set an onset condition flag and a noisy voiced flag if these conditions are identified. In addition, tuning can also trigger a change in the voice activity decision by the VAD module 326.

3.10.4 4-Grade Characterization

The characterization module 328 can also generate the fifth category of characterization, namely, the 4-grade characterization. The 4-grade characterization is a parameter that controls the pitch pre-processing module 322. One embodiment of the 4-grade characterization distinguishes between 4 categories. The categories may be labeled numerically from 1 to 4. The category labeled 1 is used to reset the pitch pre-processing module 322 in order to prevent accumulated delay that exceeds a delay budget during pitch pre-processing. In general, the remaining categories indicate increasing voicing strength. Increasing voicing strength is a measure of the periodicity of the speech. In an alternative embodiment, more or less categories could be included to indicate the levels of voicing strength.

3.10.5 Stationary Long-term Spectral Characteristics

The characterization module 328 may also performs the sixth category of analysis by determining the stationary long-term spectral characteristics of the pre-processed speech signal 308. The stationary long-term spectral characteristic is determined over a plurality of frames using, for example, spectral information such as the LSFs, the 6-class signal characterization and the open loop pitch gain. The determination is based on long-term averages of these parameters.

3.11 Rate Selection Module

Following the modified class decision by the characterization module 328, the rate selection module 320 can make an initial rate selection called an open loop rate selection. The rate-selection module 320 can use, for example, the modified class decision, the NSR, the onset flag, the residual energy, the sharpness, the pitch correlation Rp, and spectral parameters such as the reflection coefficients in determining the open-loop rate selection. The open loop rate selection may also be selected based on the Mode that the speech compression system 10 is operating within. The rate selection module 320 is tuned to provide the desired average bit rate as indicated by each of the Modes. The initial rate selection may be modified following processing by the pitch pre-processing module 322 that will be described later.

3.12 Pitch Pre-processing Module

The pitch pre-processing module 322 operates on a frame basis to perform analysis and modification of the weighted speech 344. The pitch pre-processing module 322 may, for example, uses compression or dilation techniques on pitch cycles of the weighted speech 344 in order to improve the encoding process. The open loop pitch lag is quantized by the pitch pre-processing module 322 to generate the open loop adaptive codebook component 144a or 176a, as previously discussed with reference to FIGS. 2, 4 and 5. If the final type classification of the frame is Type One, this quantization represents the pitch lag for the frame. However, if the type classification is changed following processing by the pitch pre-processing module 322, the pitch lag quantization also is changed to represent the closed loop adaptive codebook component 144b or 176b, as previously discussed with reference to FIGS. 2, 4 and 5.

The open loop pitch lag for the frame that was generated by the open loop pitch estimation module 316 is quantized and interpolated, to create a pitch track 348. In general, the pitch pre-processing module 322 attempts to modify the weighted speech 344 to fit the pitch track 348. If the modification is successful, the final type classification of the frame is Type One. If the modification is unsuccessful the final type classification of the frame is Type Zero.

As further detailed later, the pitch pre-processing modification procedure can perform continuous time warping of the weighted speech 344. The warping introduces a variable delay. In one example embodiment, the maximum variable delay within the encoding system 12 is 20 samples (2.5 ms). The weighted speech 344 may be modified on a pitch cycle-by-pitch cycle basis, with certain overlap between adjacent pitch cycles to avoid discontinuities between the reconstructed/modified segments. The weighted speech 344 may be modified according to the pitch track 348 to generate a modified weighted speech 350. In addition, a plurality of unquantized pitch gains 352 are generated by the pitch pre-processing module 322. If the type classification of the frame is Type One, the unquantized pitch gains 352 are used to generate the Type One adaptive codebook gain component 148b (for full rate codec 22) or 180b (for half-rate codec 24). The pitch track 348, the modified weighted speech 350 and the unquantized pitch gains 352 are provided to the excitation-processing module 54.

As previously discussed, the 4-grade characterization by the characterization module 328 controls the pitch pre-processing. In one embodiment, if the frame is predominantly background noise or unvoiced with low pitch correlation, such as, category 1, the frame remains unchanged and the accumulated delay of the pitch pre-processing is reset to zero. If the frame is pre-dominantly pulse-like unvoiced, such as, category 2, the accumulated delay may be maintained without any warping of the signal except for a simple time shift. The time shift may be determined according to the accumulated delay of the input speech signal 18. For frames with the remaining 4-grade characterizations, the core of the pitch pre-processing algorithm may be executed in order to optimally warp the signal.

In general, the core of the pitch pre-processing module 322 in one embodiment performs three main tasks. First, the weighted speech 344 is modified in an attempt to match the pitch track 348. Second, a pitch gain and a pitch correlation for the signal are estimated. Finally, the characterization of the speech signal 18 and the rate selection is refined based on the additional signal information obtained during the pitch pre-processing analysis. In another embodiment, additional pitch pre-processing may be included, such as, waveform interpolation. In general, waveform interpolation may be used to modify certain irregular transition segments using forward-backward waveform interpolation techniques to enhance the regularities and suppress the irregularities of the weighted speech 344.

3.12.1 Modification

Modification of the weighted speech 344 provides a more accurate fit of the weighted speech 344 into a pitch-coding model that is similar to the Relaxed Code Excited Linear Prediction (RCELP) speech coding approach. An example of an implementation of RCELP speech coding is provided in the TIA (Telecommunications Industry Association) IS-127 standard. Performance of the modification without any loss of perceptual quality can include a fine pitch search, estimation of a segment size, target signal warping, and signal warping. The fine pitch search may be performed on a frame level basis while the estimation of a segment size, the target signal warping, and the signal warping may be executed for each pitch cycle.

3.12.1.1 Fine Pitch Search

The fine pitch search may be performed on the weighted speech 344, based on the previously determined second and third pitch lags, the rate selection, and the accumulated pitch pre-processing delay. The fine pitch search searches for fractional pitch lags. The fractional pitch lags are noninteger pitch lags that combine with the quantization of the lags. The combination is derived by searching the quantization tables of the lags used to quantize the open loop pitch lags and finding lags that maximize the pitch correlation of the weighted speech 344. In one embodiment, the search is performed differently for each codec due to the different quantization techniques associated with the different rate selections. The search is performed in a search area that is identified by the open loop pitch lag and is controlled by the accumulated delay.

3.12.1.2 Estimate Segment Size

The segment size follows the pitch period, with some minor adjustments. In general, the pitch complex (the main pulses) of the pitch cycle are located towards the end of a segment in order to allow for maximum accuracy of the warping on the perceptual most important part, the pitch complex. For a given segment the starting point is fixed and the end point may be moved to obtain the best model fit. Movement of the end point effectively stretches or compresses the time scale. Consequently, the samples at the beginning of the segment are hardly shifted, and the greatest shift will occur towards the end of the segment.

3.12.1.3 Target Signal for Warping

One embodiment of the target signal for time warping is a synthesis of the current segment derived from the modified weighted speech 350 that is represented by $s'_w(n)$ and the pitch track 348 represented by $L_p(n)$. According to the pitch track 348, $L_p(n)$, each sample value of the target signal $s'_w(n), n=0, \ldots, N_s-1$ may be obtained by interpolation of the modified weighted speech 350 using a $21^{st}$ order Hamming weighted Sinc window, $$s_w^t(n) = \sum_{i=-10}^{10} w_s(f(L_p(n)), i) \cdot s'_w(n - i(L_p(n))), \quad \text{(Equation 9)}$$

for $n = 0, \ldots, N_s - 1$ where $i(L_p(n))$ and $f(L_p(n))$ are the integer and fractional parts of the pitch lag, respectively; $w_s(f,i)$ is the Hamming weighted Sinc window, and $N_s$ is the length of the segment. A weighted target, $s_w^{wt}(n)$, is given by $s_w^{wt}(n)=w_e(n) \cdot s_w^t(n)$. The weighting function, $w_e(n)$, may be a two-piece linear function, which emphasizes the pitch complex and de-emphasizes the "noise" in between pitch complexes. The weighting may be adapted according to the 4-grade classification, by increasing the emphasis on the pitch complex for segments of higher periodicity.

The integer shift that maximizes the normalized cross correlation between the weighted target $s_w^{wt}(n)$ and the weighted speech 344 is $s_w(n+\tau_{acc})$, where $s_w(n+\tau_{acc})$ is the weighted speech 344 shifted according to an accumulated delay $\tau_{acc}$ may be found by maximizing $$R(\tau_{shift}) = \frac{\sum_{n=0}^{N_s-1} s_w^{wt}(n) \cdot s_w(n + \tau_{acc} + \tau_{shift})}{\sqrt{\left(\sum_{n=0}^{N_s-1} s_w^{wt}(n)^2\right) \cdot \left(\sum_{n=0}^{N_s-1} s_w(n + \tau_{acc} + \tau_{shift})^2\right)}} \quad \text{(Equation 10)}$$

A refined (fractional) shift may be determined by searching an upsampled version of $R(\tau_{shift})$ in the vicinity of $\tau_{shift}$. This may result in a final optimal shift $\tau_{opt}$ and the corresponding normalized cross correlation $R_n(\tau_{opt})$.

3.12.1.4 Signal Warping

The modified weighted speech 350 for the segment may be reconstructed according to the mapping given by $$[s_w(n+\tau_{acc}), s_w(n+\tau_{acc}+\tau_c+\tau_{opt})] \rightarrow [s'_w(n), s'_w(n+\tau_c-1)], \quad \text{(Equation 11)}$$

and $$[s_w(n+\tau_{acc}+\tau_c+\tau_{opt}), s_w(n+\tau_{acc}+\tau_{opt}+N_s-1)] \rightarrow [s'_w(n+\tau_c), s'_w(n+N_s-1)] \quad \text{(Equation 12)}$$

where $\tau_c$ is a parameter defining the warping function. In general, $\tau_c$ specifies the beginning of the pitch complex. The mapping given by Equation 11 specifies a time warping, and the mapping given by Equation 12 specifies a time shift (no warping). Both may be carried out using a Hamming weighted Sinc window function.

3.12.2 Pitch Gain and Pitch Correlation Estimation

The pitch gain and pitch correlation may be estimated on a pitch cycle basis and are defined by Equations 11 and 12, respectively. The pitch gain is estimated in order to minimize the mean squared error between the target $s'_w(n)$, defined by Equation 9, and the final modified signal $s'_w(n)$ defined by Equations 11 and 12, and may be given by $$g_a = \frac{\sum_{n=0}^{N_s-1} s'_w(n) \cdot s_w^t(n)}{\sum_{n=0}^{N_s-1} s_w^t(n)^2}. \quad \text{(Equation 13)}$$

The pitch gain is provided to the excitation-processing module 54 as the unquantized pitch gains 352. The pitch correlation may be given by $$R_a = \frac{\sum_{n=0}^{N_s-1} s'_w(n) \cdot s_w^t(n)}{\sqrt{\left(\sum_{n=0}^{N_s-1} s'_w(n)^2\right) \cdot \left(\sum_{n=0}^{N_s-1} s_w^t(n)^2\right)}}. \quad \text{(Equation 14)}$$

Both parameters are available on a pitch cycle basis and may be linearly interpolated.

3.12.3 Refined Classification and Refined Rate Selection

Following pitch pre-processing by the pitch pre-processing module 322, the average pitch correlation and the pitch gains are provided to the characterization module 328 and the rate selection module 320. The characterization module 328 and the rate selection module 320 create a final characterization class and a final rate selection, respectively, using the pitch correlation and the pitch gains. The final characterization class and the final rate selection may be determined by refining the 6-class signal characterization and the open loop rate selection of the frame.

Specifically, the characterization module 328 determines whether a frame with a characterization as a voiced frame should be characterized as class 4—"Non-Stationary Voiced", or class 5—"Stationary Voiced." In addition, a final determination that a particular frame is stationary noise-like unvoiced speech may occur based on the previous determination that the particular frame is modified unvoiced noise-like speech. Frames confirmed to be noise-like unvoiced speech may be characterized as class 1, "Stationary Noise-Like Unvoiced Speech."

Based on the final characterization class, the open loop rate selection by the rate selection module 320 and the half rate signaling flag on the half rate signal line 30 (FIG. 1), a final rate selection may be determined. The final rate selection is provided to the excitation-processing module 54 as a rate selection indicator 354. In addition, the final characterization class for the frame is provided to the excitation-processing module 54 as control information 356.

3.13 Type Classification Module

For the full rate codec 22 and the half rate codec 24, the final characterization class may also be used by the type classification module 324. A frame with a final characterization class of class 0 to 4 is determined to be a Type Zero frame, and a frame of class 5 is determined to be a Type One frame. The type classification is provided to the excitation-processing module 54 as a type indicator 358.

4.0 Excitation Processing Module

Figure 10:
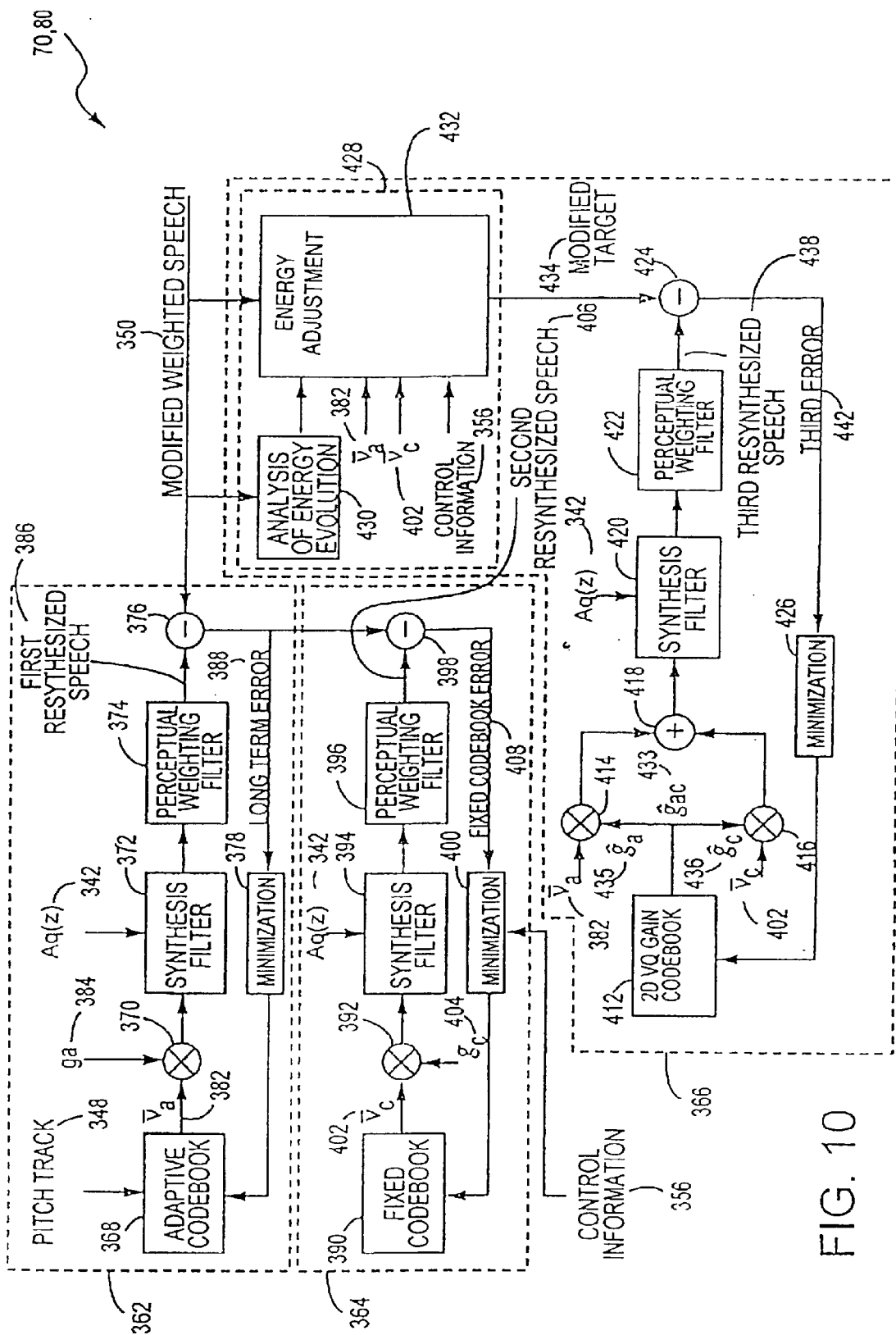
FIG. 10 is an expanded block diagram of one embodiment of the first sub-frame processing module illustrated in FIG. 2 for the full and half-rate codecs.
Figure 11:
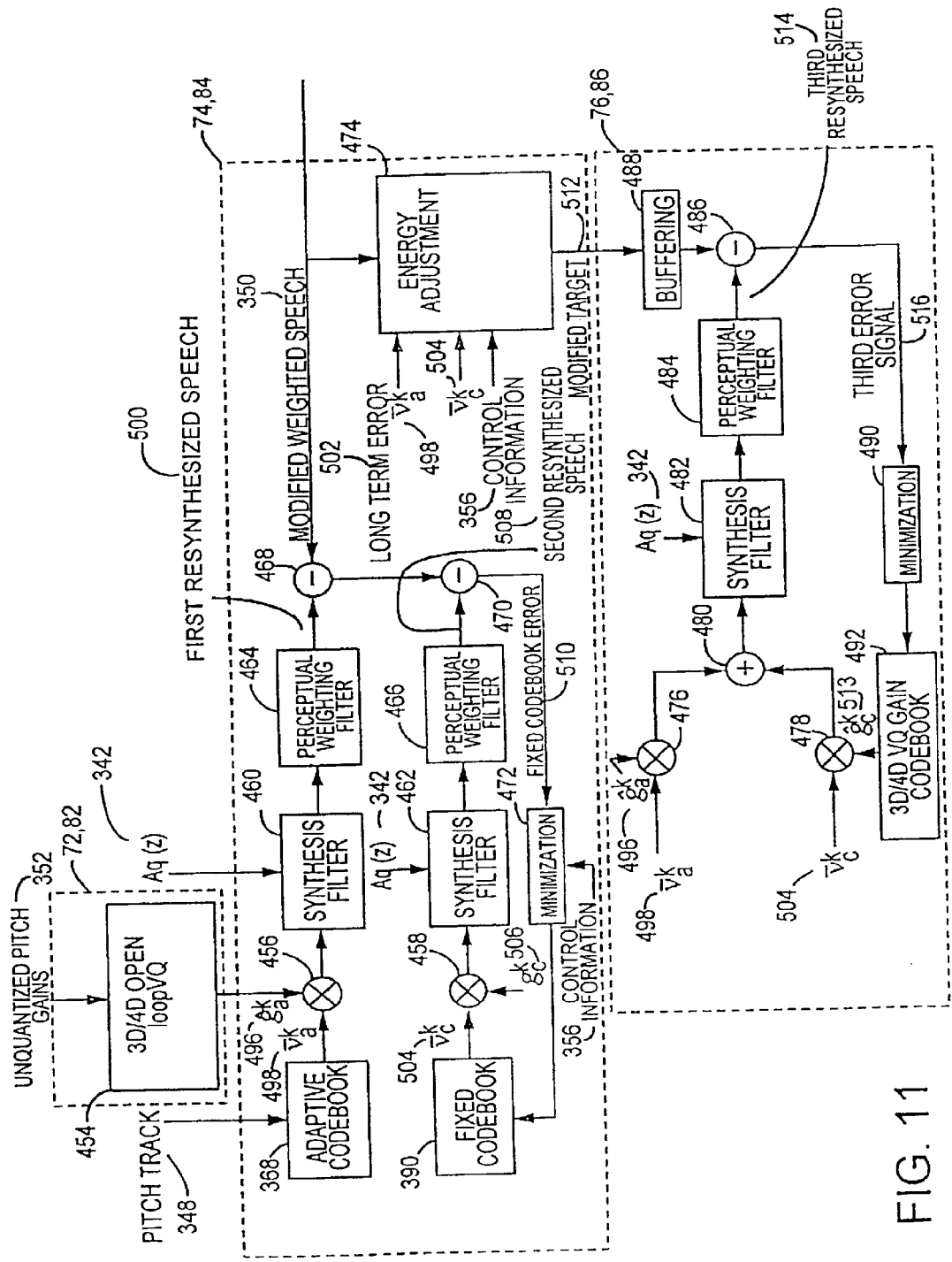
FIG. 11 is an expanded block diagram of one embodiment of the first frame processing module, the second sub-frame processing module and the second frame processing module illustrated in FIG. 2 for the full and half-rate codecs.

The type indicator 358 from the type classification module 324 selectively activates either the full-rate module 54 or the half-rate module 56, as illustrated in FIG. 2, depending on the rate selection. FIG. 10 is a block diagram representing the F0 or H0 first subframe-processing module 70 or 80 illustrated in FIG. 2 that is activated for the Type Zero classification. Similarly, FIG. 11 is a block diagram representing the F1 or H1 first frame processing module 72 or 82, the F1 or H1 second subframe processing module 74 or 84 and the F1 or H1 second frame processing module 76 or 86 that are activated for Type One classification. As previously discussed, the "F" and "H" represent the full-rate codec 22 and the half-rate codec 24, respectively.

Activation of the quarter-rate module 60 and the eighth-rate module 62 illustrated in FIG. 2 may be based on the rate selection. In one embodiment, a pseudo-random sequence is generated and scaled to represent the short-term excitation. The energy component 204 and 242 (FIG. 2) represents the scaling of the pseudo-random sequence, as previously discussed. In one embodiment, the "seed" used for generating the pseudo-random sequence is extracted from the bitstream, thereby providing synchronicity between the encoding system 12 and the decoding system 16.

As previously discussed, the excitation processing module 54 also receives the modified weighted speech 350, the unquantized pitch gains 352, the rate indicator 354 and the control information 356. The quarter and eighth rate codecs 26 and 28 do not utilize these signals during processing. However, these parameters may be used to further process frames of the speech signal 18 within the full-rate codec 22 and the half-rate codec 24. Use of these parameters by the full-rate codec 22 and the half-rate codec 24, as described later, depends on the type classification of the frame as Type Zero or Type One.

4.1 Excitation Processing Module for Type Zero Frames of the Full-rate Codec and the Half-rate Codec Referring now to FIG. 10, one embodiment of the F0 or H0 first subframe-processing module 70, 80 comprises an adaptive codebook section 362, a fixed codebook section 364 and a gain quantization section 366. The processing and coding for frames of Type Zero is somewhat similar to the traditional CELP encoding, for example, of TIA (Telecommunications Industry Association) standard IS-127. For the full-rate codec 22, the frame may be divided into four subframes, while for the half-rate codec 24, the frame may be divided into two subframes, as previously discussed. The functions represented in FIG. 10 are executed on a subframe basis.

The F0 or H0 first subframe-processing module 70 and 80 (FIG. 2) operate to determine the closed loop pitch lag and the corresponding adaptive codebook gain for the adaptive codebook. In addition, the long-term residual is quantized using the fixed codebook, and the corresponding fixed codebook gain is also determined. Quantization of the closed loop pitch lag and joint quantization of the adaptive codebook gain and the fixed codebook gain are also performed.

4.1.1 Adaptive Codebook Section

The adaptive codebook section 362 includes an adaptive codebook 368, a first multiplier 370, a first synthesis filter 372, a first perceptual weighting filter 374, a first subtractor 376 and a first minimization module 378. The adaptive codebook section 362 performs a search for the best closed loop pitch lag from the adaptive codebook 368 using the analysis-by-synthesis (ABS) approach.

A segment from the adaptive codebook 368 corresponding to the closed loop pitch lag may be referred to as an adaptive codebook vector ($v_a$) 382. The pitch track 348 from the pitch pre-processing module 322 of FIG. 9 may be used to identify an area in the adaptive codebook 368 to search for vectors for the adaptive codebook vector ($v_a$) 382. The first multiplier 370 multiplies the selected adaptive codebook vector ($v_a$) 382 by a gain ($g_a$) 384. The gain ($g_a$) 384 is unquantized and represents an initial adaptive codebook gain that is calculated as will be described later. The resulting signal is passed to the first synthesis filter 372 that performs a function that is the inverse of the LPC analysis previously discussed. The first synthesis filter 372 receives the quantized LPC coefficients $A_q(z)$ 342 from the LSF quantization module 334 and together with the first perceptual weighting filter module 374, creates a first resynthesized speech signal 386. The first subtractor 376 subtracts the first resynthesized speech signal 386 from the modified weighted speech 350 to generate a long-term error signal 388. The modified weighted speech 350 is the target signal for the search in the adaptive codebook 368.

The first minimization module 378 receives the long-term error signal 388 that is a vector representing the error in quantizing the closed loop pitch lag. The first minimization module 378 performs calculation of the energy of the vector and determination of the corresponding weighted mean squared error. In addition, the first minimization module 378 controls the search and selection of vectors from the adaptive codebook 368 for the adaptive codebook vector ($v_a$) 382 in order to reduce the energy of the long-term error signal 388.

The search process repeats until the first minimization module 378 has selected the best vector for the adaptive codebook vector ($v_a$) 382 from the adaptive codebook 368 for each subframe. The index location of the best vector for the adaptive codebook vector ($v_a$) 382 within the adaptive codebook 368 forms part of the closed loop adaptive codebook component 144b, 176b (FIG. 2). This search process effectively minimizes the energy of the long-term error signal 388. The best closed loop pitch lag is selected by selecting the best adaptive codebook vector ($v_a$) 382 from the adaptive codebook 368. The resulting long-term error signal 388 is the modified weighted speech signal 350 less the filtered best vector for the adaptive codebook vector ($v_a$) 382.

4.1.1.1 Closed-loop Adaptive Codebook Search for the Full-rate Codec

The closed loop pitch lag for the full-rate codec 22 is represented in the bitstream by the closed loop adaptive codebook component 144b. For one embodiment of the full-rate codec 22, the closed loop pitch lags for the first and the third subframes are represented with 8 bits, and the closed loop pitch lags for the second and the fourth subframes are represented with 5 bits, as previously discussed. In one embodiment, the lag is in a range of 17 to 148 lags.

The 8 bits and the 5 bits may represent the same pitch resolution. However, the 8 bits may also represent the full range of the closed loop pitch lag for a subframe and the 5 bits may represent a limited value of closed loop pitch lags around the previous subframe closed loop pitch lag. In an example embodiment, the closed loop pitch lag resolution is 0.2, uniformly, between lag 17 and lag 33. From lag 33 to lag 91 of the example embodiment, the resolution is gradually increased from 0.2 to 0.5, and the resolution from lag 91 to lag 148 is 1.0, uniformly.

The adaptive codebook section 362 performs an integer lag search for closed loop integer pitch lags. For the first and the third subframes (i.e. those represented with 8 bits), the integer lag search may be performed on the range of $[L_p-3, \ldots, L_p+3]$. Where $L_p$ is the subframe pitch lag. The subframe pitch lag is obtained from the pitch track 348, which is used to identify a vector in the adaptive codebook 368. The cross-correlation function, R(l), for the integer lag search range may be calculated according to $$R(l) = \frac{\sum_{n=0}^{39} t(n) \cdot (e(n-l) * h(n))}{\sqrt{\sum_{n=0}^{39} (e(n-l) * h(n))^2}},$$ (Equation 15)

where t(n) is the target signal that is the modified weighted speech 350, e(n) is the adaptive codebook contribution represented by the adaptive codebook vector ($v_a$) 382, h(n) is the combined response of the first synthesis filter 372 and the perceptual weighting filter 374. In the example embodiment, there are 40 samples in a subframe, although more or less samples could be used.

The closed loop integer pitch lag that maximizes R(l) may be chosen as a refined integer lag. The best vector from the adaptive codebook 368 for the adaptive codebook vector ($v_a$) 382 may be determined by upsampling the cross-correlation function R(l) using a $9^{th}$ order Hamming weighted Sinc. Upsampling is followed by a search of the vectors within the adaptive codebook 368 that correspond to closed loop pitch lags that are within 1 sample of the refined integer lag. The index location within the adaptive codebook 368 of the best vector for the adaptive codebook vector ($v_a$) 382 for each subframe is represented by the closed loop adaptive codebook component 144b in the bitstream.

The initial adaptive codebook gain may be estimated according to:

$$g = \frac{\sum_{n=0}^{39} t(n) \cdot (e(n-L_p^{opt}) * h(n))}{\sum_{n=0}^{39} (e(n-L_p^{opt}) * h(n))^2},$$ (Equation 16)

where $L_p^{opt}$ represents the lag of the best vector for the adaptive codebook vector ($v_a$) 382 and $e(n-L_p^{opt})$ represents the best vector for the adaptive codebook vector ($v_a$) 382. In addition, in this example embodiment, the estimate is bounded by $0.0 \leq g \leq 1.2$, and n represents 40 samples in a subframe. A normalized adaptive codebook correlation is given by R(l) when $l=L_p^{opt}$. The initial adaptive codebook gain may be further normalized according to the normalized adaptive codebook correlation, the initial class decision and the sharpness of the adaptive codebook contribution. The normalization results in the gain ($g_a$) 384. The gain ($g_a$) 384 is unquantized and represents the initial adaptive codebook gain for the closed loop pitch lag.

4.1.1.2 Closed-loop Adaptive Codebook Search for Half-rate Coding

The closed loop pitch lag for the half-rate codec 24 is represented by the closed loop adaptive codebook component 176b (FIG. 2). For the half-rate codec 24 of one embodiment, the closed loop pitch lags for each of the two subframes are encoded in 7 bits each with each representing a lag in the range of 17 to 127 lags. The integer lag search may be performed on the range of $[L_p-3, \ldots, L_p+3]$ as opposed to the fractional search performed in the full-rate codec 22. The cross-correlation function R(l) may be calculated as in Equation 15, where the summation is performed on an example embodiment subframe size of 80 samples. The closed loop pitch lag that maximizes R(l) is chosen as the refined integer lag. The index location within the adaptive codebook 368 of the best vector for the adaptive codebook vector ($v_a$) 382 for each subframe is represented by the closed loop adaptive codebook component 176b in the bitstream.

The initial value for the adaptive codebook gain may be calculated according to Equation 16, where the summation is performed on an example embodiment subframe size of 80 samples. The normalization procedures as previously discussed may then be applied resulting in the gain ($g_a$) 384 that is unquantized.

The long-term error signal 388 generated by either the full-rate codec 22 or the half-rate codec 24 is used during the search by the fixed codebook section 364. Prior to the fixed codebook search, the voice activity decision from the VAD module 326 of FIG. 9 that is applicable to the frame is obtained. The voice activity decision for the frame may be sub-divided into a subframe voice activity decision for each subframe. The subframe voice activity decision may be used to improve perceptual selection of the fixed-codebook contribution.

4.1.2 Fixed Codebook Section

The fixed codebook section 364 includes a fixed codebook 390, a second multiplier 392, a second synthesis filter 394, a second perceptual weighting filter 396, a second subtractor 398, and a second minimization module 400. The search for the fixed codebook contribution by the fixed codebook section 364 is similar to the search within the adaptive codebook section 362.

A fixed codebook vector ($v_c$) 402 representing the long-term residual for a subframe is provided from the fixed codebook 390. The second multiplier 392 multiplies the fixed codebook vector ($v_c$) 402 by a gain ($g_c$) 404. The gain ($g_c$) 404 is unquantized and is a representation of the initial value of the fixed codebook gain that may be calculated as later described. The resulting signal is provided to the second synthesis filter 394. The second synthesis filter 394 receives the quantized LPC coefficients $A_q(z)$ 342 from the LSF quantization module 334 and together with the second perceptual weighting filter 396, creates a second resynthesized speech signal 406. The second subtractor 398 subtracts the resynthesized speech signal 406 from the long-term error signal 388 to generate a vector that is a fixed codebook error signal 408.

The second minimization module 400 receives the fixed codebook error signal 408 that represents the error in quantizing the long-term residual by the fixed codebook 390. The second minimization module 400 uses the energy of the fixed codebook error signal 408 to control the selection of vectors for the fixed codebook vector ($v_c$) 402 from the fixed codebook 292 in order to reduce the energy of the fixed codebook error signal 408. The second minimization module 400 also receives the control information 356 from the characterization module 328 of FIG. 9.

The final characterization class contained in the control information 356 controls how the second minimization module 400 selects vectors for the fixed codebook vector ($v_c$) 402 from the fixed codebook 390. The process repeats until the search by the second minimization module 400 has selected the best vector for the fixed codebook vector ($v_c$) 402 from the fixed codebook 390 for each subframe. The best vector for the fixed codebook vector ($v_c$) 402 minimizes the error in the second resynthesized speech signal 406 with respect to the long-term error signal 388. The indices identify the best vector for the fixed codebook vector ($v_c$) 402 and, as previously discussed, may be used to form the fixed codebook component 146a and 178a.

4.1.2.1 Fixed Codebook Search for the Full-rate Codec

As previously discussed with reference to FIGS. 2 and 4, the fixed codebook component 146a for frames of Type Zero classification may represent each of four subframes of the full-rate codec 22 using the three 5-pulse codebooks 160. When the search is initiated, vectors for the fixed codebook vector ($v_c$) 402 within the fixed codebook 390 may be determined using the long-term error signal 388 that is represented by:

$$t'(n)=t(n)-g_a \cdot (e(n-L_p^{opt})*h(n)). \quad \text{(Equation 17)}$$

Pitch enhancement may be applied to the three 5-pulse codebooks 160 (illustrated in FIG. 4) within the fixed codebook 390 in the forward direction during the search. The search is an iterative, controlled complexity search for the best vector for the fixed codebook vector ($v_c$) 402. An initial value for fixed codebook gain represented by the gain ($g_c$) 404 may be found simultaneously with the search for the best vector for the fixed codebook vector ($v_c$) 402.

In an example embodiment, the search for the best vector for the fixed codebook vector ($v_c$) 402 is completed in each of the three 5-pulse codebooks 160. At the conclusion of the search process within each of the three 5-pulse codebooks 160, candidate best vectors for the fixed codebook vector ($v_c$) 402 have been identified. Selection of one of the three 5-pulse codebooks 160 and which of the corresponding candidate best vectors will be used may be determined using the corresponding fixed codebook error signal 408 for each of the candidate best vectors. Determination of the weighted mean squared error (WMSE) for each of the corresponding fixed codebook error signals 408 by the second minimization module 400 is first performed. For purposes of this discussion, the weighted mean squared errors (WMSEs) for each of the candidate best vectors from each of the three 5-pulse codebooks 160 will be referred to as first, second and third fixed codebook WMSEs.

The first, second, and third fixed codebook WMSEs may be first weighted. Within the full-rate codec 22, for frames classified as Type Zero, the first, second, and third fixed codebook WMSEs may be weighted by the subframe voice activity decision. In addition, the weighting may be provided by a sharpness measure of each of the first, second, and third fixed codebook WMSEs and the NSR from the characterization module 328 of FIG. 9. Based on the weighting, one of the three 5-pulse fixed codebooks 160 and the best candidate vector in that codebook may be selected.

The selected 5-pulse codebook 160 may then be fine searched for a final decision of the best vector for the fixed codebook vector ($v_c$) 402. The fine search is performed on the vectors in the selected one of the three 5-pulse codebook 160 that are in the vicinity of the best candidate vector chosen. The indices that identify the best vector for the fixed codebook vector ($v_c$) 402 within the selected one of the three 5-pulse codebook 160 are part of the fixed codebook component 178a in the bitstream.

4.1.2.2 Fixed Codebook Search for the Half-rate Codec

For frames of Type Zero classification, the fixed codebook component 178a represents each of the two subframes of the half-rate codec 24. As previously discussed, with reference to FIG. 5, the representation may be based on the pulse codebooks 192, 194 and the Gaussian codebook 195. The initial target for the fixed codebook gain represented by the gain ($g_c$) 404 may be determined similarly to the full-rate codec 22. In addition, the search for the fixed codebook vector ($v_c$) 402 within the fixed codebook 390 may be weighted similarly to the full-rate codec 22. In the half-rate codec 24, the weighting may be applied to the best candidate vectors from each of the pulse codebooks 192 and 194 as well as the Gaussian codebook 195. The weighting is applied to determine the most suitable fixed codebook vector ($v_c$) 402 from a perceptual point of view. In addition, the weighting of the weighted mean squared error (WMSE) in the half-rate codec 24 may be further enhanced to emphasize the perceptual point of view. Further enhancement may be accomplished by including-additional parameters in the weighting. The additional factors may be the closed loop pitch lag and the normalized adaptive codebook correlation.

In addition to the enhanced weighting, prior to the search of the codebooks 192, 194, 195 for the best candidate vectors, some characteristics may be built into the entries of the pulse codebooks 192, 194. These characteristics can provide further enhancement to the perceptual quality. In one embodiment, enhanced perceptual quality during the searches may be achieved by modifying the filter response of the second synthesis filter 394 using three enhancements. The first enhancement may be accomplished by injecting high frequency noise into the fixed codebook, which modifies the high-frequency band. The injection of high frequency noise may be incorporated into the response of the second synthesis filter 394 by convolving the high frequency noise impulse response with the impulse response of the second synthesis filter 394.

The second enhancement may be used to incorporate additional pulses in locations that can be determined by high correlations in the previously quantized subframe. The amplitude of the additional pulses may be adjusted according to the correlation strength, thereby allowing the decoding system 16 to perform the same operation without the necessity of additional information from the encoding system 12. The contribution from these additional pulses also may be incorporated into the impulse response of the second synthesis filter 394. The third enhancement filters the fixed codebook 390 with a weak short-term spectral filter to compensate for the reduction in the formant sharpness resulting from bandwidth expansion and the quantization of the LSFs.

The search for the best vector for the fixed codebook vector ($v_c$) 402 is based on minimizing the energy of the fixed codebook error signal 408, as previously discussed. The search may first be performed on the 2-pulse codebook 192. The 3-pulse codebook 194 may be searched next, in two steps. The first step can determine a center for the second step that may be referred to as a focused search. Backward and forward weighted pitch enhancement may be applied for the search in both pulse codebooks 192 and 194. The Gaussian codebook 195 may be searched last, using a fast search routine that is used to determine the two orthogonal basis vectors for encoding as previously discussed.

The selection of one of the codebooks 192, 194 and 195 and the best vector for the fixed codebook vector ($v_c$) 402 may be performed similarly to the full-rate codec 22. The indices that identify the best vector for the fixed codebook vector ($v_c$) 402 within the selected codebook are part of the fixed codebook component 178a in the bitstream.

At this point, the best vectors for the adaptive codebook vector ($v_a$) 382 and the fixed codebook vector ($v_c$) 402 have been found within the adaptive and fixed codebooks 368, 390, respectively. The unquantized initial values for the gain ($g_a$) 384 and the gain ($g_c$) 404 now may be replaced by the best gain values. The best gain values may be determined based on the best vectors for the adaptive codebook vector ($v_a$) 382 and the fixed codebook vector ($v_c$) 402 previously determined. Following determination of the best gains, they are jointly quantized. Determination and quantization of the gains occurs within the gain quantization section 366.

4.1.3 Gain Quantization Section

The gain quantization section 366 of one embodiment includes a 2D VQ gain codebook 412, a third multiplier 414, a fourth multiplier 416, an adder 418, a third synthesis filter 420, a third perceptual weighting filter 422, a third subtractor 424, a third minimization module 426, and an energy modification section 428. The energy modification section 428 of one embodiment includes an energy analysis module 430 and an energy adjustment module 432. Determination and quantization of the fixed and adaptive codebook gains may be performed within the gain quantization section 366. In addition, further modification of the modified weighted speech 350 occurs in the energy modification section 428, as will be discussed, to form a modified target signal 434 that may be used for the quantization.

Determination and quantization involves searching to determine a quantized gain vector ($\hat{g}_{ac}$) 433 that represents the joint quantization of the adaptive codebook gain and the fixed codebook gain. The adaptive and fixed codebook gains, for the search, may be obtained by minimizing the weighted mean square error according to:

$$\{g_a, g_c\} = \arg\min\left\{\sum_{n=0}^{79}(t(n) - ((g_a v_a(n) * h(n)) + (g_c v_c(n) * h(n))))^2\right\}. \quad \text{(Equation 18)}$$

Where $v_a(n)$ is the best vector for the adaptive codebook vector ($v_a$) 382, and $v_c(n)$ is the best vector for the fixed codebook vector ($v_c$) 402 as previously discussed. In the example embodiment, the summation is based on a frame that contains 80 samples, such as, in one embodiment of the half-rate codec 24. The minimization may be obtained jointly (obtaining $g_a$ and $g_c$ concurrently) or sequentially (obtaining $g_a$ first and then $g_c$), depending on a threshold value of the normalized adaptive codebook correlation. The gains may then be modified in part, to smooth the fluctuations of the reconstructed speech in the presence of background noise. The modified gains are denoted $g'_a$ and $g'_c$. The modified target signal 434 may be generated using the modified gains by:

$$t''(n) = g'_a v_a(n) * h(n) + g'_c v_c(n) * h(n) \quad \text{(Equation 19)}$$

A search for the best vector for the quantized gain vector ($\hat{g}_{ac}$) 433 is performed within the 2D VQ gain codebook 412. The 2D VQ gain codebook 412 may be the previously discussed 2D gain quantization table illustrated as Table 4. The 2D VQ gain codebook 412 is searched for vectors for the quantized gain vector ($\hat{g}_{ac}$) 433 that minimize the mean square error, i.e., minimizing $$E = \sum_{n=0}^{79}(t''(n) - (\hat{g}_a v_a(n) * h(n) + \hat{g}_c v_c(n) * h(n)))^2, \quad \text{(Equation 20)}$$

where a quantized fixed codebook gain ($\hat{g}_a$) 435 and a quantized adaptive codebook gain ($\hat{g}_c$) 436 may be derived from the 2D VQ gain codebook 412. In the example embodiment, the summation is based on a frame that contains 80 samples, such as, in one embodiment of the half-rate codec 24. The quantized vectors in the 2D VQ gain codebook 412 actually represent the adaptive codebook gain and a correction factor for the fixed codebook gain as previously discussed.

Following determination of the modified target signal 434, the quantized gain vector ($\hat{g}_{ac}$) 433 is passed to multipliers 414, 416. The third multiplier 414 multiplies the best vector for the adaptive codebook vector ($v_a$) 382 from the adaptive codebook 368 with the quantized adaptive codebook gain ($\hat{g}_a$) 435. The output from the third multiplier 414 is provided to the adder 418. Similarly, the fourth multiplier 416 multiplies the quantized fixed codebook gain ($\hat{g}_c$) 436 with the best vector for the fixed codebook vector ($v_c$) 402 from the fixed codebook 390. The output from the fourth multiplier 416 is also provided to the adder 418. The adder 418 adds the outputs from the multipliers 414, 416 and provides the resulting signal to the third synthesis filter 420.

The combination of the third synthesis filter 420 and the perceptual weighting filter 422 generates a third resynthesized speech signal 438. As with the first and second synthesis filters 372 and 394, the third synthesis filter 420 receives the quantized LPC coefficients $A_q(z)$ 342. The third subtractor 424 subtracts the third resynthesized speech signal 438 from the modified target signal 434 to generate a third error signal 442. The third minimization module 426 receives the third error signal 442 that represents the error resulting from joint quantization of the fixed codebook gain and the adaptive codebook gain by the 2D VQ gain codebook 412. The third minimization module 426 uses the energy of the third error signal 442 to control the search and selection of vectors from the 2D VQ gain codebook 412 in order to reduce the energy of the third error signal 442.

The process repeats until the third minimization module 426 has selected the best vector from the 2D VQ gain codebook 412 for each subframe that minimizes the energy of the third error signal 442. Once the energy of the third error signal 442 has been minimized for each subframe, the index locations of the jointly quantized gains ($\hat{g}_a$) and ($\hat{g}_c$) 435 and 436 are used to generate the gain component 147, 179 for the frame. For the full-rate codec 22, the gain component 147 is the fixed and adaptive gain component 148a, 150a and for the half-rate codec 24, the gain component 179 is the adaptive and fixed gain component 180a and 182a.

The synthesis filters 372, 394 and 420, the perceptual weighting filters 374, 396 and 422, the minimization modules 378, 400 and 426, the multipliers 370, 392, 414 and 416, the adder 418, and the subtractors 376, 398 and 424 (as well as any other filter, minimization module, multiplier, adder, and subtractor described in this application) may be replaced by any other device, or modified in a manner known to those of ordinary skill in the art, that may be appropriate for the particular application.

4.2 Excitation Processing Module for Type One Frames of the Full-rate Codec and the Half-Rate Codec In FIG. 11, the F1, H1 first frame processing modules 72 and 82 includes a 3D/4D open loop VQ module 454. The F1, H1 second sub-frame processing modules 74 and 84 of one embodiment include the adaptive codebook 368, the fixed codebook 390, a first multiplier 456, a second multiplier 458, a first synthesis filter 460, and a second synthesis filter 462. In addition, the F1, H1 second sub-frame processing modules 74 and 84 include a first perceptual weighting filter 464, a second perceptual weighting filter 466, a first subtractor 468, a second subtractor 470, a first minimization module 472, and an energy adjustment module 474. The F1, H1 second frame processing modules 76 and 86 include a third multiplier 476, a fourth multiplier 478, an adder 480, a third synthesis filter 482, a third perceptual weighting filter 484, a third subtractor 486, a buffering module 488, a second minimization module 490 and a 3D/4D VQ gain codebook 492.

The processing of frames classified as Type One within the excitation-processing module 54 provides processing on both a frame basis and a sub-frame basis, as previously discussed. For purposes of brevity, the following discussion will refer to the modules within the full rate codec 22. The modules in the half rate codec 24 may be considered to function similarly, unless otherwise noted. Quantization of the adaptive codebook gain by the F1 first frame-processing module 72 generates the adaptive gain component 148b. The F1 second subframe processing module 74 and the F1 second frame processing module 76 operate to determine the fixed codebook vector and the corresponding fixed codebook gain, respectively as previously set forth. The F1 second subframe-processing module 74 uses the track tables, as previously discussed, to generate the fixed codebook component 146b as illustrated in FIG. 2.

The F1 second frame-processing module 76 quantizes the fixed codebook gain to generate the fixed gain component 150b. In one embodiment, the full-rate codec 22 uses 10 bits for the quantization of 4 fixed codebook gains, and the half-rate codec 24 uses 8 bits for the quantization of the 3 fixed codebook gains. The quantization may be performed using moving average prediction. In general, before the prediction and the quantization are performed, the prediction states are converted to a suitable dimension.

4.2.1 First Frame Processing Module

One embodiment of the 3D/4D open loop VQ module 454 may be the previously discussed four-dimensional pre vector quantizer (4D pre VQ) 166 and associated pre-gain quantization table for the full-rate codec 22. Another embodiment of the 3D/4D open loop VQ module 454 may be the previously discussed three-dimensional pre vector quantizer (3D pre VQ) 198 and associated pre-gain quantization table for the half-rate codec 24. The 3D/4D open loop VQ module 454 receives the unquantized pitch gains 352 from the pitch pre-processing module 322. The unquantized pitch gains 352 represent the adaptive codebook gain for the open loop pitch lag, as previously discussed.

The 3D/4D open loop VQ module 454 quantizes the unquantized pitch gains 352 to generate a quantized pitch gain $(\hat{g}^k_a)$ 496 representing the best quantized pitch gains for each subframe where k is the number of subframes. In one embodiment, there are four subframes for the full-rate codec 22 and three subframes for the half-rate codec 24 which correspond to four quantized gains $(\hat{g}^1_a, \hat{g}^2_a, \hat{g}^3_a, \hat{g}^4_a)$ and three quantized gains $(\hat{g}^1_a, \hat{g}^2_a, \hat{g}^3_a)$ of each subframe, respectively. The index location of the quantized pitch gain $(\hat{g}^k_a)$ 496 within the pre-gain quantization table represents the adaptive gain component 148b for the full-rate codec 22 or the adaptive gain component 180b for the half-rate codec 24. The quantized pitch gain $(\hat{g}^k_a)$ 496 is provided to the F1 second subframe-processing module 74 or the H1 second subframe-processing module 84.

4.2.2 Second Sub-rame Processing Module

The F1 or H1 second subframe-processing module 74 or 84 uses the pitch track 348 provided by the pitch pre-processing module 322 to identify an adaptive codebook vector $(v^k_a)$ 498. The adaptive codebook vector $(v^k_a)$ 498 represents the adaptive codebook contribution for each subframe where k equals the subframe number. In one embodiment, there are four subframes for the full-rate codec 22 and three subframes for the half-rate codec 24 which correspond to four vectors $(v^1_a, v^2_a, v^3_a, v^4_a)$ and three vectors $(v^1_a, v^2_a, v^3_a)$ for the adaptive codebook contribution for each subframe, respectively.

The vector selected for the adaptive codebook vector $(v^k_a)$ 498 may be derived from past vectors located in the adaptive codebook 368 and the pitch track 348. Where the pitch track 348 may be interpolated and is represented by $L_p(n)$.

Accordingly, no search is required. The adaptive codebook vector $(v^k_a)$ 498 may be obtained by interpolating the past adaptive codebook vectors $(v^k_a)$ 498 in the adaptive codebook with a $21^{st}$ order Hamming weighted Sinc window by:

$$v_a(n) = \sum_{i=-10}^{10} w_s(f(L_p(n)), i) \cdot e(n - i(L_p(n)), \quad \text{(Equation 21)}$$

where e(n) is the past excitation, $i(L_p(n))$ and $f(L_p(n))$ are the integer and fractional part of the pitch lag, respectively, and $w_s(f,i)$ is the Hamming weighted Sinc window.

The adaptive codebook vector $(v^k_a)$ 498 and the quantized pitch gain $(\hat{g}^k_a)$ 496 are multiplied by the first multiplier 456. The first multiplier 456 generates a signal that is processed by the first synthesis filter 460 and the first perceptual weighting filter module 464 to provide a first resynthesized speech signal 500. The first synthesis filter 460 receives the quantized LPC coefficients $A_q(z)$ 342 from the LSF quantization module 334 as part of the processing. The first subtractor 468 subtracts the first resynthesized speech signal 500 from the modified weighted speech 350 provided by the pitch pre-processing module 322 to generate a long-term error signal 502.

The F1 or H1 second subframe-processing module 74 or 84 also performs a search for the fixed codebook contribution that is similar to that performed by the F0 or H0 first subframe-processing module 70 and 80, previously discussed. Vectors for a fixed codebook vector $(v^k_c)$ 504 that represents the long-term residual for a subframe are selected from the fixed codebook 390 during the search. The second multiplier 458 multiplies the fixed codebook vector $(v^k_c)$ 504 by a gain $(g^k_c)$ 506 where k is the subframe number. The gain $(g^k_c)$ 506 is unquantized and represents the fixed codebook gain for each subframe. The resulting signal is processed by the second synthesis filter 462 and the second perceptual weighting filter 466 to generate a second resynthesized speech signal 508. The second resynthesized speech signal 508 is subtracted from the long-term error signal 502 by the second subtractor 470 to produce a fixed codebook error signal 510.

The fixed codebook error signal 510 is received by the first minimization module 472 along with the control information 356. The first minimization module 472 operates the same as the previously discussed second minimization module 400 illustrated in FIG. 10. The search process repeats until the first minimization module 472 has selected the best vector for the fixed codebook vector $(v^k_c)$ 504 from the fixed codebook 390 for each subframe. The best vector for the fixed codebook vector $(v^k_c)$ 504 minimizes the energy of the fixed codebook error signal 510. The indices identify the best vector for the fixed codebook vector ($v^k_c$) 504, as previously discussed, and form the fixed codebook component 146b and 178b.

4.2.2.1 Fixed Codebook Search for Full-rate Codec

In one embodiment, the 8-pulse codebook 162, illustrated in FIG. 4, is used for each of the four subframes for frames of type 1 by the full-rate codec 22, as previously discussed. The target for the fixed codebook vector ($v^k_c$) 504 is the long-term error signal 502, as previously described. The long-term error signal 502, represented by t'(n), is determined based on the modified weighted speech 350, represented by t(n), with the adaptive codebook contribution from the initial frame processing module 44 removed according to:

$$t'(n)=t(n)-g_a\cdot(v_a(n)*h(n)). \quad \text{(Equation 22)}$$

During the search for the best vector for the fixed codebook vector ($v^k_c$) 504, pitch enhancement may be applied in the forward direction. In addition, the search procedure minimizes the fixed codebook residual 508 using an iterative search procedure with controlled complexity to determine the best vector for the fixed codebook vector $v^k_c$ 504. An initial fixed codebook gain represented by the gain ($g^k_c$) 506 is determined during the search. The indices identify the best vector for the fixed codebook vector ($v^k_c$) 504 and form the fixed codebook component 146b as previously discussed.

4.2.2.2 Fixed Codebook Search for Half-rate Codec

In one embodiment, the long-term residual is represented with 13 bits for each of the three subframes for frames classified as Type One for the half-rate codec 24, as previously discussed. The long-term residual may be determined in a similar manner to the fixed codebook search in the full-rate codec 22. Similar to the fixed-codebook search for the half-rate codec 24 for frames of Type Zero, the high-frequency noise injection, the additional pulses that are determined by high correlation in the previous subframe, and the weak short-term spectral filter may be introduced into the impulse response of the second synthesis filter 462. In addition, forward pitch enhancement also may be introduced into the impulse response of the second synthesis filter 462.

In one embodiment, a full search is performed for the 2-pulse code book 196 and the 3-pulse codebook 197 as illustrated in FIG. 5. The pulse codebook 196, 197 and the best vector for the fixed codebook vector ($v^k_c$) 504 that minimizes the fixed codebook error signal 510 are selected for the representation of the long term residual for each subframe. In addition, an initial fixed codebook gain represented by the gain ($g^k_c$) 506 may be determined during the search similar to the full-rate codec 22. The indices identify the best vector for the fixed codebook vector ($v^k_c$) 504 and form the fixed codebook component 178b.

As previously discussed, the F1 or H1 second subframe-processing module 74 or 84 operates on a subframe basis. However, the F1 or H1 second frame-processing module 76 or 86 operates on a frame basis. Accordingly, parameters determined by the F1 or H1 second subframe-processing module 74 or 84 may be stored in the buffering module 488 for later use on a frame basis. In one embodiment, the parameters stored are the best vector for the adaptive codebook vector ($v^k_a$) 498 and the best vector for the fixed codebook vector ($v^k_c$) 504. In addition, a modified target signal 512 and the gains ($\hat{g}^k_a$), ($\hat{g}^k_c$) 496 and 506 representing the initial adaptive and fixed codebook gains may be stored. Generation of the modified target signal 512 will be described later.

At this time, the best vector for the adaptive codebook vector ($v^k_a$) 498, the best vector for the fixed codebook vector ($v^k_c$) 504, and the best pitch gains for the quantized pitch gain ($\hat{g}^k_a$) 496 have been identified. Using these best vectors and best pitch gains, the best fixed codebook gains for the gain ($g^k_c$) 506 will be determined. The best fixed codebook gains for the gain ($g^k_c$) 506 will replace the unquantized initial fixed codebook gains determined previously for the gain ($g^k_c$) 506. To determine the best fixed codebook gains, a joint delayed quantization of the fixed-codebook gains for each subframe is performed by the second frame-processing module 76 and 86.

4.2.3 Second Frame Processing Module

The second frame processing module 76 and 86 is operable on a frame basis to generate the fixed codebook gain represented by the fixed gain component 150b and 182b. The modified target 512 is first determined in a manner similar to the gain determination and quantization of the frames classified as Type Zero. The modified target 512 is determined for each subframe and is represented by t"(n). The modified target may be derived using the best vectors for the adaptive codebook vector ($v^k_a$) 498 and the fixed codebook vector ($v^k_c$) 504, as well as the adaptive codebook gain and the initial value of the fixed codebook gain derived from Equation 18 by:

$$t''(n)=g_a v_a(n)*h(n)+g_c v_c(n)*h(n). \quad \text{(Equation 23)}$$

An initial value for the fixed codebook gain for each subframe to be used in the search may be obtained by minimizing:

$$\{g_c\} = \arg\min\left\{\sum_{n=0}^{N-1}(t(n)-((\hat{g}_a v_a(n)*h(n))+(g_c v_c(n)*h(n))))^2\right\}. \quad \text{(Equation 24)}$$

Where $v_a(n)$ is the adaptive-codebook contribution for a particular subframe and $v_c(n)$ is the fixed-codebook contribution for a particular subframe. In addition, $\hat{g}_a$ is the quantized and normalized adaptive-codebook gain for a particular subframe that is one of the elements a quantized fixed codebook gain ($\hat{g}^k_c$) 513. The calculated fixed codebook gain $g_c$ is further normalized and corrected, to provide the best energy match between the third resynthesized speech signal and the modified target signal 512 that has been buffered. Unquantized fixed-codebook gains from the previous subframes may be used to generate the adaptive codebook vector ($v^k_a$) 498 for the processing of the next subframe according to Equation 21.

The search for vectors for the quantized fixed codebook gain ($\hat{g}^k_c$) 513 is performed within the 3D/4D VQ gain codebook 492. The 3D/4D VQ gain codebook 492 may be the previously discussed multi-dimensional gain quantizer and associated gain quantization table. In one embodiment, the 3D/4D VQ gain codebook 492 may be the previously discussed 4D delayed VQ gain quantizer 168 for the full-rate codec 22. As previously discussed, the 4D delayed VQ gain quantizer 168 may be operable using the associated delayed gain quantization table illustrated as Table 5. In another embodiment, the 3D/4D VQ gain codebook 492 may be the previously discussed 3D delayed VQ gain quantizer 200 for the half-rate codec 24. The 3D delayed VQ gain quantizer 200 may be operable using the delayed gain quantization table illustrated as the previously discussed Table 8.

The 3D/4D VQ gain codebook 492 may be searched for vectors for the quantized fixed codebook gain ($\hat{g}^k_c$) 513 that minimize the energy similar to the previously discussed 2D VQ gain codebook 412 of FIG. 10. The quantized vectors in the 3D/4D VQ gain codebook 492 actually represent a correction factor for the predicted fixed codebook gain as previously discussed. During the search, the third multiplier 476 multiplies the adaptive codebook vector ($v^k{}_a$) 498 by the quantized pitch gain ($\hat{g}^k{}_a$) 496 following determination of the modified target 512. In addition, the fourth multiplier 478 multiplies the fixed codebook vector ($v^k{}_c$) 504 by the quantized fixed codebook gain ($\hat{g}^k{}_c$) 513. The adder 480 adds the resulting signals from the multipliers 476 and 478.

The resulting signal from the adder 480 is passed through the third synthesis filter 482 and the perceptual weighting filter module 484 to generate a third resynthesized speech signal 514. As with the first and second synthesis filters 460, 462, the third synthesis filter 482 receives the quantized LPC coefficients $A_q(z)$ 342 from the LSF quantization module 334 as part of the processing. The third subtractor 486 subtracts the third resynthesized speech signal 514 from the modified target signal 512 that was previously stored in the buffering module 488. The resulting signal is the weighted mean squared error referred to as a third error signal 516.

The third minimization module 490 receives the third error signal 516 that represents the error resulting from quantization of the fixed codebook gain by the 3D/4D VQ gain codebook 492. The third minimization module 490 uses the third error signal 516 to control the search and selection of vectors from the 3D/4D VQ gain codebook 492 in order to reduce the energy of the third error signal 516. The search process repeats until the third minimization module 490 has selected the best vector from the 3D/4D VQ gain codebook 492 for each subframe that minimizes the error in the third error signal 516. Once the energy of the third error signal 516 has been minimized, the index location of the quantized fixed codebook gain ($\hat{g}^k{}_c$) 513 in the 3D/4D VQ gain codebook 492 is used to generate the fixed codebook gain component 150b for the full-rate codec 22, and the fixed codebook gain component 182b for the half-rate codec 24.

4.2.3.1 3D/4D VQ Gain Codebook

In one embodiment, when the 3D/4D VQ gain codebook 492 is a 4-dimensional codebook, it may be searched in order to minimize $$E = \sum_{n=0}^{39} \left(t^1(n) - (\hat{g}_a^1 v_a^1(n) * h(n) + \hat{g}_c^1 v_c^1(n) * h(n))\right)^2 + \quad \text{(Equation 25)}$$

$$\sum_{n=0}^{39} \left(t^2(n) - (\hat{g}_a^2 v_a^2(n) * h(n) + \hat{g}_c^2 v_c^2(n) * h(n))\right)^2 +$$

$$\sum_{n=0}^{39} \left(t^3(n) - (\hat{g}_a^3 v_a^3(n) * h(n) + \hat{g}_c^3 v_c^3(n) * h(n))\right)^2 +$$

$$\sum_{n=0}^{39} \left(t^4(n) - (\hat{g}_a^4 v_a^4(n) * h(n) + \hat{g}_c^4 v_c^4(n) * h(n))\right)^2$$

where the quantized pitch gains $\{\hat{g}_a^1, \hat{g}_a^2, \hat{g}_a^3, \hat{g}_a^4\}$ originate from the initial frame processing module 44, and $\{t^1(n), t^2(n), t^3(n), t^4(n), \{v_a^1(n), v_a^2(n), v_a^3(n), v_a^4(n)\},$ and $\{v_c^1(n), v_c^2(n), v_c^3(n), v_c^4(n)\}$ may be buffered during the subframe processing as previously discussed. In an example embodiment, the fixed codebook gains $\{\hat{g}_c^1, \hat{g}_c^2, \hat{g}_c^3, \hat{g}_c^4\}$ are derived from a 10-bit codebook, where the entries of the codebook contain a 4-dimensional correction factor for the predicted fixed codebook gains as previously discussed. In addition, n=40 to represent 40 samples per frame.

In another embodiment, when the 3D/4D VQ gain codebook 492 is a 3-dimensional codebook, it may be searched in order to minimize $$E = \sum_{n=0}^{52} \left(t^1(n) - (\hat{g}_a^1 v_a^1(n) * h(n) + \hat{g}_c^1 v_c^1(n) * h(n))\right)^2 + \quad \text{(Equation 26)}$$

$$\sum_{n=0}^{52} \left(t^2(n) - (\hat{g}_a^2 v_a^2(n) * h(n) + \hat{g}_c^2 v_c^2(n) * h(n))\right)^2 +$$

$$\sum_{n=0}^{53} \left(t^3(n) - (\hat{g}_a^3 v_a^3(n) * h(n) + \hat{g}_c^3 v_c^3(n) * h(n))\right)^2$$

where the quantized pitch gains $\{\hat{g}_a^1, \hat{g}_a^2, \hat{g}_a^3\}$ originate from the initial frame processing module 44, and $\{t^1(n), t^2(n), t_3(n), \{v_a^1(n), v_a^2(n), v_a^3(n)\},$ and $\{v_c^1(n), v_c^2(n), v_c^3(n)\}$ may be buffered during the subframe processing as previously discussed. In an example embodiment, the fixed codebook gains $\{\hat{g}_c^1, \hat{g}_c^2, \hat{g}_c^3\}$ are derived from an 8-bit codebook where the entries of the codebook contain a 3-dimensional correction factor for the predicted fixed codebook gains. The prediction of the fixed-codebook gains may be based on moving average prediction of the fixed codebook energy in the log domain.

5.0 Decoding System

Figure 12:
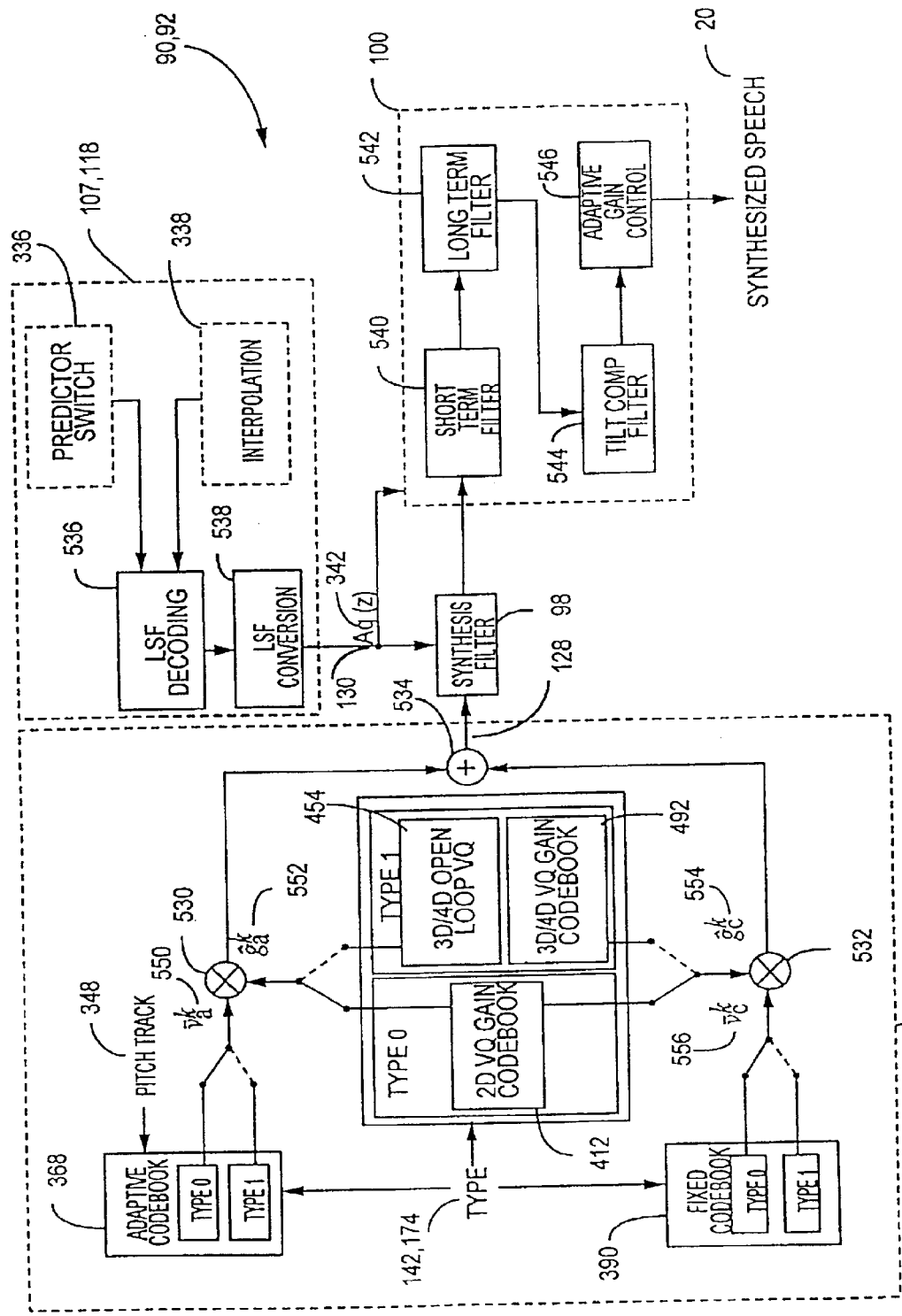
FIG. 12 is an expanded block diagram of one embodiment of the decoding system illustrated in FIG. 3 for the full and half-rate codecs.

Referring now to FIG. 12, an expanded block diagram representing the full and half-rate decoders 90 and 92 of FIG. 3 is illustrated. The full or half-rate decoders 90 or 92 include the excitation reconstruction modules 104, 106, 114 and 116 and the linear prediction coefficient (LPC) reconstruction modules 107 and 118. One embodiment of each of the excitation reconstruction modules 104, 106, 114 and 116 includes the adaptive codebook 368, the fixed codebook 390, the 2D VQ gain codebook 412, the 3D/4D open loop VQ codebook 454, and the 3D/4D VQ gain codebook 492. The excitation reconstruction modules 104, 106, 114 and 116 also include a first multiplier 530, a second multiplier 532 and an adder 534. In one embodiment, the LPC reconstruction modules 107, 118 include an LSF decoding module 536 and an LSF conversion module 538. In addition, the half-rate codec 24 includes the predictor switch module 336, and the full-rate codec 22 includes the interpolation module 338.

Also illustrated in FIG. 12 are the synthesis filter module 98 and the post-processing module 100. In one embodiment, the post-processing module 100 includes a short-term post filter module 540, a long-term filter module 542, a tilt compensation filter module 544, and an adaptive gain control module 546. According to the rate selection, the bit-stream may be decoded to generate the post-processed synthesized speech 20. The decoders 90 and 92 perform inverse mapping of the components of the bit-stream to algorithm parameters. The inverse mapping may be followed by a type classification dependent synthesis within the full and half-rate codecs 22 and 24.

The decoding for the quarter-rate codec 26 and the eighth-rate codec 28 are similar to the full and half-rate codecs 22 and 24. However, the quarter and eighth-rate codecs 26 and 28 use vectors of similar yet random numbers and the energy gain, as previously discussed, instead of the adaptive and the fixed codebooks 368 and 390 and associated gains. The random numbers and the energy gain may be used to reconstruct an excitation energy that represents the short-term excitation of a frame. The LPC reconstruction modules 122 and 126 also are similar to the full and half-rate codec 22, 24 with the exception of the predictor switch module 336 and the interpolation module 338.

5.1 Excitation Reconstruction

Within the full and half rate decoders 90 and 92, operation of the excitation reconstruction modules 104, 106, 114 and 116 is largely dependent on the type classification provided by the type component 142 and 174. The adaptive codebook 368 receives the pitch track 348. The pitch track 348 is reconstructed by the decoding system 16 from the adaptive codebook component 144 and 176 provided in the bitstream by the encoding system 12. Depending on the type classification provided by the type component 142 and 174, the adaptive codebook 368 provides a quantized adaptive codebook vector ($v^k_a$) 550 to the multiplier 530. The multiplier 530 multiplies the quantized adaptive codebook vector ($v^k_a$) 550 with an adaptive codebook gain vector ($g^k_a$) 552. The selection of the adaptive codebook gain vector ($g^k_a$) 552 also depends on the type classification provided by the type component 142 and 174.

In an example embodiment, if the frame is classified as Type Zero in the full rate codec 22, the 2D VQ gain codebook 412 provides the adaptive codebook gain vector ($g^k_a$) 552 to the multiplier 530. The adaptive codebook gain vector ($g^k_a$) 552 is determined from the adaptive and fixed codebook gain component 148a and 150a. The adaptive codebook gain vector ($g^k_a$) 552 is the same as part of the best vector for the quantized gain vector ($\hat{g}_{ac}$) 433 determined by the gain and quantization section 366 of the F0 first sub-frame processing module 70 as previously discussed. The quantized adaptive codebook vector ($v^k_a$) 550 is determined from the closed loop adaptive codebook component 144b. Similarly, the quantized adaptive codebook vector ($v^k_a$) 550 is the same as the best vector for the adaptive codebook vector ($v_a$) 382 determined by the F0 first sub-frame processing module 70.

The 2D VQ gain codebook 412 is two-dimensional and provides the adaptive codebook gain vector ($g^k_a$) 552 to the multiplier 530 and a fixed codebook gain vector ($g^k_c$) 554 to the multiplier 532. The fixed codebook gain vector ($g^k_c$) 554 similarly is determined from the adaptive and fixed codebook gain component 148a and 150a and is part of the best vector for the quantized gain vector ($\hat{g}_{ac}$) 433. Also based on the type classification, the fixed codebook 390 provides a quantized fixed codebook vector ($v^k_a$) 556 to the multiplier 532. The quantized fixed codebook vector ($v^k_a$) 556 is reconstructed from the codebook identification, the pulse locations (or the Gaussian codebook 195 for the half-rate codec 24), and the pulse signs provided by the fixed codebook component 146a. The quantized fixed codebook vector ($v^k_a$) 556 is the same as the best vector for the fixed codebook vector ($v_c$) 402 determined by the F0 first sub-frame processing module 70 as previously discussed. The multiplier 532 multiplies the quantized fixed codebook vector ($v^k_a$) 556 by the fixed codebook gain vector ($g^k_c$) 554.

If the type classification of the frame is Type One, a multi-dimensional vector quantizer provides the adaptive codebook gain vector ($g^k_a$) 552 to the multiplier 530. Where the number of dimensions in the multi-dimensional vector quantizer is dependent on the number of subframes. In one embodiment, the multi-dimensional vector quantizer may be the 3D/4D open loop VQ 454. Similarly, a multi-dimensional vector quantizer provides the fixed codebook gain vector ($g^k_c$) 554 to the multiplier 532. The adaptive codebook gain vector ($g^k_a$) 552 and the fixed codebook gain vector ($g^k_c$) 554 are provided by the gain component 147 and 179 and are the same as the quantized pitch gain ($\hat{g}^k_a$) 496 and the quantized fixed codebook gain ($\hat{g}^k_c$) 513, respectively.

In frames classified as Type Zero or Type One, the output from the first multiplier 530 is received by the adder 534 and is added to the output from the second multiplier 532. The output from the adder 534 is the short-term excitation. The short-term excitation is provided to the synthesis filter module 98 on the short-term excitation line 128.

5.2 LPC Reconstruction

The generation of the short-term (LPC) prediction coefficients in the decoders 90 and 92 is similar to the processing in the encoding system 12. The LSF decoding module 536 reconstructs the quantized LSFs from the LSF component 140 and 172. The LSF decoding module 536 uses the same LSF prediction error quantization table and LSF predictor coefficients tables used by the encoding system 12. For the half-rate codec 24, the predictor switch module 336 selects one of the sets of predictor coefficients, to calculate the predicted LSFs as directed by the LSF component 140, 172. Interpolation of the quantized LSFs occurs using the same linear interpolation path used in the encoding system 12. For the full-rate codec 22 for frames classified as Type Zero, the interpolation module 338, selects the one of the same interpolation paths used in the encoding system 12 as directed by the LSF component 140 and 172. The weighting of the quantized LSFs is followed by conversion to the quantized LPC coefficients $A_q(z)$ 342 within the LSF conversion module 538. The quantized LPC coefficients $A_q(z)$ 342 are the short-term prediction coefficients that are supplied to the synthesis filter 98 on the short-term prediction coefficients line 130.

5.3 Synthesis Filter

The quantized LPC coefficients $A_q(z)$ 342 may be used by the synthesis filter 98 to filter the short-term prediction coefficients. The synthesis filter 98 may be a short-term inverse prediction filter that generates synthesized speech prior to post-processing. The synthesized speech may then be passed through the post-processing module 100. The short-term prediction coefficients may also be provided to the post-processing module 100.

5.4 Post-processing

The post-processing module 100 processes the synthesized speech based on the rate selection and the short-term prediction coefficients. The short-term post filter module 540 may be first to process the synthesized speech. Filtering parameters within the short-term post filter module 540 may be adapted according to the rate selection and the long-term spectral characteristic determined by the characterization module 328 as previously discussed with reference to FIG. 9. The short-term post filter may be described by:

$$H_{st}(z) = \frac{\hat{A}(z/\gamma_{1,n})}{\hat{A}(z/\gamma_2)}, \quad \text{(Equation 27)}$$

where in an example embodiment, $\gamma_{1,n} = 0.75 \cdot \gamma_{1,n-1} + 0.25 \cdot r_0$ and $\gamma_2 = 0.75$, and $r_0$ is determined based on the rate selection and the long-term spectral characteristic. Processing continues in the long term filter module 542.

The long term filter module 542 performs a fine tuning search for the pitch period in the synthesized speech. In one embodiment, the fine tuning search is performed using pitch correlation and rate-dependent gain controlled harmonic filtering. The harmonic filtering is disabled for the quarter-rate codec 26 and the eighth-rate codec 28. The tilt compensation filter module 544, in one embodiment is a first-order finite impulse response (FIR) filter. The FIR filter may be tuned according to the spectral tilt of the perceptual weighting filter module 314 previously discussed with reference to FIG. 9. The filter may also be tuned according to the long-term spectral characteristic determined by the characterization module 328 also discussed with reference to FIG. 9.

The post filtering may be concluded with an adaptive gain control module 546. The adaptive gain control module 546 brings the energy level of the synthesized speech that has been processed within the post-processing module 100 to the level of the synthesized speech prior to the post-processing. Level smoothing and adaptations may also be performed within the adaptive gain control module 546. The result of the processing by the post-processing module 100 is the post-processed synthesized speech 20.

In one embodiment of the decoding system 16, frames received by the decoding system 16 that have been erased due to, for example, loss of the signal during radio transmission, are identified by the decoding system 16. The decoding system 16 can subsequently perform a frame erasure concealment operation. The operation involves interpolating speech parameters for the erased frame from the previous frame. The extrapolated speech parameters may be used to synthesize the erased frame. In addition, parameter smoothing may be performed to ensure continuous speech for the frames that follow the erased frame. In another embodiment, the decoding system 16 also includes bad rate determination capabilities. Identification of a bad rate selection for a frame that is received by the decoding system 16 is accomplished by identifying illegal sequences of bits in the bitstream and declaring that the particular frame is erased.

The previously discussed embodiments of the speech compression system 10 perform variable rate speech compression using the full-rate codec 22, the half-rate codec 24, the quarter-rate codec 26, and the eighth-rate codec 28. The codecs 22, 24, 26 and 28 operate with different bit allocations and bit rates using different encoding approaches to encode frames of the speech signal 18. The encoding approach of the full and half-rate codecs 22 and 24 have different perceptual matching, different waveform matching and different bit allocations depending on the type classification of a frame. The quarter and eighth-rate codecs 26 and 28 encode frames using only parametric perceptual representations. A Mode signal identifies a desired average bit rate for the speech compression system 10. The speech compression system 10 selectively activates the codecs 22, 24, 26 and 28 to balance the desired average bit rate with optimization of the perceptual quality of the post-processed synthesized speech 20.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

Microfiche Appendix

What is claimed is:

1. A speech processing system for encoding a fixed codebook gain and an adaptive codebook gain for a frame of a speech signal, the speech processing system comprising:
an encoding system operable to selectively designate a rate selection and a type classification of the frame;
the encoding system operable with a 2D gain quantization table to encode the fixed codebook gain and the adaptive codebook gain when the type classification is a first type;
the encoding system operable with a pre-gain quantization table to encode the adaptive codebook gain when the type classification is a second type, the pre-gain quantization table selectable as a function of the rate selection; and
the encoding system operable with a delayed gain quantization table to encode the fixed codebook gain when the type classification is the second type, the delayed gain quantization table selectable as a function of the rate selection;
where the pre-gain quantization table comprises a first predetermined vector represented as {0.60699869, 0.59090763, 0.64920781, 0.64610492} and a second predetermined vector represented as {0.68101613, 0.65403889, 0.64210982, 0.63130892} when the rate selection is a full rate.

2. The speech processing system of claim 1, where the rate selection comprises selection between a full rate and a half rate.

3. The speech processing system of claim 1, where the encoder is operable to encode the adaptive codebook gain once for each frame when the type classification is the second type.

4. The speech processing system of claim 1, where the pre-gain quantization table comprises a plurality of predetermined vectors of 4 elements each when the rate selection is a full rate.

5. The speech processing system of claim 1, where the pre-gain quantization table comprises a plurality of predetermined vectors of 3 elements each when the rate selection is a half rate.

6. The speech processing system of claim 1, where the encoding system is operable to encode the fixed codebook gain once for each frame of the speech signal when the type classification is the second type.

7. The speech processing system of claim 1, where the encoding system is operable to encode with the pre-gain quantization table prior to encoding with the delayed gain quantization table.

8. The speech processing system of claim 1, where the delayed quantization table comprises a plurality of predetermined vectors of 4 elements each when the rate selection is a full rate.

9. The speech processing system of claim 1, where the delayed quantization table comprises a plurality of predetermined vectors of 3 elements each when the rate selection is a half rate.

10. The speech processing system of claim 1, where the delayed gain quantization table comprises a first predetermined vector represented as {0.18423671, 0.06523999, 0.13390472} and a second predetermined vector represented as {0.27552690, 0.09702324, 0.05427950} when the rate selection is a half rate.

11. A speech processing system for encoding a fixed codebook gain and an adaptive codebook gain for a frame of a speech signal, the speech processing system comprising:
an encoding system operable to selectively designate a rate selection and a type classification of the frame;
the encoding system operable with a 2D gain quantization table to encode the fixed codebook gain and the adaptive codebook gain when the type classification is a first type;
the encoding system operable with a pre-gain quantization table to encode the adaptive codebook gain when the type classification is a second type, the pre-gain quantization table selectable as a function of the rate selection; and the encoding system operable with a delayed gain quantization table to encode the fixed codebook gain when the type classification is the second type, the delayed gain quantization table selectable as a function of the rate selection;

where the pre-gain quantization table comprises a first predetermined vector represented as {1.16184904, 1.16859789, 1.13656320} and a second predetermined vector represented as {1.14613289, 1.06371877, 0.91852525} when the rate selection is a half rate.

12. The speech processing system of claim 11, where the rate selection comprises selection between a full rate and a half rate.

13. The speech processing system of claim 11, where the encoder is operable to encode the adaptive codebook gain once for each frame when the type classification is the second type.

14. The speech processing system of claim 11, where the pre-gain quantization table comprises a plurality of predetermined vectors of 4 elements each when the rate selection is a full rate.

15. The speech processing system of claim 11, where the pre-gain quantization table comprises a plurality of predetermined vectors of 3 elements each when the rate selection is a half rate.

16. The speech processing system of claim 11, where the encoding system is operable to encode the fixed codebook gain once for each frame of the speech signal when the type classification is the second type.

17. The speech processing system of claim 11, where the encoding system is operable to encode with the pre-gain quantization table prior to encoding with the delayed gain quantization table.

18. The speech processing system of claim 11, where the delayed quantization table comprises a plurality of predetermined vectors of 4 elements each when the rate selection is a full rate.

19. The speech processing system of claim 11, where the delayed quantization table comprises a plurality of predetermined vectors of 3 elements each when the rate selection is a half rate.

20. The speech processing system of claim 11, where the delayed gain quantization table comprises a first predetermined vector represented as {0.18423671, 0.06523999, 0.13390472} and a second predetermined vector represented as {0.27552690, 0.09702324, 0.05427950} when the rate selection is a half rate.

21. A speech processing system for encoding a fixed codebook gain and an adaptive codebook gain for a frame of a speech signal, the speech processing system comprising:

an encoding system operable to selectively designate a rate selection and a type classification of the frame;

the encoding system operable with a 2D gain quantization table to encode the fixed codebook gain and the adaptive codebook gain when the type classification is a first type;

the encoding system operable with a pre-gain quantization table to encode the adaptive codebook gain when the type classification is a second type, the pre-gain quantization table selectable as a function of the rate selection; and the encoding system operable with a delayed gain quantization table to encode the fixed codebook gain when the type classification is the second type, the delayed gain quantization table selectable as a function of the rate selection;

where the delayed gain quantization table comprises a first predetermined vector represented as {0.18423671, 0.06523999, 0.13390472} and a second predetermined vector represented as {0.27552690, 0.09702324, 0.05427950} when the rate selection is a half rate.

22. The speech processing system of claim 21, where the rate selection comprises selection between a full rate and a half rate.

23. The speech processing system of claim 21, where the encoder is operable to encode the adaptive codebook gain once for each frame when the type classification is the second type.

24. The speech processing system of claim 21, where the pre-gain quantization table comprises a plurality of predetermined vectors of 4 elements each when the rate selection is a full rate.

25. The speech processing system of claim 21, where the pre-gain quantization table comprises a plurality of predetermined vectors of 3 elements each when the rate selection is a half rate.

26. The speech processing system of claim 21, where the encoding system is operable to encode the fixed codebook gain once for each frame of the speech signal when the type classification is the second type.

27. The speech processing system of claim 21, where the encoding system is operable to encode with the pre-gain quantization table prior to encoding with the delayed gain quantization table.

28. The speech processing system of claim 21, where the delayed quantization table comprises a plurality of predetermined vectors of 4 elements each when the rate selection is a full rate.

29. The speech processing system of claim 21, where the delayed quantization table comprises a plurality of predetermined vectors of 3 elements each when the rate selection is a half rate.

* * * * *

UNITED STATES PATENT AND TRADEMARK OFFICE
CERTIFICATE OF CORRECTION

PATENT NO. : 6,757,649 B1  
APPLICATION NO. : 10/409404  
DATED : June 29, 2004  
INVENTOR(S) : Gao et al.

It is certified that error appears in the above-identified patent and that said Letters Patent is hereby corrected as shown below:

On the front page of the patent, field (60),

"Division of application No. 09/663,837, filed on Sep. 15, 2000, now Pat. No. 6,574,593, and a continuation-in-part of application No. 09/574,396, filed on May 19, 2000."

should be changed to:

--Division of application No. 09/663,837, filed on Sep. 15, 2000, now Pat. No. 6,574,593, which is a continuation-in-part of application No. 09/574,396, filed on May 19, 2000.--.

Signed and Sealed this  
Eighteenth Day of December, 2012

David J. Kappos  
*Director of the United States Patent and Trademark Office*